US012599036B2

(12) United States Patent
Saini et al.

(10) Patent No.: US 12,599,036 B2
(45) Date of Patent: Apr. 7, 2026

(54) CIRCUIT ARCHITECTURE IN MULTI-DIMENSIONAL MONOLITHIC STRUCTURE

(71) Applicant: Arm Limited, Cambridge (GB)

(72) Inventors: Lokesh Kumar Saini, New Delhi (IN); Amit Chhabra, Noida (IN); Valerio Lanieri, Antibes (FR)

(73) Assignee: Arm Limited, Cambridge (GB)

( * ) Notice: Subject to any disclaimer, the term of this patent is extended or adjusted under 35 U.S.C. 154(b) by 585 days.

(21) Appl. No.: 17/722,252

(22) Filed: Apr. 15, 2022

(65) Prior Publication Data

US 2023/0335537 A1     Oct. 19, 2023

(51) Int. Cl.
*H01L 25/07*     (2006.01)
*H10D 84/85*     (2025.01)

(52) U.S. Cl.
CPC ........... *H01L 25/074* (2013.01); *H10D 84/85* (2025.01)

(58) Field of Classification Search
CPC . H01L 27/092; H01L 27/088; H01L 27/0688; H01L 27/0207; H01L 25/074; H01L 21/8221; H01L 29/0673; H01L 29/78696; H01L 84/83; H01L 84/832; H01L 84/833; H01L 84/835; H01L 84/836; H01L 84/937; H01L 84/939; H03F 3/45242; H10B 10/18; H10D 84/85; H10D 84/8311; H10D 84/8312; H10D 84/83135; H10D 84/83138; H10D 84/8314; H10D 84/8316; H10D 84/851; H10D 84/852; H10D 88/00; H10D 89/10

See application file for complete search history.

(56) References Cited

U.S. PATENT DOCUMENTS

| | | | | |
|---|---|---|---|---|
| 6,881,989 B2 * | 4/2005 | Kajii | ................. | H01L 27/11807 |
| | | | | 257/210 |
| 7,812,674 B2 * | 10/2010 | Karp | ................... | H01L 27/0255 |
| | | | | 330/307 |
| 8,072,833 B2 * | 12/2011 | Kushida | ................ | G11C 11/419 |
| | | | | 365/154 |

(Continued)

FOREIGN PATENT DOCUMENTS

| | | | | | |
|---|---|---|---|---|---|
| CN | 109427738 A | * | 3/2019 | ........... | H01L 23/528 |
| WO | WO-2020099962 A1 | * | 5/2020 | ......... | H01L 23/5286 |

OTHER PUBLICATIONS

Sharma et al. "Common-Centroid Layouts for Analog Circuits: Advantages and Limitations", Jul. 16, 2021, EDAA (downloaded from IEEE Xplore), pp. 1224-1229. (Year: 2021).*

(Continued)

*Primary Examiner* — Telly D Green
(74) *Attorney, Agent, or Firm* — Pramudji Law Group PLLC; Ari Pramudji

(57)     ABSTRACT

Various implementations described herein are related to a device having a multi-transistor structure for use in circuit architecture. The multi-transistor structure may have a multi-transistor stack of at least one of N-type transistors or P-type transistors that are arranged in a multi-device stack configuration. Also, a physical layout of the multi-device stack configuration may provide a common-centroid configuration for process mismatch cancellation in at least one of the X-Y-Z axes.

20 Claims, 40 Drawing Sheets

200

Sense Amplifier (SA) Architecture 204

(56) References Cited

U.S. PATENT DOCUMENTS

| | | | | |
|---|---|---|---|---|
| 8,729,666 | B2 * | 5/2014 | Stribley | .................. H01G 4/20 |
| | | | | 257/532 |
| 9,698,803 | B1 * | 7/2017 | Dropps | ............... H03M 1/1071 |
| 2013/0140642 | A1 * | 6/2013 | Aruga | ................ H01L 27/0203 |
| | | | | 257/369 |
| 2020/0075592 | A1 * | 3/2020 | Liebmann | ......... H01L 29/41758 |
| 2020/0411518 | A1 * | 12/2020 | Fulford | ........... H01L 21/823821 |

OTHER PUBLICATIONS

Chou et al. "Matched-Routing Common-Centroid 3-D MOM Capacitors for Low-Power Data Converters", IEEE Transactions On Very Large Scale Integration(VLSI) Systems, vol. 25., No. 8, Aug. 2017, pp. 2234-2247. (Year: 2017).*

* cited by examiner

100B    P-based Differential Amplifier 104B

FIG. 1B

100C    Current Mirror 104C

FIG. 1C

100A    N-based Differential Amplifier 104A

Sense Amplifier (SA) Architecture 204

300A

P-over-N Multi-Device Stack Common-Gate Architecture 304A

300B

P-over-N Multi-Device Stack Split-Gate Architecture 304B

300C

N-over-P Multi-Device Stack Common-Gate Architecture 304C

300D

N-over-P Multi-Device Stack Split-Gate Architecture 304D

300E

N-over-N Multi-Device Stack Common-Gate Architecture 304E

300F

N-over-N Multi-Device Stack Split-Gate Architecture 304F

300G

P-over-P Multi-Device Stack Common-Gate Architecture 304G

PFET_NS

PFET_NS

GATE_C

300H

P-over-P Multi-Device Stack Split-Gate Architecture 304H

PFET_NS

GATE_2

PFET_NS

GATE_1

400A

PNNP Multi-Device Stack Common-Gate Architecture 404A

400B

PNNP Multi-Device Stack Split-Gate Architecture 404B

PFET_NS_2

GATE_4

NFET_NS_2

GATE_3

NFET_NS_1

GATE_2

PFET_NS_1

GATE_1

400C

NPPN Multi-Device Stack Common-Gate Architecture 404C

400D

NPPN Multi-Device Stack Split-Gate Architecture 404D

400E

NNNN Multi-Device Stack Common-Gate Architecture 404E

400F

NNNN Multi-Device Stack Split-Gate Architecture 404F

400G

PPPP Multi-Device Stack Common-Gate Architecture 404G

400H

PPPP Multi-Device Stack Split-Gate Architecture 404H

PFET_NS_4

GATE_4

PFET_NS_3

GATE_3

PFET_NS_2

GATE_2

PFET_NS_1

GATE_1

400I

NNPP Multi-Device Stack Common-Gate Architecture 404I

PFET_NS_2

PFET_NS_1

GATE_C2

NFET_NS_2

NFET_NS_1

GATE_C1

400J

NNPP Multi-Device Stack Split-Gate Architecture 404J

400K

PNPN Multi-Device Stack Common-Gate Architecture 404K

400L

PNPN Multi-Device Stack Split-Gate Architecture 404L

400M

PPNN Multi-Device Stack Common-Gate Architecture 404M

NFET_NS_2

NFET_NS_1

GATE_C2

PFET_NS_2

PFET_NS_1

GATE_C1

400N

PPNN Multi-Device Stack Split-Gate Architecture 404N

NFET_NS_2

GATE_4

NFET_NS_1

GATE_3

PFET_NS_2

GATE_2

PFET_NS_1

GATE_1

400O

NPNP Multi-Device Stack Common-Gate Architecture 404O

PFET_NS_2

NFET_NS_2

GATE_C2

PFET_NS_1

NFET_NS_1

GATE_C1

400P

NPNP Multi-Device Stack Split-Gate Architecture 404P

N-over-N-over-N-over-N (NNNN) Device Stack Architecture for AABB Configuration of SA in 3D 504A

N-over-N-over-N-over-N (NNNN) Device Stack Architecture for AABB Configuration of SA in 3D 504B Mismatch Cancellation in X-axis

N-over-N-over-N-over-N (NNNN) Device Stack Architecture for AABB Configuration of SA in 3D 504D Mismatch Cancellation in Z-axis

P-over-N-over-N-over-P (PNNP) Device Stack Architecture for AABB Configuration of SA in 3D 604

N-over-N (NN) Device Stack Architecture for SA in 3D 704A

N-over-N (NN) Device Stack Architecture for SA in 3D 704B

Mismatch Cancellation in X-axis ⟶

N-over-N (NN) Device Stack Architecture for SA in 3D 704D

Mismatch Cancellation in Z-axis

N-over-N-over-N-over-N (NNNN) Device Stack Architecture for ABBA Configuration of SA in 3D 804C Mismatch Cancellation in Y-axis Y-axis

N-over-N-over-N-over-N (NNNN) Device Stack Architecture for ABBA Configuration of SA in 3D 804D Mismatch Cancellation in Z-axis

900          P-based Differential Amplifier 904

FIG. 10A

Figure 10B:
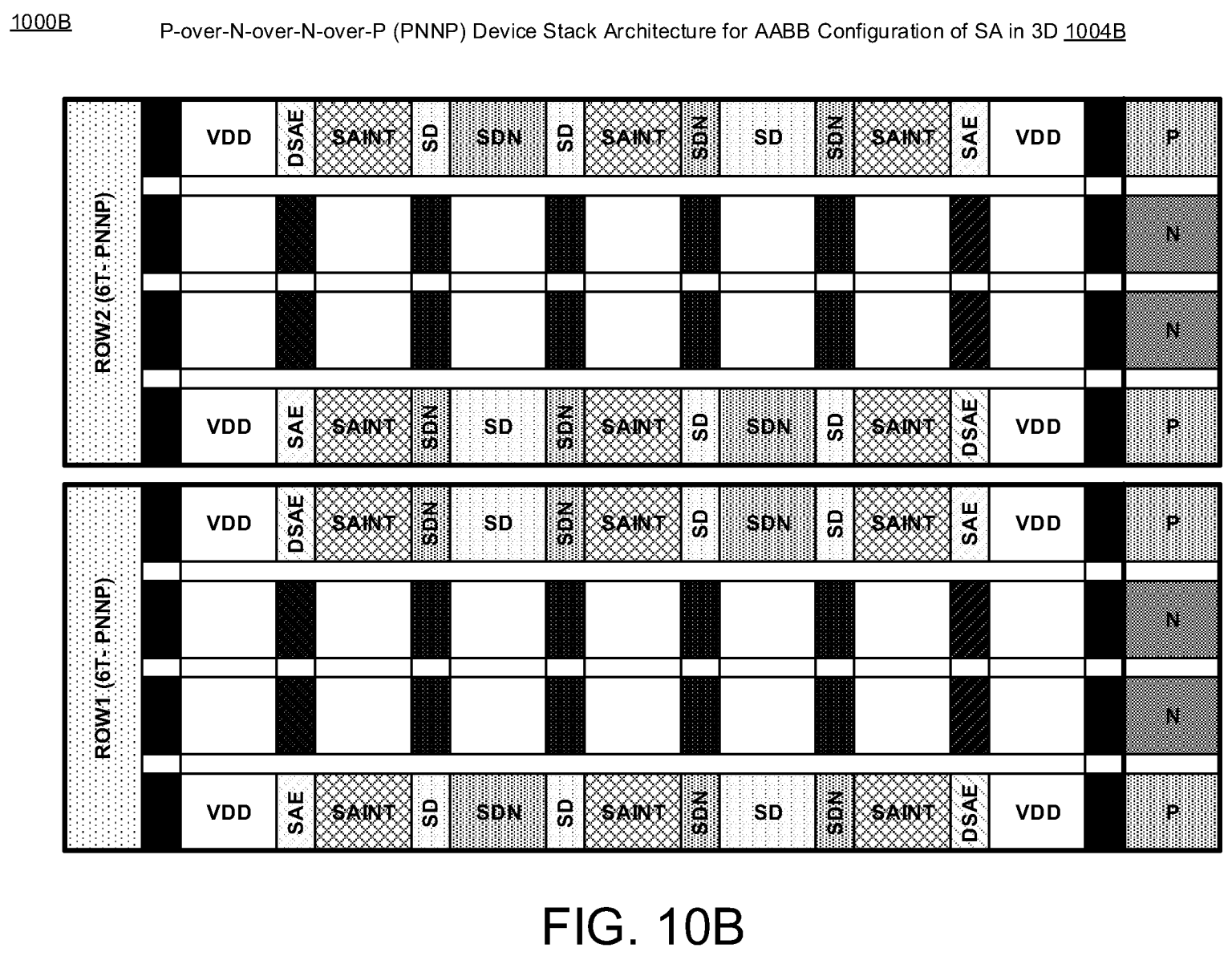

P-over-N-over-N-over-P (PNNP) Device Stack Architecture for AABB Configuration of SA in 3D 1004B

ROW2 (6T-PNNP)

ROW1 (6T-PNNP)

VDD | DSAE | SAINT | SD | SDN | SD | SAINT | SD | SDN | SD | SAINT | SDN | SAE | VDD

P | N | N | P

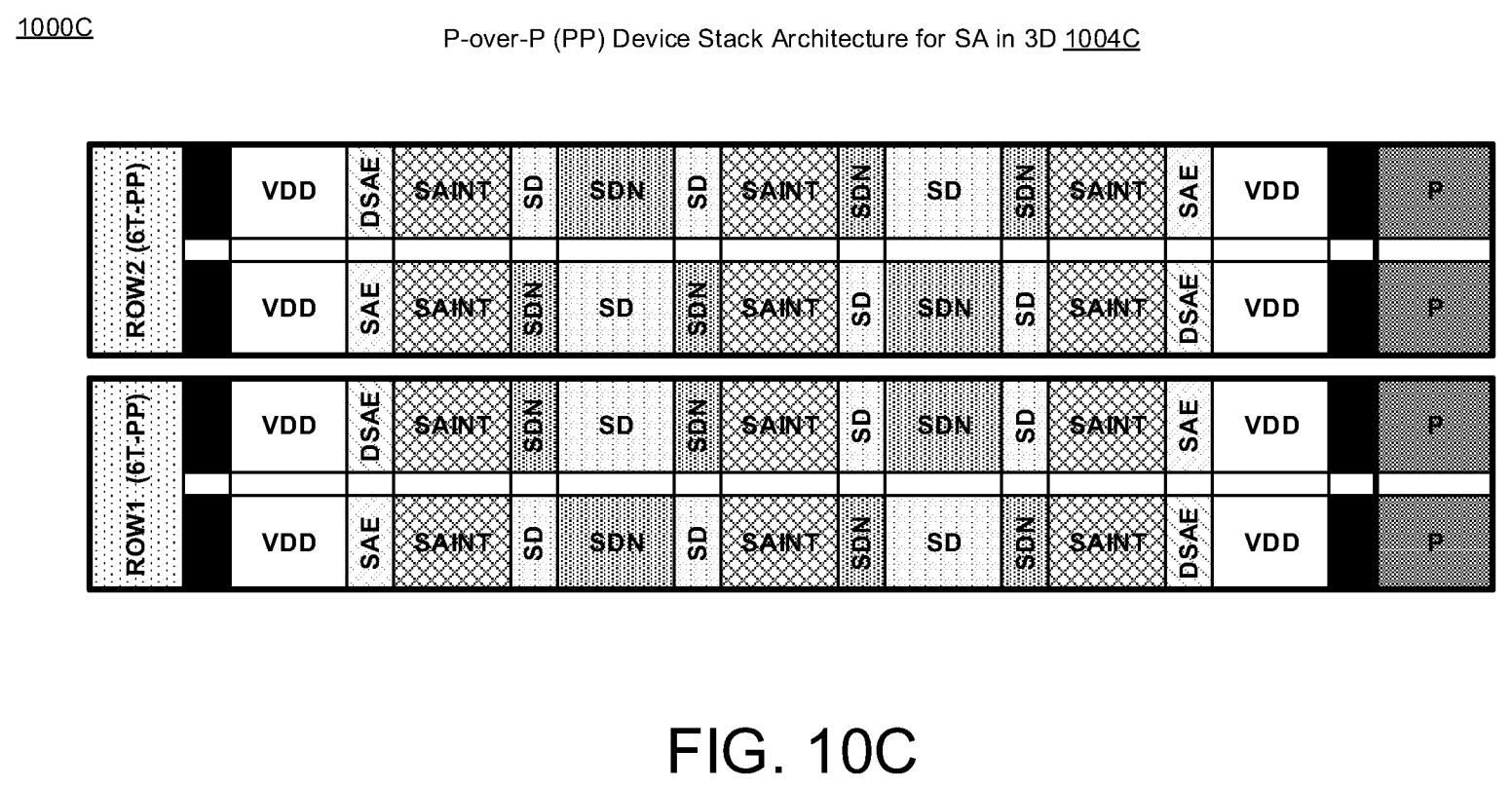

P-over-P (PP) Device Stack Architecture for SA in 3D 1004C

1000C

| ROW2 (6T-PP) | | ROW1 (6T-PP) | |
|---|---|---|---|
| VDD | VDD | VDD | VDD |
| DSAE | SAE | DSAE | SAE |
| SAINT | SAINT | SAINT | SAINT |
| SD | SDN | SDN | SD |
| SDN | SD | SD | SDN |
| SAINT | SAINT | SAINT | SAINT |
| SD | SDN | SDN | SD |
| SDN | SD | SD | SDN |
| SAINT | SAINT | SAINT | SAINT |
| SDN | SD | SD | SDN |
| SD | SDN | SDN | SD |
| SAINT | SAINT | SAINT | SAINT |
| SAE | DSAE | SAE | DSAE |
| VDD | VDD | VDD | VDD |
| P | P | P | P |

FIG. 10C

P-over-P-over-P-over-P (PPPP) Device Stack Architecture for ABBA Configuration of SA in 3D 1004D

CIRCUIT ARCHITECTURE IN MULTI-DIMENSIONAL MONOLITHIC STRUCTURE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern circuit architecture, conventional transistor based devices use traditional layout techniques and thus suffer from low density design application that may typically cause unintended consequences in fabrication processes. Therefore, traditional layout techniques can be inefficient, density deficient and typically fail to provide sufficient means for implementing various different layout configurations. Thus, there exists a need to improve traditional layout techniques that allow for efficient device fabrication.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIGS. 1A-1C illustrate various diagrams of circuit architecture in accordance with various implementations described herein.

FIGS. 5A-5D illustrate various diagrams of a physical layout for multi-device stack configuration that provides a common-centroid configuration for process mismatch cancellation in X-Y-Z axes in accordance with implementations described herein.

FIG. 6 illustrates a diagram of a physical layout for multi-device stack configuration that provides a common-centroid configuration for process mismatch cancellation in X-Y-Z axes in accordance with implementations described herein.

FIGS. 7A-7D illustrate various diagrams of a physical layout for multi-device stack configuration that provides a common-centroid configuration for process mismatch cancellation in X-Y-Z axes in accordance with implementations described herein.

FIGS. 8A-8D illustrate various diagrams of a physical layout for multi-device stack configuration that provides a common-centroid configuration for process mismatch cancellation in X-Y-Z axes in accordance with implementations described herein.

FIGS. 10A-10D illustrate various diagrams of a physical layout for multi-device stack configuration that provides a common-centroid configuration for process mismatch cancellation in X-Y-Z axes in accordance with implementations described herein.

DETAILED DESCRIPTION

Figure 2:
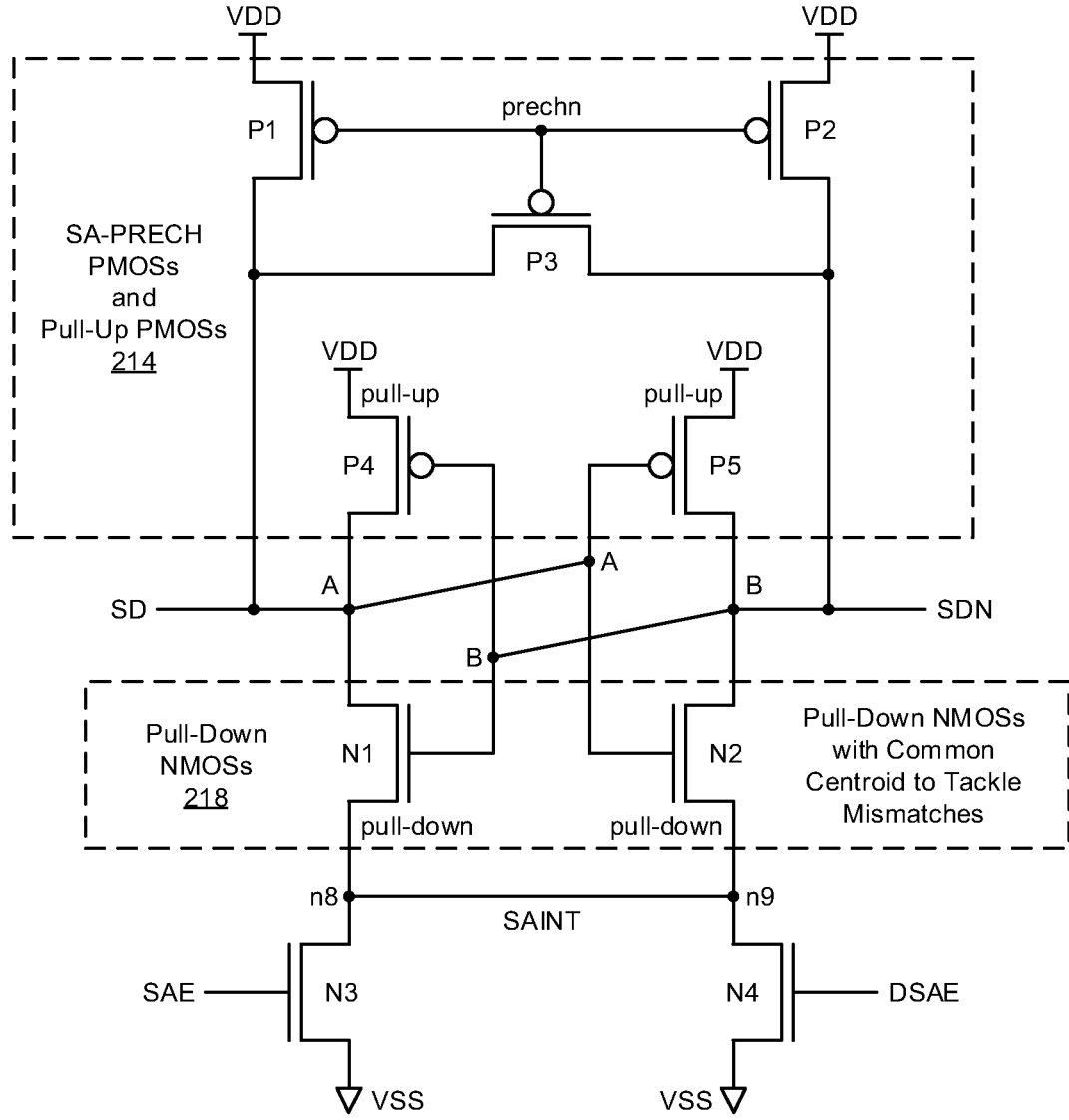
FIG. 2 illustrates a diagram of sense amplifier architecture in accordance with various implementations described herein.

Various implementations described herein are directed to fabrication schemes and techniques for multi-device stack architecture in physical layout designs for various circuit related applications. In some implementations, the multi-device stack architecture may provide for sense amplifier implementations in 3D process for mismatch cancellation in X, Y and Z axes. The multi-device stack architecture may be manufactured for N-type devices and/or P-type devices in various applications for complementary field-effect-transistor (FET) technology. Further, various physical layout schemes and techniques described herein may provide for multi-transistor stacked device fabrication techniques for manufacturing on a single monolithic wafer or in a sequential manner.

In various implementations, there are multiple different ways of building device architecture for stacked transistors. For instance, one way is to build stacked transistors in a monolithic fashion, which refers to using a single wafer with 2 or 4 sets of nanosheets for processing the wafer. In another instance, another way is to build stacked transistors in a sequential fashion, wherein one device stack is processed first, followed by another layer of device stack using a substantially thinned wafer. These multiple methods provide flexibility in managing various different devices in the stack in terms of threshold voltage, gate connections, etc. Therefore, stacked devices may be manufactured using various fabrication schemes and techniques described herein, including monolithic (monolithically formed stacks) and sequential (sequentially formed stacks).

In some implementations, a sense amplifier block may be used to read logic 0 or logic 1 from a bitcell. Since sense amplifier functionality is used to sense and/or detect low voltage differences (e.g., a few milli-volts), any process mismatch may bias the sense amplifier toward either read-0 or read-1. To avoid this scenario, the sense amplifier layout may provide for a common centroid across X, Y and Z axes, and also, in reference to 3D monolithic processes or 3D sequential processes, the sense amplifier layout may provide for mismatch cancellation in the X, Y and Z axes. Therefore, the various implementations described herein provide for common-centroid configuration that may be maintained at each device stack level in X, Y and Z axes, which provides a configuration that has a common centroid in all three axes so as to provide cancellation of process mismatches in the X, Y and Z axes. In various implementations, various process mismatch cancellation schemes and techniques described herein may be used to match NMOS devices and/or PMOS devices for process mismatch cancellation applications.

Various implementations described herein are directed to fabrication schemes and techniques for multi-transistor stack architectures in various physical layout designs for multi-device applications. For instance, various fabrication schemes and techniques described herein provide for various hybrid device stacking techniques for complementary field effect transistor (FET) technologies, and therefore, aspects of the present disclosure are associated with a novel device stack architecture arrangement for complementary FET (CFET) technologies and related applications. Also, the various fabrication schemes and techniques described herein provide a method of manufacture using hybrid technologies where multiple device stacks are fabricated together in a single monolithic semiconductor die. In other instances, the multi-transistor stacks may be formed, fabricated or manufactured in a sequential manner. For instance, in some applications, N-over-P stacked devices and P-over-N stacked devices may be co-manufactured on a single wafer, and also, N-over-N stacked devices and P-over-P stacked devices refer to variants that may be simultaneously manufactured along with N-over-P stacked devices and/or P-over-N stacked devices in the same, single monolithic semiconductor die or wafer or in a sequential manner.

In some implementations, multi-transistor fabrication schemes and techniques described herein use novel technology that supports complementary FET (CFET) devices, wherein each device is fabricated with nano-sheets (NS) or Fin-FET(FF) that are used to form multiple devices in multi-transistor stacks within a single monolithic semiconductor die with multiple devices stacked on top of each other. In other instances, the multi-transistor CFET device stacks may be formed, fabricated or manufactured in a sequential manner. The various fabrication schemes and techniques described herein provide for multiple complementary stack configurations, such as, e.g., an NN based structure having an N-over-N stack configuration and a PP based structure having a P-over-P stack configuration. In various instances, the gates for PFET devices and NFET devices may utilize common-gate and/or split-gate architecture in the multi-device stack configurations. Further, the multi-transistor fabrication schemes and techniques described herein also utilize technology that supports N-over-P devices along with P-over-N devices as additional stack configurations that may be fabricated with the N-over-N and P-over-P stack configurations within a single monolithic semiconductor die in various multi-transistor stack applications. Also, in other applications, N-over-P stacked devices and P-over-N stacked devices may be formed, fabricated or manufactured in a sequential manner.

In some implementations, the various multi-transistor fabrication schemes and techniques described herein may provide for other types of multiple complementary stack configurations, such as, e.g., an NNNN based structure having an N-over-N-over-N-over-N stack configuration and a PPPP based structure having a P-over-P-over-P-over-P stack configuration. In various instances, the gates for PFET devices and NFET devices may utilize common-gate and/or split-gate architecture in the other types of multi-device stack configurations. Also, the multi-transistor fabrication schemes and techniques described herein utilize technology that supports N-over-P-over-P-over-N devices along with P-over-N-over-N-over-P devices as in a same vertical stack configurations that may be fabricated with the N-over-N-over-N-over-N and P-over-P-over-P-over-P stack configurations within a same single monolithic semiconductor die in various multi-transistor stack applications and/or configurations. Moreover, various other supported multi-transistor structures may include P-over-P-over-N-over-N, N-over-N-over-P-over-P, P-over-N-over-P-over-N, and N-over-P-over-N-over-P stack configurations. In other implementations, the multi-transistor stacks may be formed, fabricated or manufactured in a sequential manner.

In some implementations, the various multi-transistor fabrication schemes and techniques described herein may provide for other types of multiple stack configurations, such as, e.g., an N-only stack and/or a P-only stack For instance, as described herein, a precharge circuit may be formed with a P-only stack, wherein the P-only stack may include multiple transistors, such as, e.g., 2 or 3 or 4 or more transistors that may be built on top of each other in a multi-transistor stack structure. Also, various other circuits associated with memory architecture may have similar P-only/N-only stack configurations.

Figures 1A, 1B, 1C:
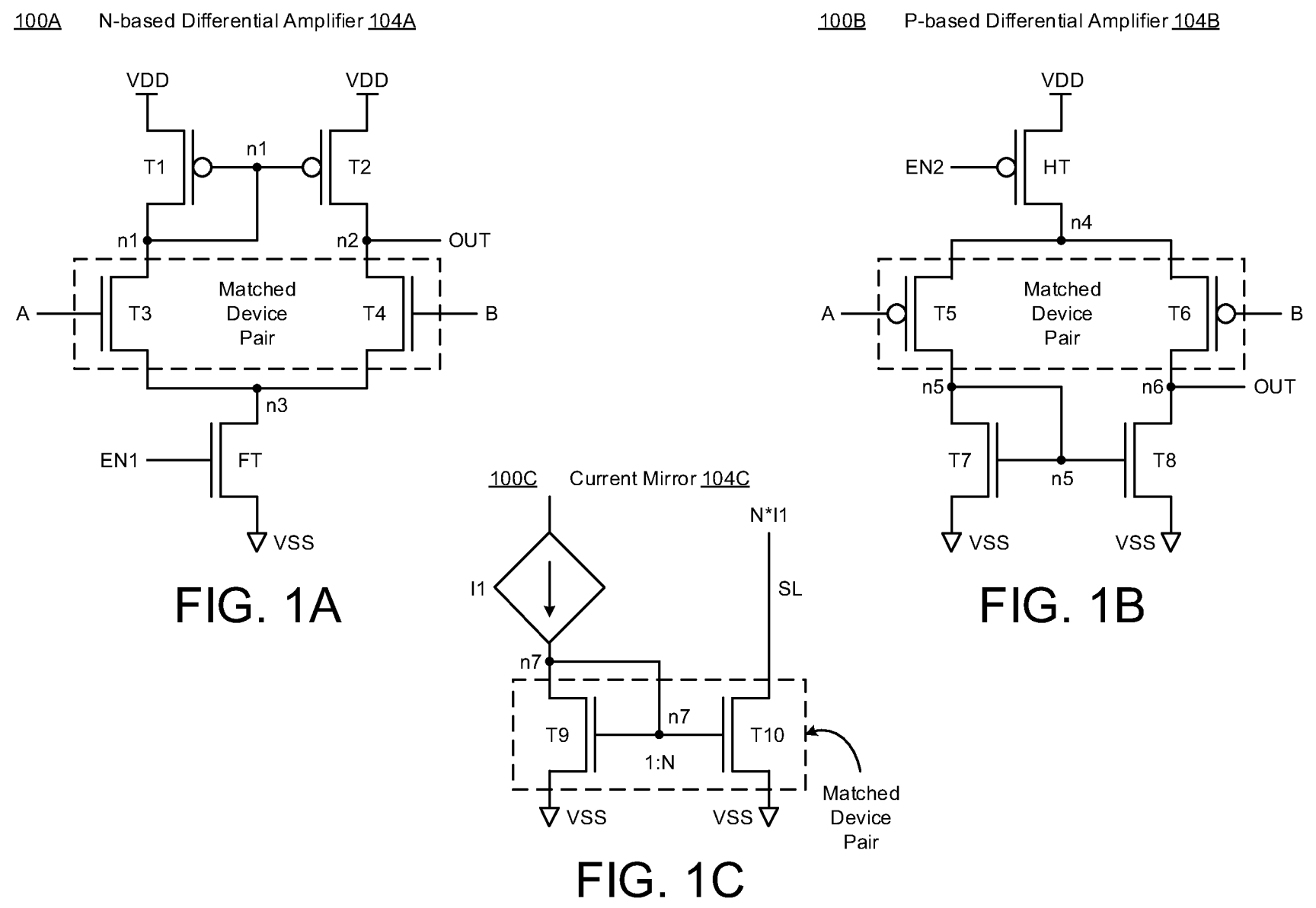

Various implementations of providing multi-transistor fabrication schemes and techniques for multi-device stack configurations in circuit architecture applications will be described herein with FIGS. 1A-1C, 2, 3A-3H, 4A-4P, 5A-5D, 6, 7A-7D and 8A-8D.

FIGS. 1A-1C illustrate various diagrams of circuit architecture in accordance with various implementations described herein. In particular, FIG. 1A shows a diagram 100A of circuit architecture for an N-based differential amplifier 104A, FIG. 1B shows a diagram 100B of circuit architecture for a P-based differential amplifier 104B, and FIG. 1C shows a diagram 100C of circuit architecture for current mirror 104C.

In various implementations, the circuit architectures may be implemented as a system or a device having various integrated circuit (IC) components that are arranged and coupled together as an assemblage or combination of parts that provide for physical circuit designs and various related structures. In some instances, a method of designing, providing and fabricating the circuit architectures as an integrated system or device may involve use of various IC circuit components described herein so as to thereby implement fabrication schemes and techniques associated therewith. Also, the circuit architectures may be integrated with computing circuitry and related components on a single chip, and further, the circuit architectures may also be implemented in various embedded systems for automotive, electronic, mobile, server and Internet-of-things (IoT) applications.

As shown in FIG. 1A, the N-based differential amplifier 104A refers to a circuit architecture having multiple transistors (e.g., T1, T2, T3, T4, FT) that are coupled together to operate as the N-based differential amplifier. In some implementations, transistors (T1, T3) may be coupled in series between a voltage supply (VDD) and footer transistor (FT), and also, transistors (T2, T4) may be coupled in series between the voltage supply (VDD) and the footer transistor (FT). Also, gates of transistors (T1, T2) may be coupled to node (n1) disposed between transistors (T1, T3), and the N-based differential amplifier 104A is configured to provide an output signal (OUT) at node (n2) disposed between transistors (T2, T4). Also, gate of transistor (T3) may be coupled to a first activation signal (A), and gate of transistor (T4) may be coupled to a second activation signal (B). Further, in some instances, the footer transistor (FT) may be coupled between transistors (T3, T4) at node (n3) and ground (VSS or Gnd), and the gate of footer transistor (FT) may be coupled to an enable signal (EN1). In some implementations, at least two of the transistors (e.g., T3, T4) may be configured as a matched device pair.

As shown in FIG. 1B, the P-based differential amplifier 104B refers to a circuit architecture having multiple transistors (e.g., HT, T5, T6, T7, T8) that are coupled together to operate as the P-based differential amplifier. In some implementations, transistors (T5, T7) may be coupled in series between header transistor (HT) and ground (VSS or Gnd), and also, transistors (T6, T8) may be coupled in series between the header transistor (HT) and ground (VSS or Gnd). In some instances, the header transistor (HT) may be coupled between the voltage supply (VDD) and transistors (T5, T6) at node (n4), and gate of header transistor (HT) may be coupled to an enable signal (EN2). Also, the gate of transistor (T5) may be coupled to the first activation signal (A), and also, the gate of transistor (T6) may be coupled to the second activation signal (B). Also, the gates of transistors (T7, T8) may be coupled to node (n5) disposed between transistors (T5, T7), and further, the P-based differential amplifier 104B may be configured to provide an output signal (OUT) at node (n6) disposed between transistors (T6, T8). In some instances, at least two of the transistors (e.g., T5, T6) may be configured as a matched device pair.

As shown in FIG. 1C, the current mirror 104C refers to a circuit architecture having current source (I1) and multiple transistors (e.g., T9, T10) that are coupled together to operate as the current mirror. In some implementations, transistor (T9) may be coupled between the current source (I1) and ground (VSS or Gnd), and also, transistor (T10) may be coupled between a signal line (SL) and ground (VSS or Gnd). In some instances, the signal line (SL) represents a multiple (N) of the current source (I1), wherein the signal line (SL) provides a current or approximately N*I1. Also, gates of transistors (T9, T10) may be coupled to node (n7) disposed between the current source (I1) and transistor (T9) such that the node (n7) may represent current having a ratio of 1:N. In some implementations, the transistors (e.g., T9, T10) may be configured as a matched device pair.

In various implementations, in reference to FIGS. 1A-1C, transistors (T1, T2, HT, T5, T6) may refer to P-type field-effect transistors (PFET), and also, transistors (T3, T4, FT, T7, T8, T9, T10) may refer to N-type FET (NFET) transistors. However, various other configurations may be used to achieve similar results and/or behaviors.

FIG. 2 illustrates a schematic diagram 200 of sense amplifier architecture 204 in accordance with various implementations described herein.

In various implementations, the sense amplifier (SA) architecture 204 may be implemented as a system or a device having various integrated circuit (IC) components that are arranged and coupled together as an assemblage or some combination of parts that provide for physical circuit designs and various related structures. In some instances, a method of designing, providing and fabricating the circuit architectures as an integrated system or device may involve use of various IC circuit components described herein so as to thereby implement fabrication schemes and techniques associated therewith. Also, the sense amplifier (SA) architecture 204 may be integrated with computing circuitry and related components on a single chip, and also, the sense amplifier (SA) architecture 204 may be implemented in various embedded systems for automotive, electronic, mobile, server and IoT applications, such as, e.g., remote sensor nodes.

As shown in FIG. 2, the SA architecture 204 may include precharge circuitry with pull-up PMOS devices 214 along with pull-down NMOS circuitry 218 that is followed by footer transistors (N3, N4). In some implementations, the precharge circuitry with pull-up PMOS devices 214 may include multiple PMOS transistors (e.g., P1, P2, P3, P4, P5), and also, the pull-down NMOS circuitry 218 may include multiple NMOS transistors (e.g., N1, N2). Also, the footer transistors (N3, N4) may include NMOS transistors.

In various implementations, precharge transistors (P1, P2, P3) may be coupled together between voltage supply (VDD) and nodes (A, B), wherein precharge transistor (P1) is coupled between the voltage supply (VDD) and node (A), precharge transistor (P2) is coupled between the voltage supply (VDD) and node (B), and the equalizing precharge transistor (P3) is coupled between nodes (A, B). Also, the gates of precharge transistors (P1, P2, P3) are coupled together so as to receive precharge signal (prechn). In various instances, the precharge transistors (P1, P2, P3) may be referred to as sense amplifier precharge (SA-PRECH) PMOS devices. Also, in some instances, the transistors (P4, P5) may be configured to operate as pull-up PMOS devices.

In various implementations, the SA architecture 204 may have multiple (e.g., 2) pull-down NMOS devices 218 with the NMOS transistors (N1, N2) along with the multiple (e.g., 2) pull-up PMOS transistors (P4, P5). In some scenarios, transistors (P4, N1, N3) may be coupled in series between the voltage supply (VDD) and ground (VSS or Gnd), and also, transistors (P5, N2, N4) may be coupled in series between the voltage supply (VDD) and ground (VSS or Gnd). Also, transistors (P4, N1) may be cross-coupled with transistors (P5, N2) such that node (A) is coupled to gates of transistors (P5, N2) and such that node (B) is coupled to gates of transistors (P4, N1). Also, in some scenarios, node (A) may be coupled to a first bitline (e.g., BL), and node (B) may be coupled to a second bitline (e.g., BLB) that is complementary to the first bitline (e.g., BL). Also, in some instances, the pull-down NMOS transistors 218 may have a common centroid to tackle mismatches, wherein the NMOS transistors (N1, N2) may have a common-centroid configuration for process mismatch cancellation in at least one of the X-Y-Z axes. These features and various other behaviors and characteristics associated with mismatch cancellation in at least one of the X-Y-Z axes are described in greater detail herein below.

Also, in various implementations, the SA architecture 204 may have the footer transistors (N3, N4) coupled between the pull-down NMOS devices 218 and ground (VSS or Gnd). For instance, footer transistor (N3) may be coupled between transistor (N1) and ground (VSS or Gnd), and also, footer transistor (N4) may be coupled between transistor (N2) and ground (VSS or Gnd). Also, in some scenarios, a sense amplifier internal signal (SAINT) may be provided on a signal line coupled between nodes (n8, n9), wherein node (n8) is disposed between transistors (N1, N3), and wherein node (n9) is disposed between transistors (N2, N4). Also, a sense amplifier enable signal (SAE) may be coupled to the gate of transistor (N3), and a dummy sense amplifier enable signal (DSAE) may be coupled to the gate of transistor (N4). In some instances, the DSAE signal may be a logical zero signal (log 0), and the gate of transistor (N4) may be coupled to ground (VSS or Gnd).

In various implementations, transistors (P1, P2, P3, P4, P5) may refer to P-type field-effect transistors (PFET), and also, transistors (N1, N2, N3, N4) may refer to N-type FET (NFET) transistors. However, various other configurations may be used to achieve similar results, characteristics and/or behaviors.

In reference to process mismatches, various multiple operations during CMOS device fabrication processes, including, e.g., doping, photo-resist and mask alignment, etching, strain engineering, etc., can cause gradual changes in electrical properties along dimensional boundaries, attributes and/or characteristics, e.g., width, length, depth, threshold voltage, mobility, etc. These gradual changes can be in any direction (e.g., X-Y-Z axes) across a semiconductor wafer. For instance, in various 3D processes, these gradual changes may be across at least one of width (X-axis direction), height (Y-axis direction) and depth (Z-axis direction) of the wafer. In addition, these gradual changes in process parameters may be referred as "process mismatches". For some matched device pairs, such as, e.g., in differential amplifiers, the process mismatches induce a systematic offset in the amplifier so as to favor at least read-0 or read-1, thereby adversely impacting performance and/or power. Therefore, various physical layout techniques provided herein seek to cancel any adverse impact of process mismatches on matched device pairs in the X-Y-Z axes directions. In various implementations, the process mismatch cancellation schemes and techniques described herein may be used to match NMOS devices and/or PMOS devices for various process mismatch cancellation applications.

FIGS. 3A-3H illustrate various diagrams of multi-transistor stack architecture in multi-device stack configurations, such as, e.g., 2T stack configurations, in accordance with various implementations described herein. In particular, FIGS. 3A, 3C, 3E and 3G show various diagrams of a multi-transistor stack with a single common-gate architecture, and in addition, FIGS. 3B, 3D, 3F and 3H show various diagrams of the multi-transistor stack with a split-gate architecture.

Figure 3A:
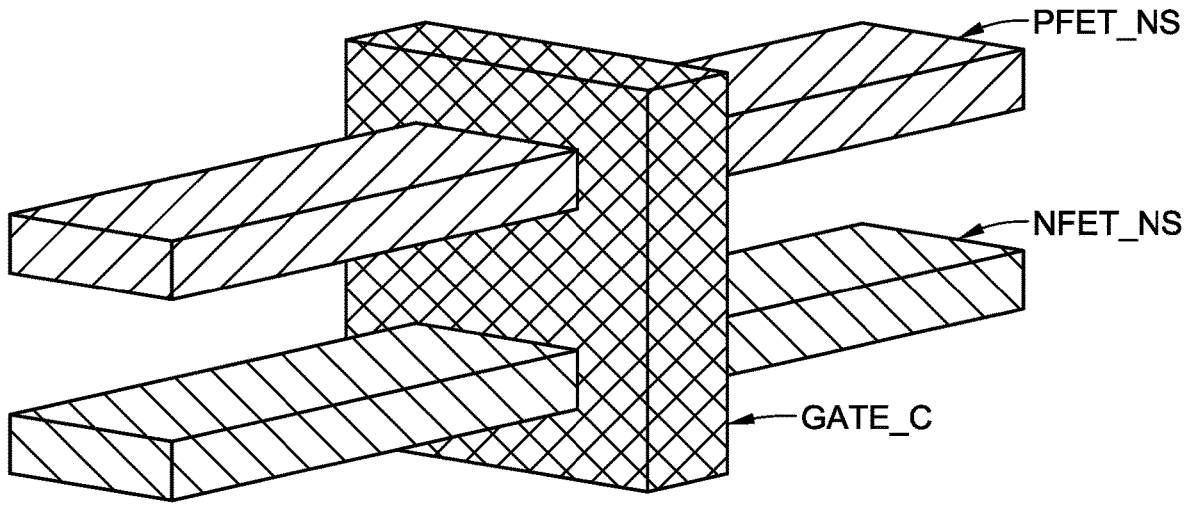
FIGS. 3A-3H illustrate various diagrams of multi-transistor stack architecture in multi-device stack configurations, such as, e.g., two-transistor (2T) stack configurations in accordance with various implementations described herein.

As shown in FIG. 3A, the P-over-N common-gate multi-transistor architecture 304A may include multiple transistors (e.g., 1-PFET device over 1-NFET device) arranged in a multi-transistor stack configuration, such as, e.g., an NFET device formed in a first nano-sheet (NFET_NS) and a PFET device formed in a second nano-sheet (PFET_NS) that is disposed above the NFET_NS device. Also, in some instances, the common-gate architecture 304A may refer to a single gate (e.g., single poly gate) coupled to the multiple transistors, such as, e.g., the single common-gate (GATE_C) coupled to the PFET_NS device and the NFET_NS device. This arrangement may provide the P-over-N (PN) stack configuration as a two-FET stacked device that is manufactured and/or formed in a single monolithic semiconductor die or in a sequential manner. Also, in various instances, the complementary P-type and N-type transistors refer to P-type and N-type field-effect transistors (PFET and NFET) that are disposed as a pair of transistors arranged in the P-over-N stack configuration. Also, in some instances, the P-over-N multi-transistor architecture 304A with the common-gate (GATE_C) may be used to implement an inverter.

Figure 3B:
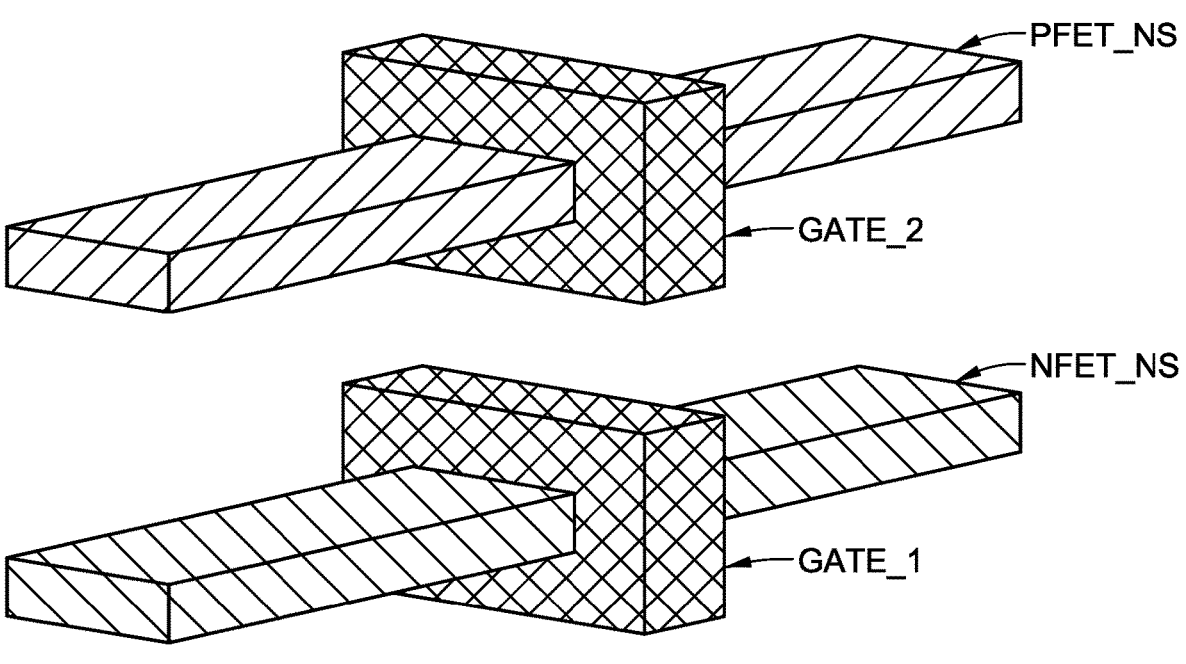

As shown in FIG. 3B, the P-over-N split-gate multi-transistor architecture 304B may include multiple transistors (e.g., 1-PFET device over 1-NFET device) arranged in a multi-transistor stack configuration, such as, e.g., an NFET device formed in a first nano-sheet (NFET_NS) and a PFET device formed in a second nano-sheet (PFET_NS) that is disposed above the NFET_NS device. Also, the split-gate architecture 304B may refer to multiple gates (e.g., dual poly gates) coupled to the multiple transistors, such as, e.g., a first gate (GATE_1) of the split-gate coupled to the NFET_NS device and a second gate (GATE_2) of the split-gate coupled to the PFET_NS device. Also, this arrangement may provide the P-over-N (PN) stack configuration as a two-FET stacked device that is manufactured and/or formed in a single monolithic semiconductor die or in a sequential manner. Moreover, in some instances, the complementary P-type and N-type transistors refer to PFET/NFET devices that are disposed as a pair of transistors arranged in the P-over-N stack configuration.

Figure 3C:
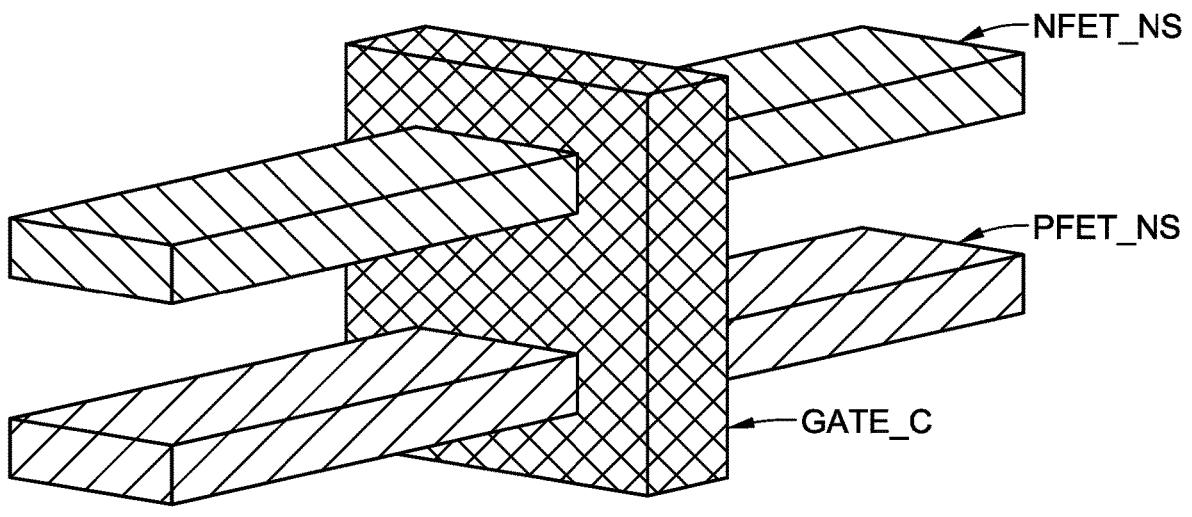

As shown in FIG. 3C, the N-over-P common-gate multi-transistor architecture 304C may include multiple transistors (e.g., 1-NFET device over 1-PFET device) arranged in a multi-transistor stack configuration, such as, e.g., a PFET device formed in a first nano-sheet (PFET_NS) and an NFET device formed in a second nano-sheet (NFET_NS) that is disposed above the PFET_NS device. Also, in some instances, the common-gate architecture 304C may refer to a single gate (e.g., single poly gate) coupled to the multiple transistors, such as, e.g., the single common-gate (GATE_C) coupled to the NFET_NS device and the PFET_NS device. This arrangement provides the N-over-P (NP) stack configuration as a two-FET stacked device that is manufactured and/or formed in a single monolithic semiconductor die or in a sequential manner. Further, in some instances, the complementary N-type and P-type transistors refer to NFET and PFET devices disposed as a pair of transistors that are arranged in the N-over-P stack configuration. Also, in some instances, the N-over-P multi-transistor architecture 304C with the common-gate (GATE_C) may be used to implement an inverter.

Figure 3D:
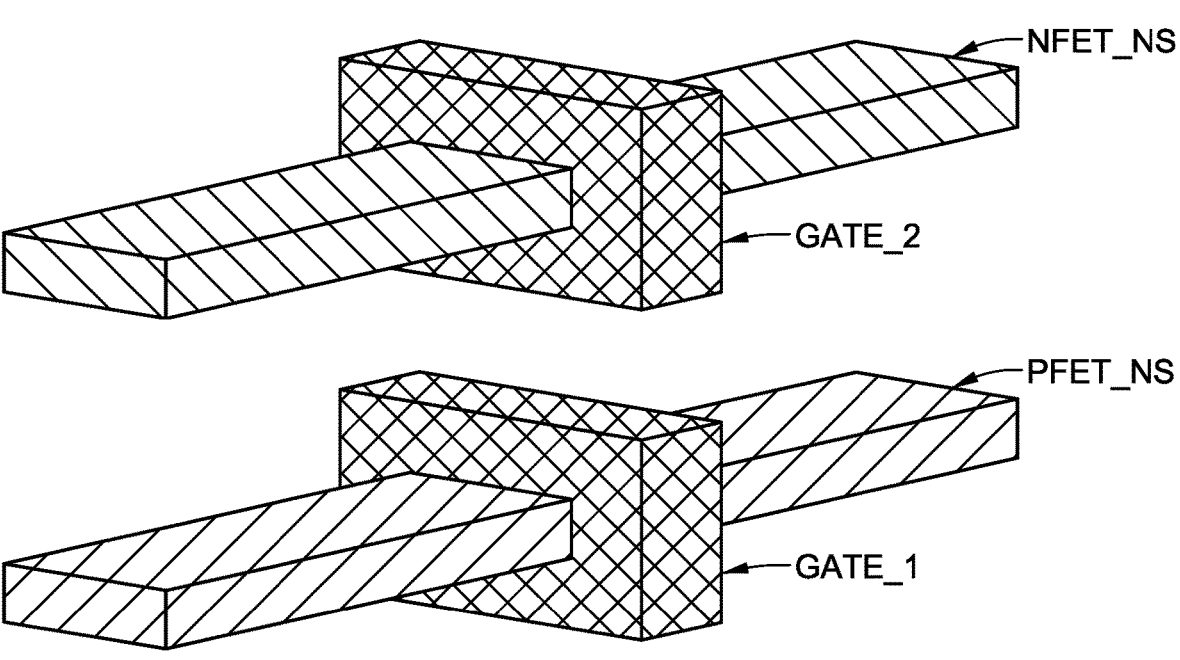

As shown in FIG. 3D, the N-over-P split-gate multi-transistor architecture 304D may include multiple transistors (e.g., 1-NFET device over 1-PFET device) arranged in a multi-transistor stack configuration, such as, e.g., a PFET device formed in a first nano-sheet (PFET_NS) and an NFET device formed in a second nano-sheet (NFET_NS) that is disposed above the PFET_NS device. Also, the split-gate architecture 304D may refer to multiple gates (e.g., dual poly gates) coupled to the multiple transistors, such as, e.g., a first gate (GATE_1) of the split-gate coupled to the PFET_NS device and a second gate (GATE_2) of the split-gate coupled to the NFET_NS device. Also, this arrangement may provide the N-over-P (NP) stack configuration as a two-FET stacked device that is manufactured and/or formed in a single monolithic semiconductor die or in a sequential manner. Moreover, in some instances, the complementary N-type and P-type transistors refer to NFET/PFET devices that are disposed as a pair of transistors arranged in the N-over-P stack configuration.

Figure 3E:
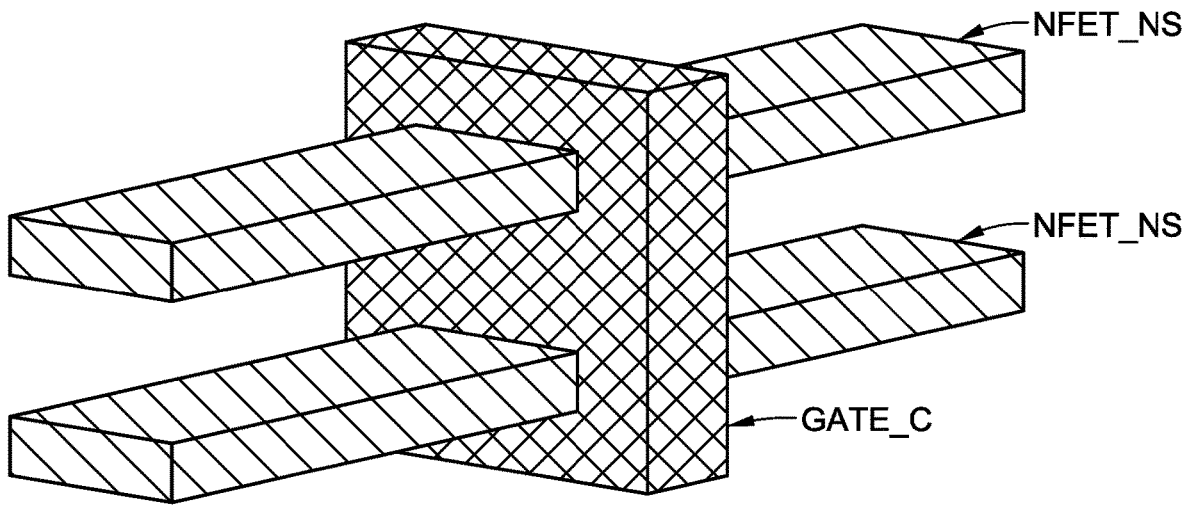

As shown in FIG. 3E, the N-over-N common-gate multi-transistor architecture 304E may include multiple transistors (e.g., 1-NFET device over 1-NFET device) arranged in a multi-transistor stack configuration, such as, e.g., a first NFET device formed in a first nano-sheet (NFET_NS_1) and a second NFET device formed in a second nano-sheet (NFET_NS_2) that is disposed above the NFET_NS_1 device. Also, in some instances, the common-gate architecture 304E refers to a single gate (e.g., single poly gate) coupled to the multiple transistors, such as, e.g., the single common-gate (GATE_C) coupled to the NFET_NS_1 device and the NFET_NS_2 device. This arrangement provides the N-over-N (NN) stack configuration as a two-FET stacked device that is manufactured and/or formed in a single monolithic semiconductor die or in a sequential manner. Moreover, in some instances, the dual N-over-N transistors refer to an NFET-over-NFET device disposed as a pair of transistors that are arranged in the N-over-N (NN) stack configuration.

In some implementations, the N-over-N multi-device stack 304E may refer to a device having a multi-transistor logic structure for use in memory architecture, wherein the multi-transistor logic structure has multiple transistors that are arranged in a single multi-transistor stack used to increase strength of the device. For instance, as shown in FIG. 3E, the N-over-N multi-device stack 304E includes two N-type transistors arranged in a single multi-transistor stack with a common-gate (GATE_C) that is used to increase strength of the device by a factor of two (e.g., double strength). In some instances, the common-gate (or single-gate) may be used to activate both transistors at the same time, which effectively doubles the strength of the N-over-N multi-device stack 304E. In other instances, three transistors in a single stack with a common-gate may be used to increase strength of a device by a factor of three (e.g., triple strength). Also, in other instances, four transistors in a single stack with a common-gate may be used to increase strength of a device by a factor of four (e.g., quadruple strength).

Figure 3F:
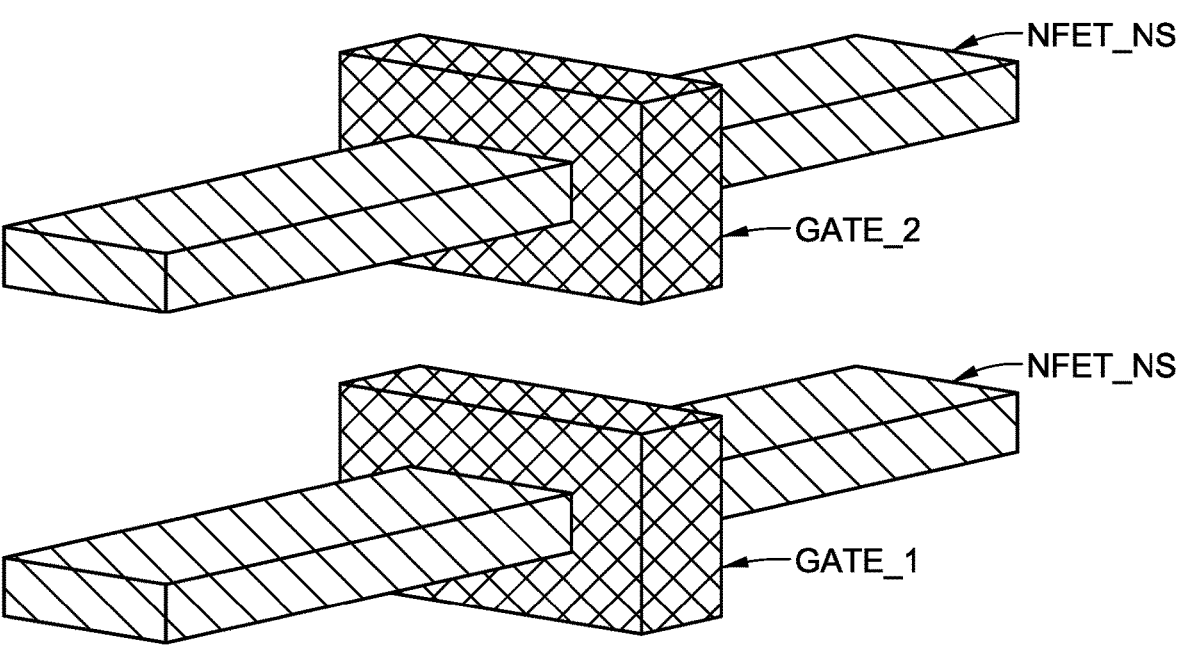

As shown in FIG. 3F, the N-over-N split-gate multi-transistor architecture 304F may include multiple transistors (e.g., 1-NFET device over 1-NFET device) arranged in a multi-transistor stack configuration, such as, e.g., a first NFET device formed in a first nano-sheet (NFET_NS_1) and a second NFET device formed in a second nano-sheet (NFET_NS_2) that is disposed above the NFET_NS_1 device. Also, in some instances, the split-gate architecture 304F may refer to multiple gates (e.g., dual poly gates) coupled to the multiple transistors, such as, e.g., a first gate (GATE_1) of the split-gate coupled to the NFET_NS_1 device and also a second gate (GATE_2) of the split-gate coupled to the NFET_NS_2 device. Also, as shown, this arrangement may provide the N-over-N (NN) stack configuration as a two-FET stacked device that is manufactured and/or formed in a single monolithic semiconductor die or in a sequential manner. Moreover, in some instances, the dual N-over-N transistors refer to an NFET-over-NFET device disposed as a pair of transistors that are arranged in the N-over-N (NN) stack configuration.

Figure 3G:
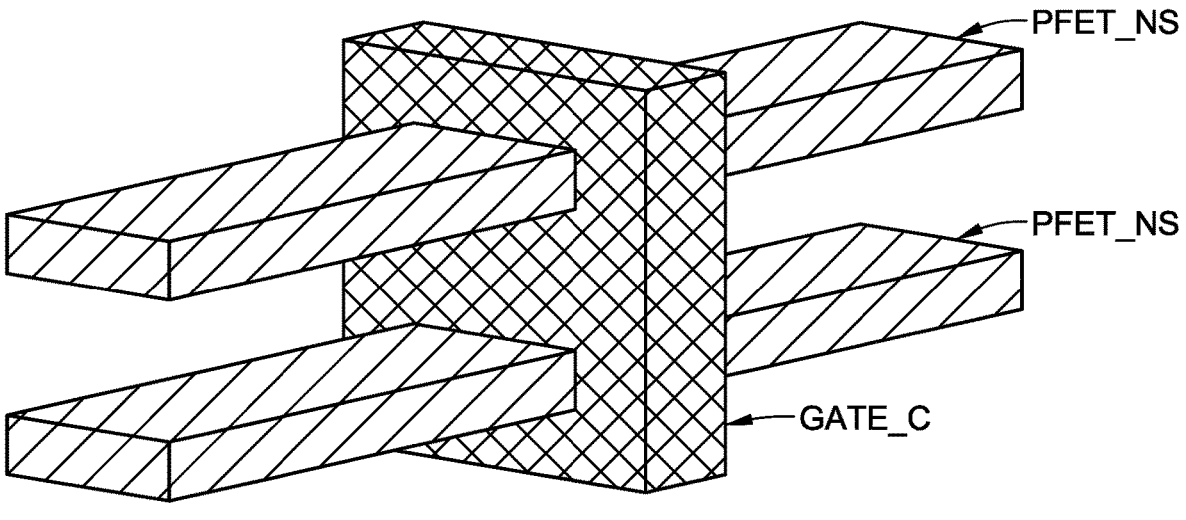

As shown in FIG. 3G, the P-over-P common-gate multi-transistor architecture 304E may include multiple transistors (e.g., 1-PFET device over 1-PFET device) arranged in a multi-transistor stack configuration, such as, e.g., a first PFET device formed in a first nano-sheet (PFET_NS_1) and a second PFET device formed in a second nano-sheet (PFET_NS_2) that is disposed above the PFET_NS_1 device. Also, in some instances, the common-gate architecture 304G refers to a single gate (e.g., single poly gate) coupled to the multiple transistors, such as, e.g., the single common-gate (GATE_C) coupled to the PFET_NS_1 device and the PFET_NS_2 device. This arrangement provides the P-over-P (PP) stack configuration as a two-FET stacked device that is manufactured and/or formed in a single monolithic semiconductor die or in a sequential manner. Moreover, in some instances, the dual P-over-P transistors refer to a PFET-over-PFET device disposed as a pair of transistors that are arranged in the P-over-P (PP) stack configuration.

In some implementations, the P-over-P multi-device stack 304G may refer to a device having a multi-transistor logic structure for use in memory architecture, wherein the multi-transistor logic structure has multiple transistors that are arranged in a single multi-transistor stack used to increase strength of the device. For instance, as shown in FIG. 3G, the P-over-P multi-device stack 304G includes two P-type transistors arranged in a single multi-transistor stack with a common-gate (GATE_C) that is used to increase strength of the device by a factor of two (e.g., double strength). In some instances, the common-gate (or single-gate) may be used to activate both transistors at the same time, which effectively doubles the strength of the P-over-P multi-device stack 304G. In other instances, three transistors in a single stack with a common-gate may be used to increase strength of a device by a factor of three (e.g., triple strength). Further, in other instances, four transistors in a single stack with a common-gate may be used to increase strength of a device by a factor of four (e.g., quadruple strength).

Figure 3H:
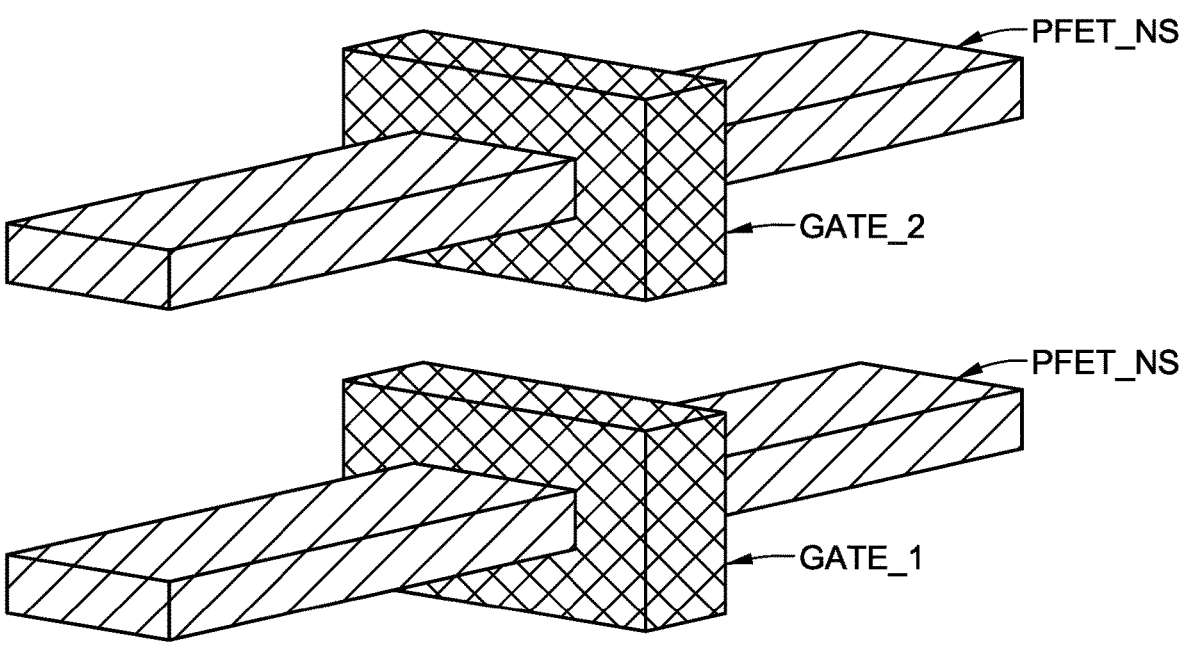

As shown in FIG. 3H, the P-over-P split-gate multi-transistor architecture 304H may include multiple transistors (e.g., 1-PFET device over 1-PFET device) arranged in a multi-transistor stack configuration, such as, e.g., a first PFET device formed in a first nano-sheet (PFET_NS_1) and a second PFET device formed in a second nano-sheet (PFET_NS_2) that is disposed above the PFET_NS_1 device. Also, in some instances, the split-gate architecture 304H may refer to multiple gates (e.g., dual poly gates) coupled to the multiple transistors, such as, e.g., a first gate (GATE_1) of the split-gate coupled to the PFET_NS_1 device and also a second gate (GATE_2) of the split-gate coupled to the PFET_NS_2 device. Also, as shown, this arrangement may provide the P-over-P (PP) stack configuration as a two-FET stacked device that is manufactured and/or formed in a single monolithic semiconductor die or in a sequential manner. Moreover, in some instances, the dual P-over-P transistors refer to a PFET-over-PFET device disposed as a pair of transistors that are arranged in the P-over-P (PP) stack configuration.

In some implementations, in reference to FIGS. 3A-3H, the gate architectures may utilize a common-gate architecture and/or a split-gate architecture. For instance, as shown in FIGS. 3A, 3C, 3E and 3G, the multiple transistors (PFET and NFET) may share a single gate structure. Thus, the pair of stacked PFET/NFET devices may share a single common-gate structure. In other instances, as shown in FIGS. 3B, 3D, 3F and 3H, the multiple transistors (PFET and NFET) may utilize a split-gate structure. Thus, the pair of stacked PFET/NFET devices may share a dual split-gate structure.

Figure 4A:
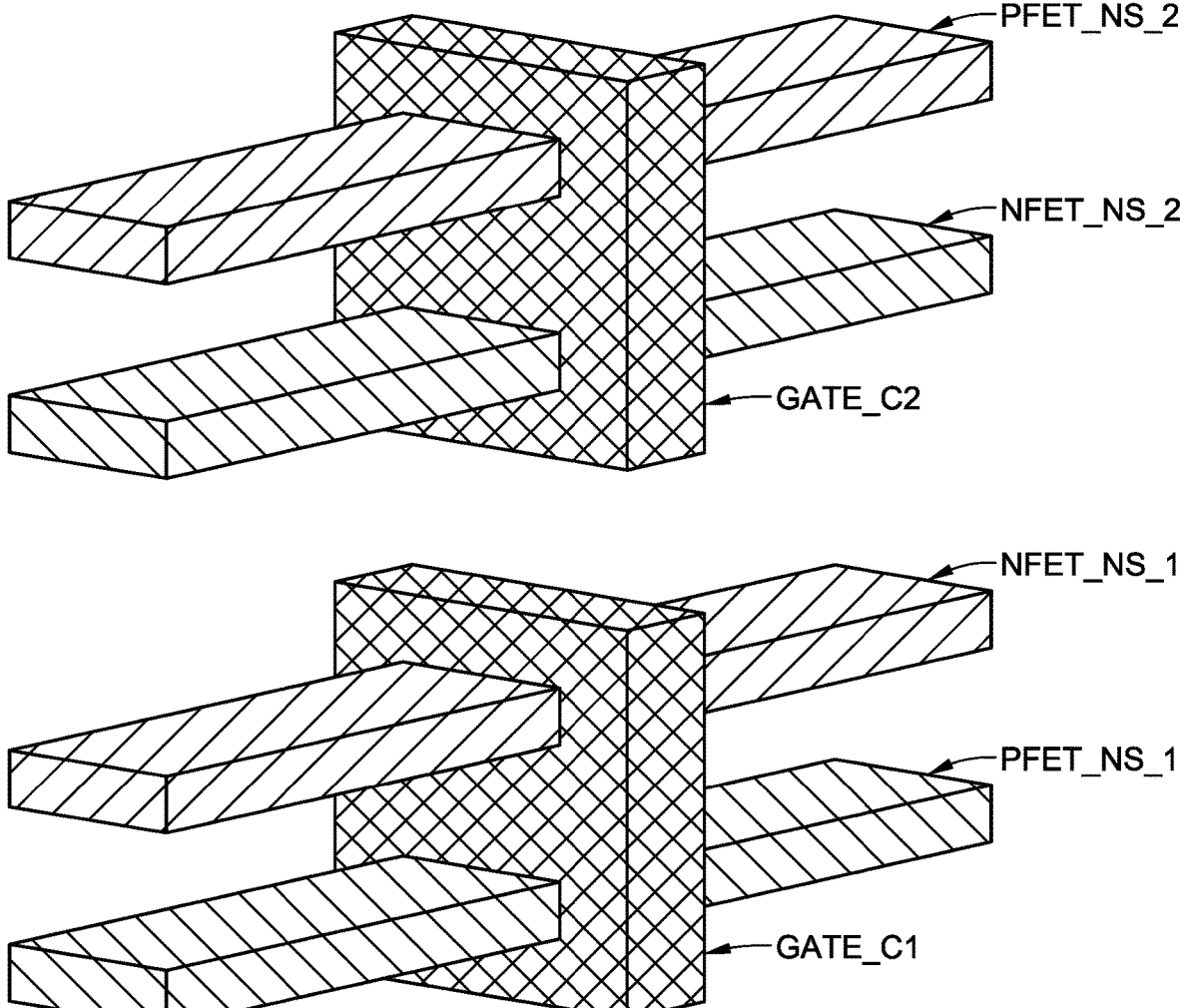
FIGS. 4A-4P illustrate various diagrams of multi-transistor stack architecture in multi-device stack configurations, such as, e.g., four-transistor (4T) stack configurations in accordance with various implementations described herein.
Figure 4B:
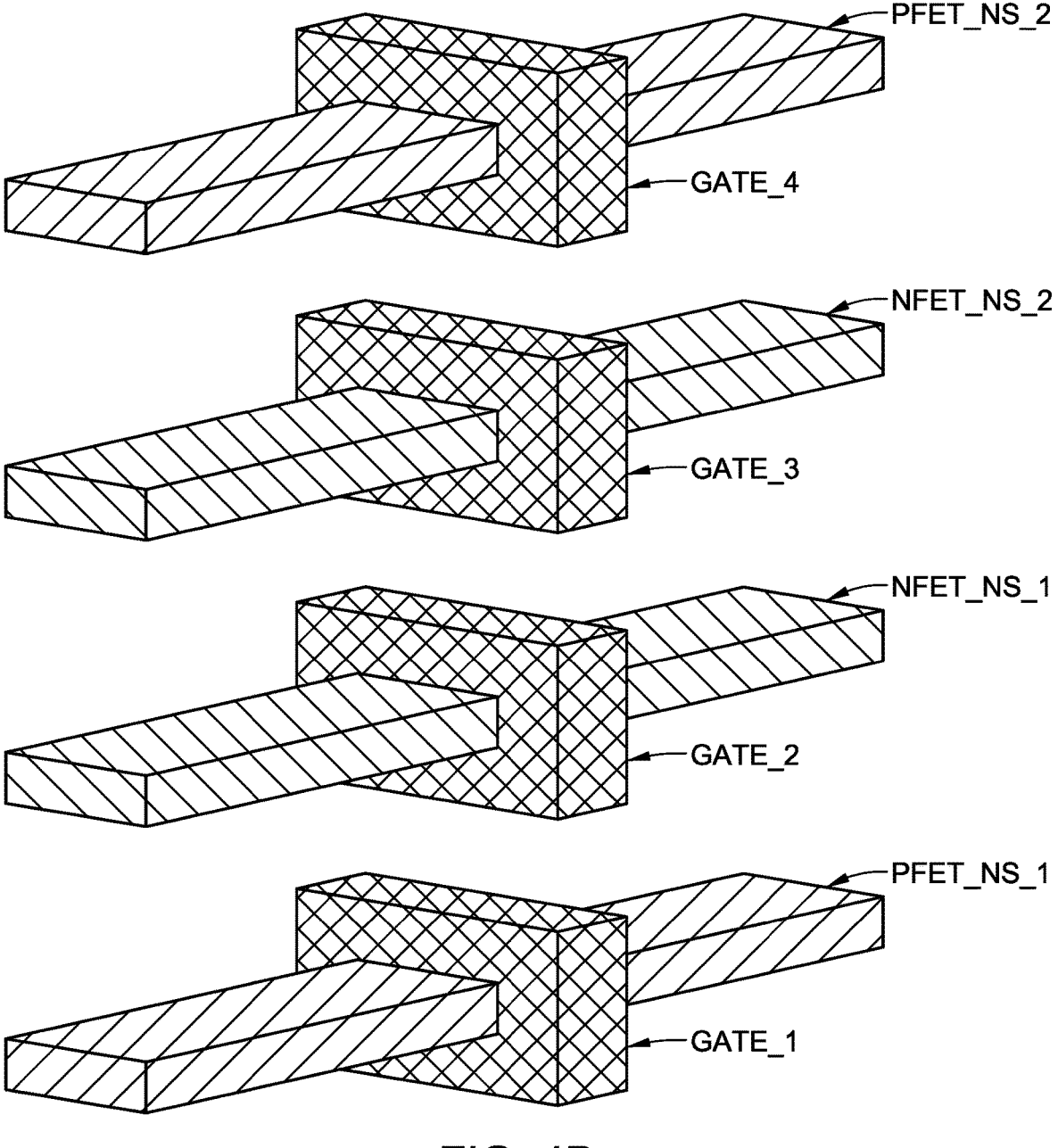
Figure 4C:
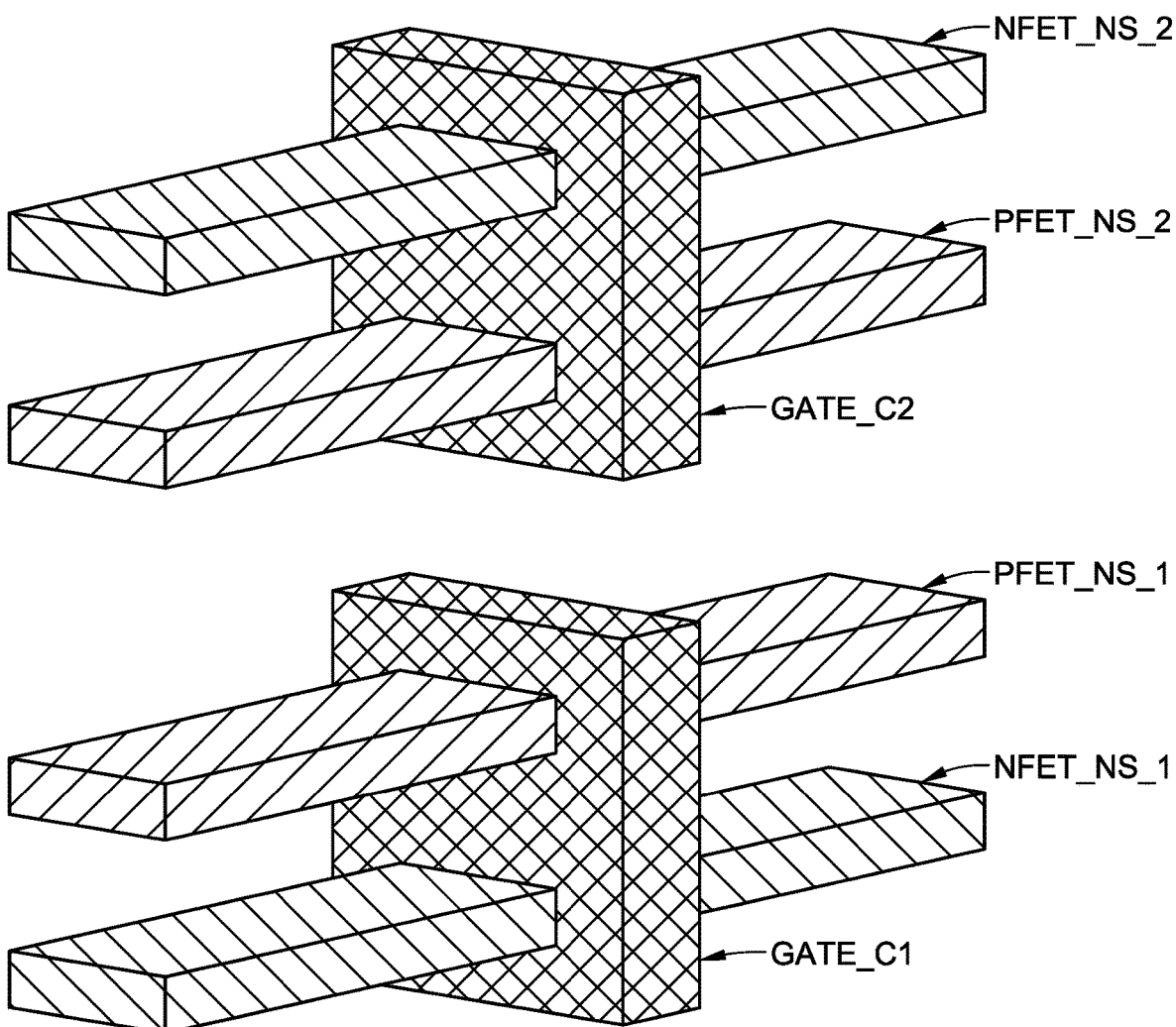
Figure 4D:
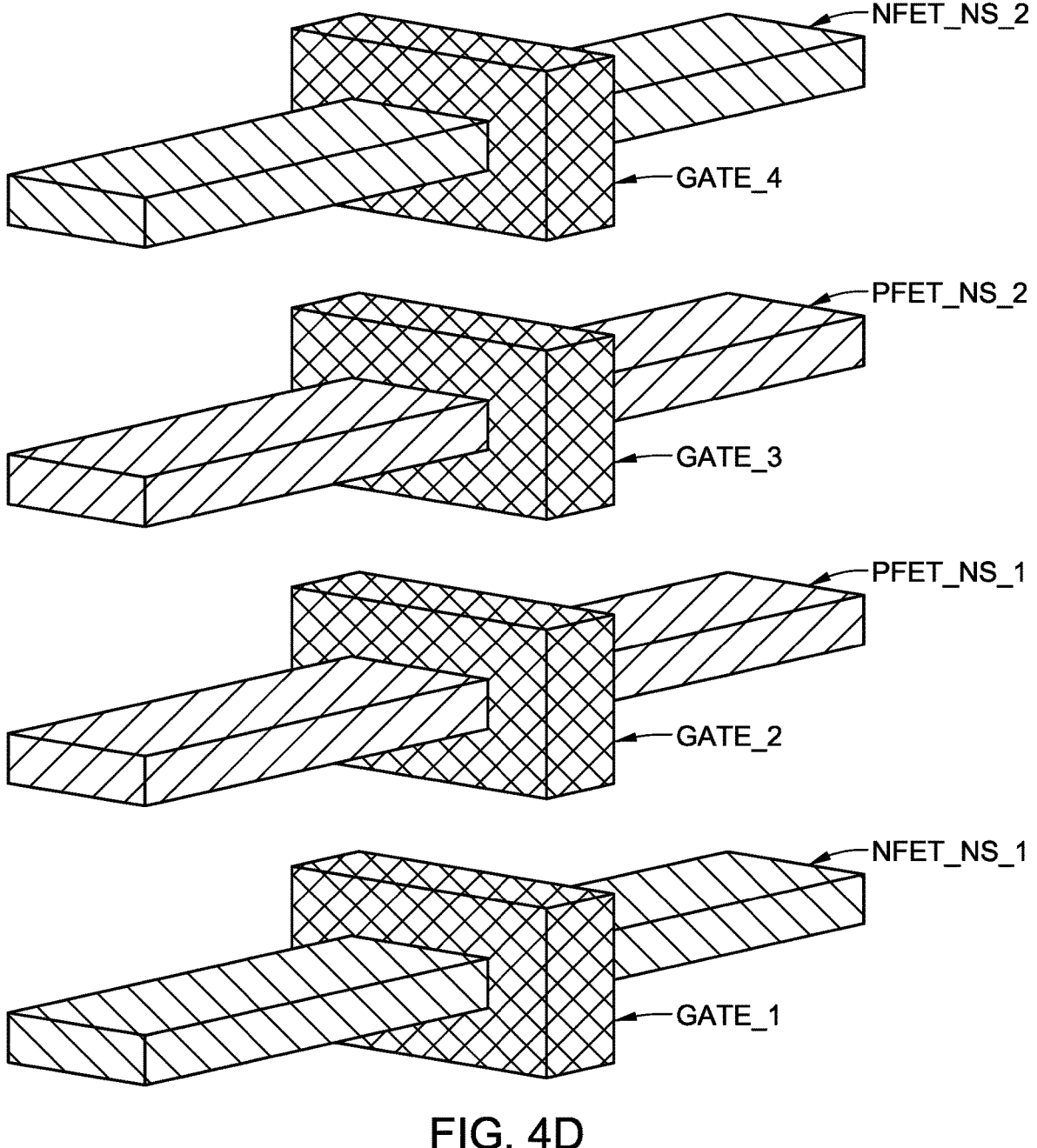
Figure 4E:
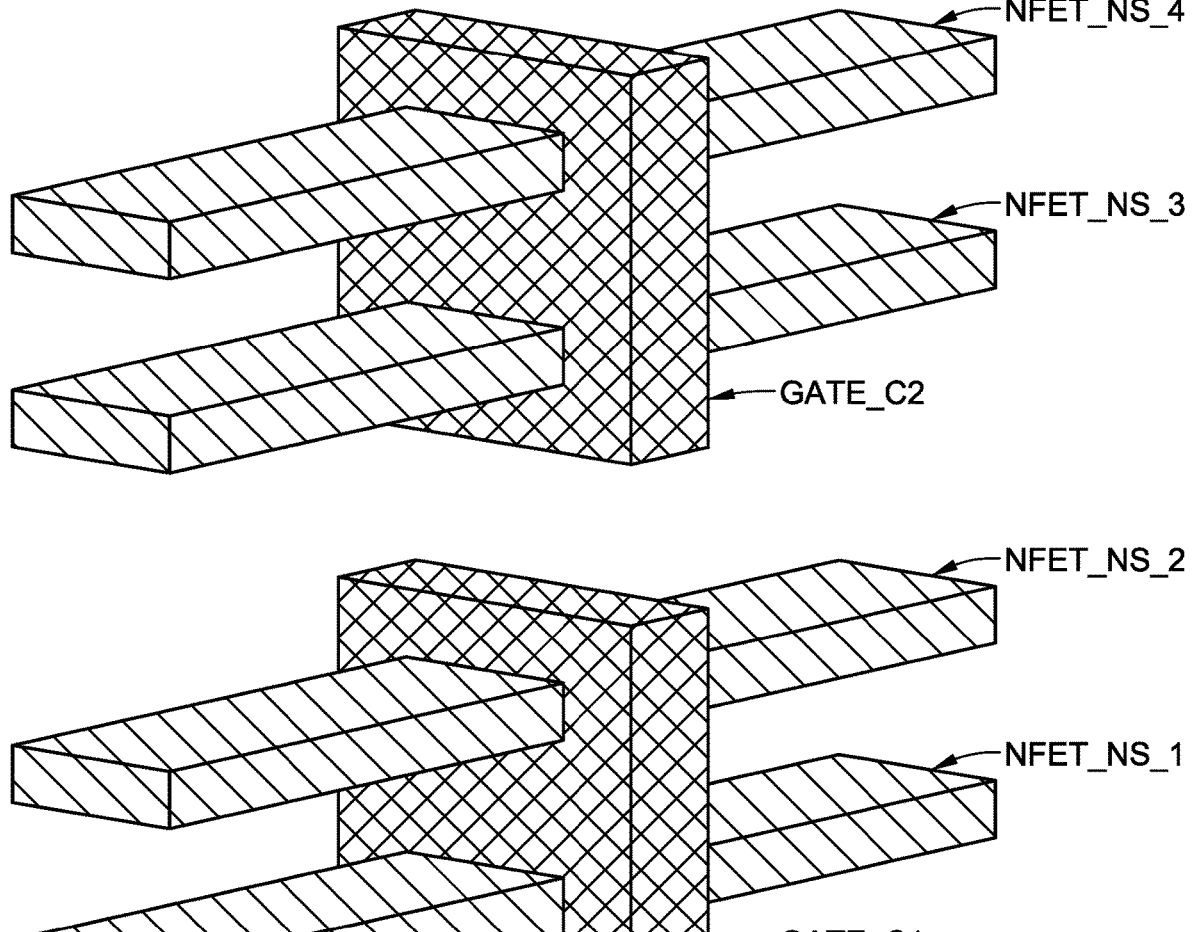
Figure 4F:
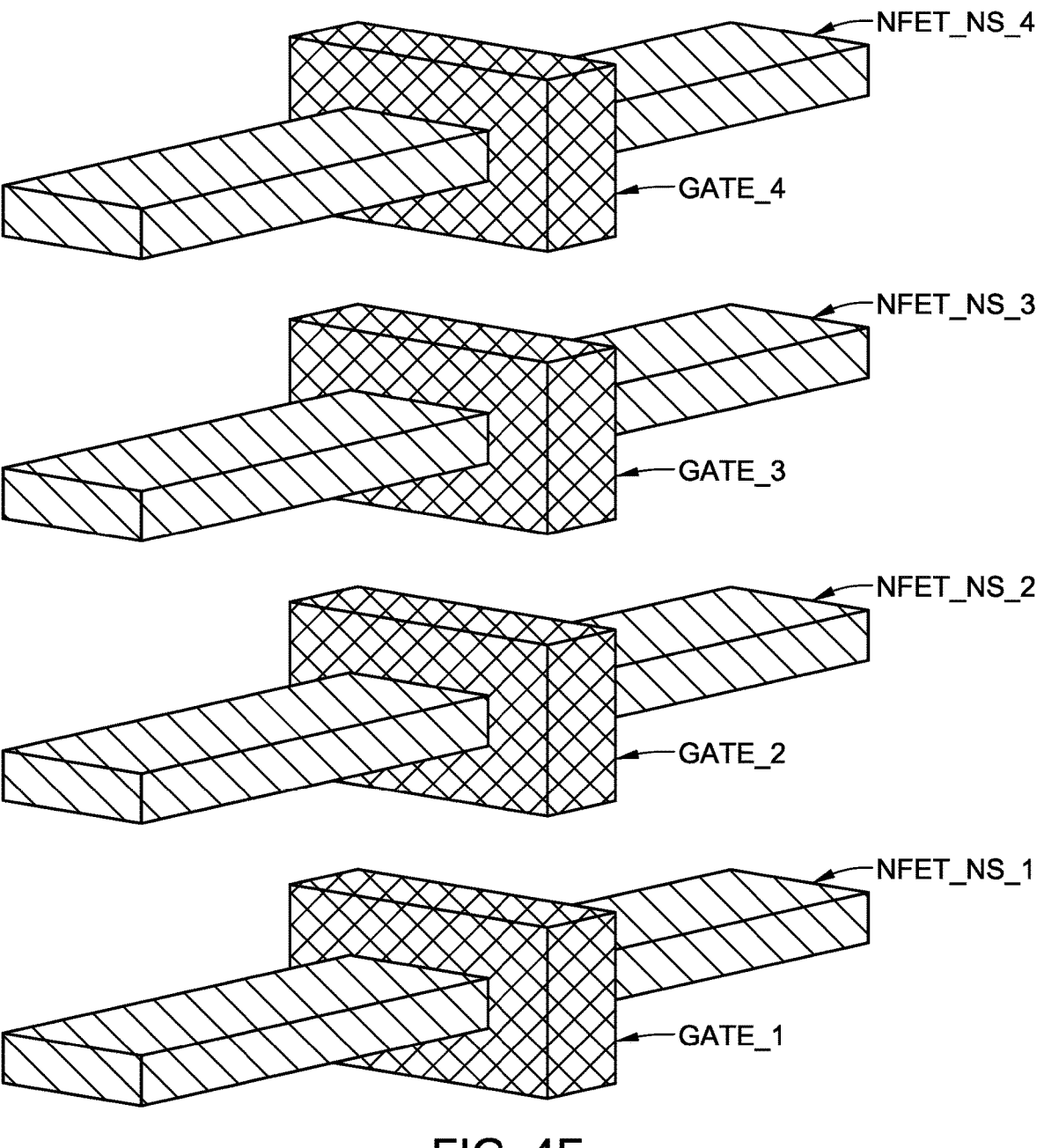
Figure 4G:
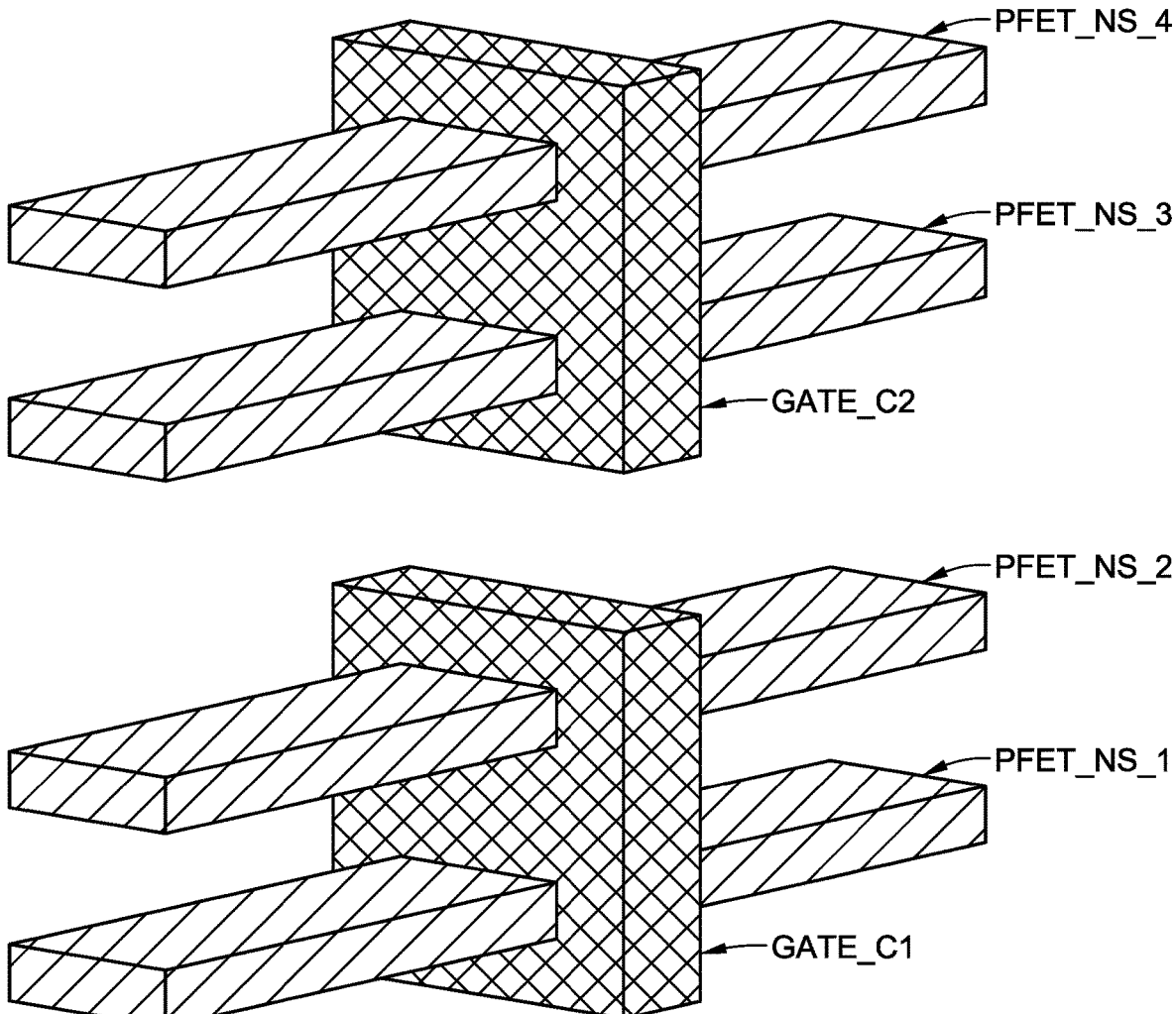
Figure 4H:
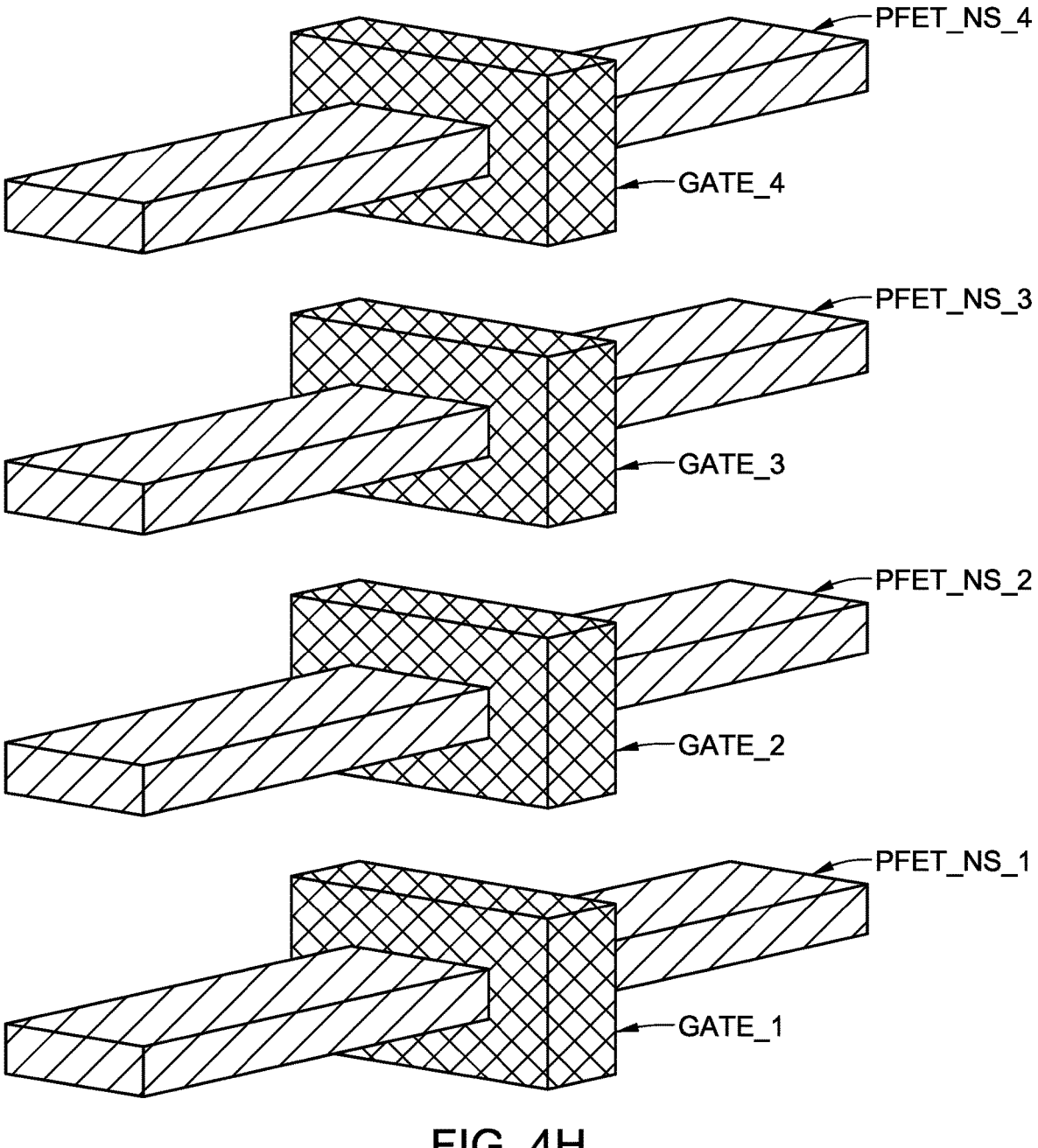
Figure 4I:
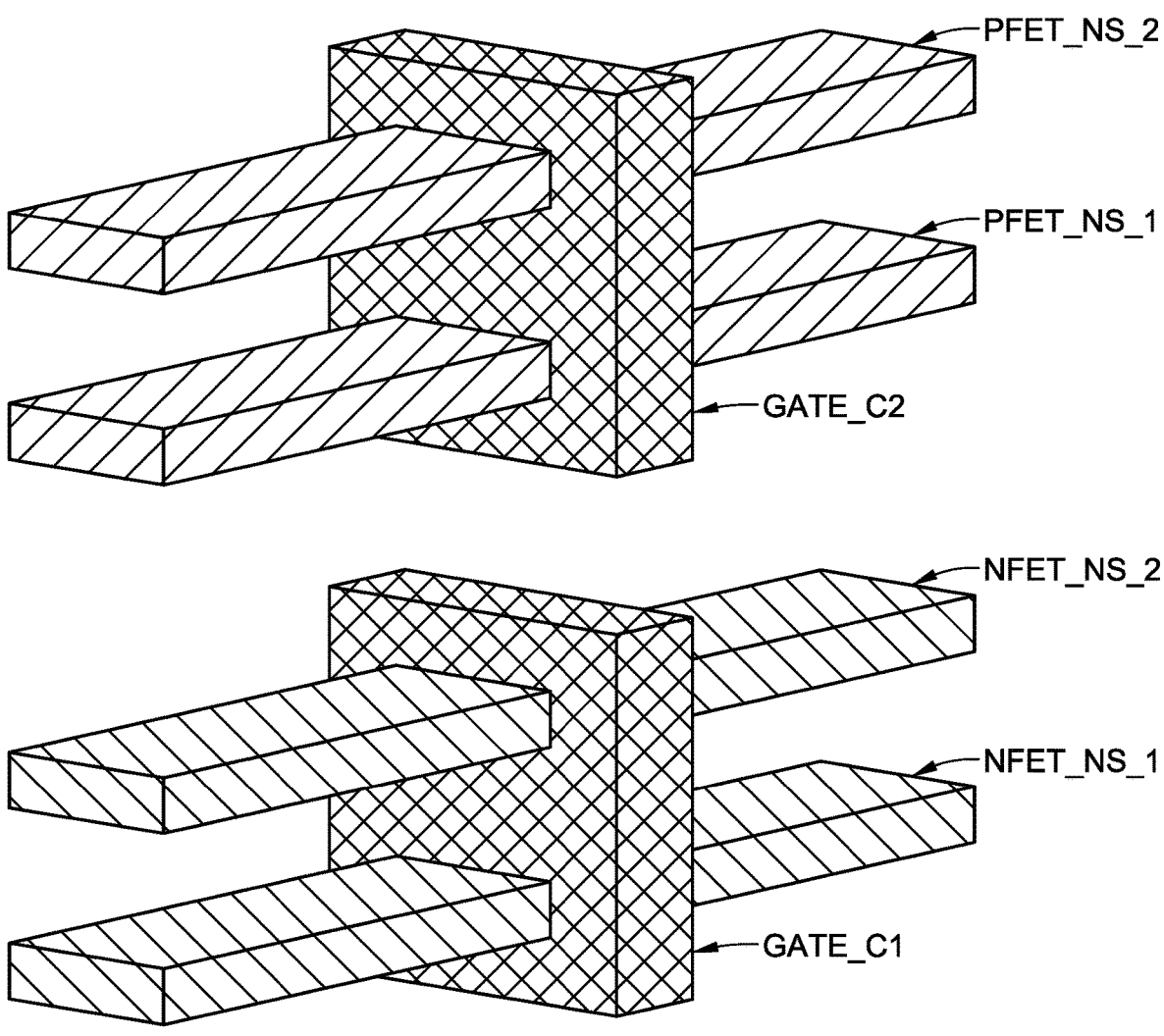
Figure 4J:
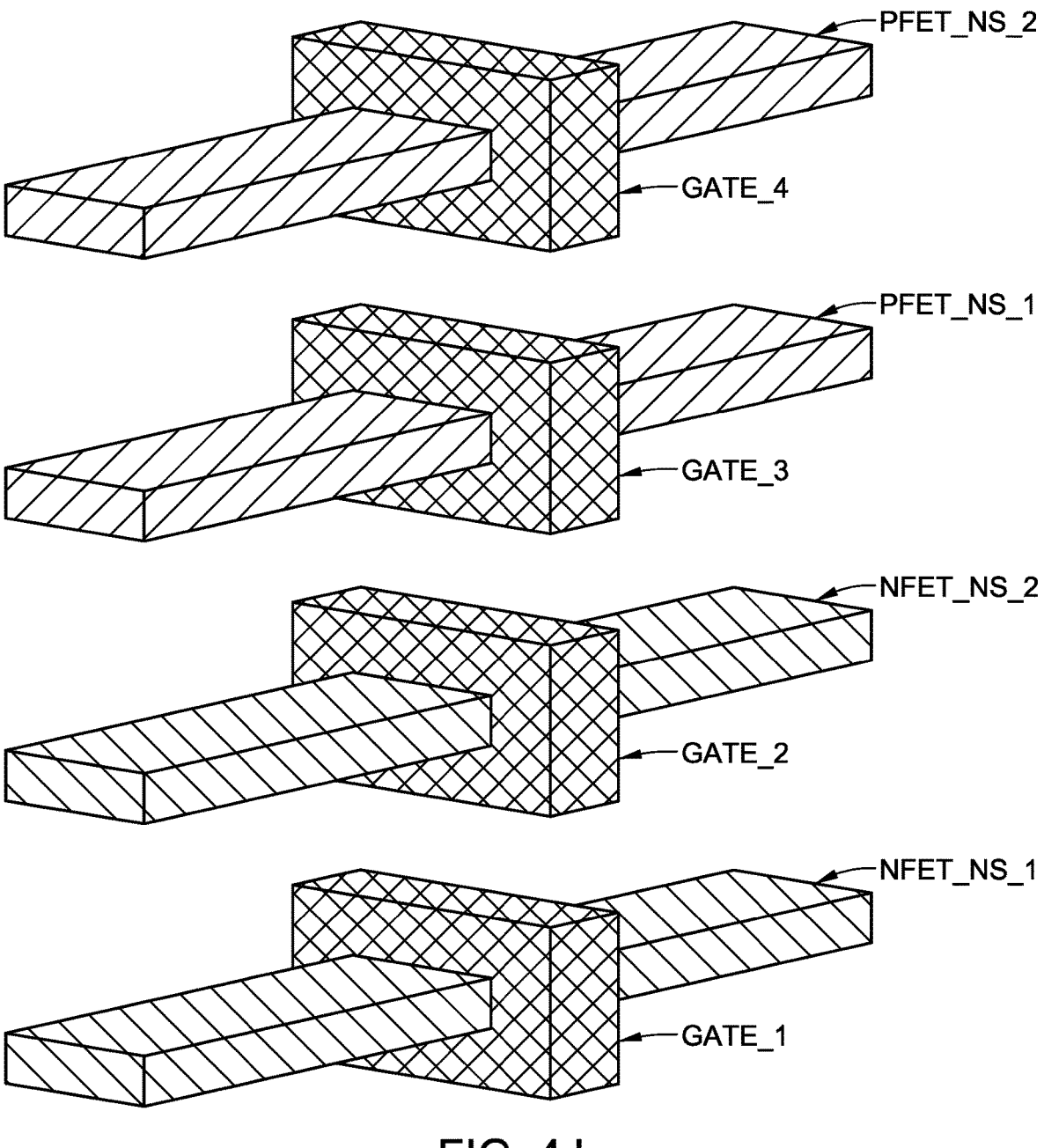
Figure 4K:
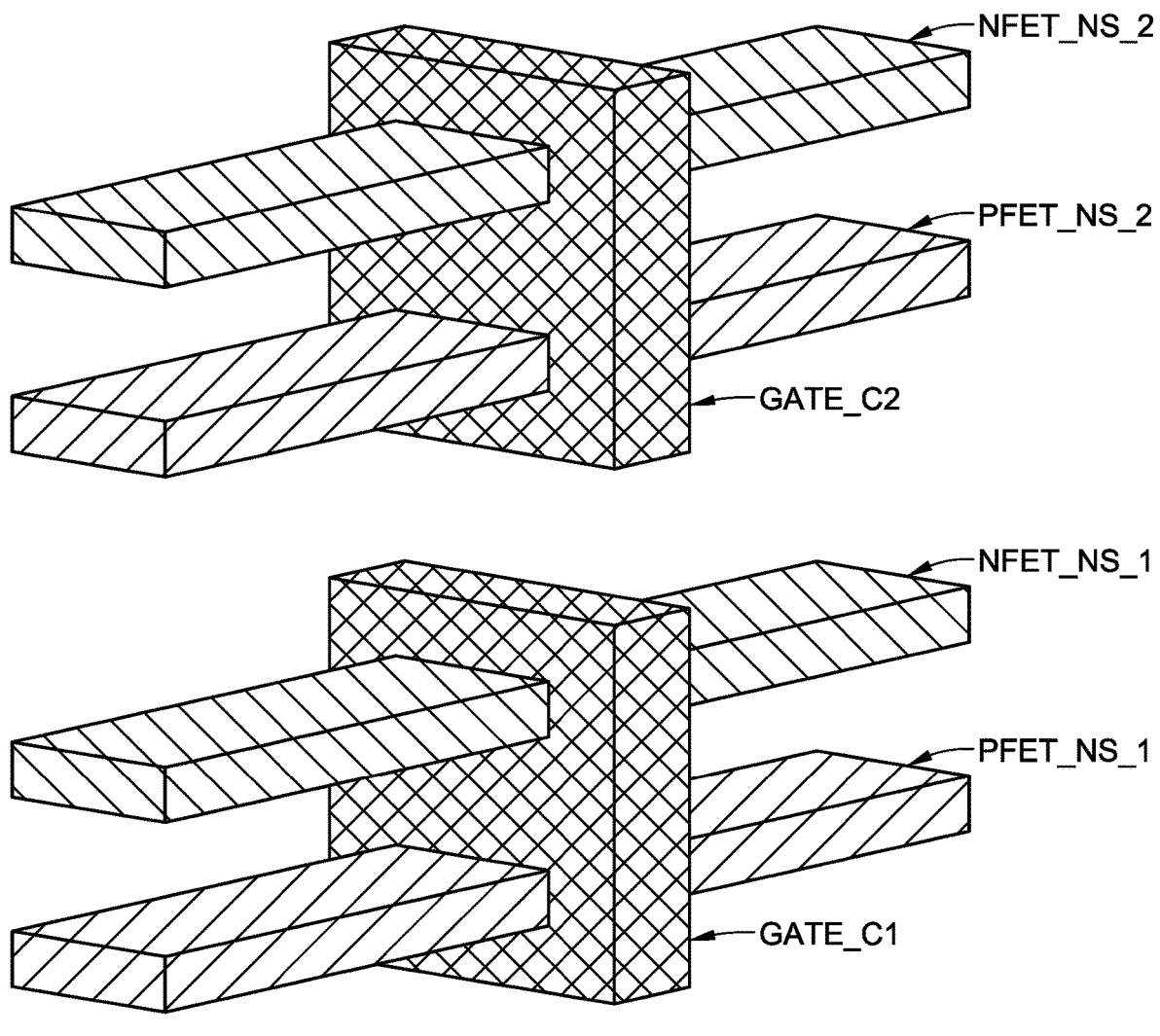
Figure 4L:
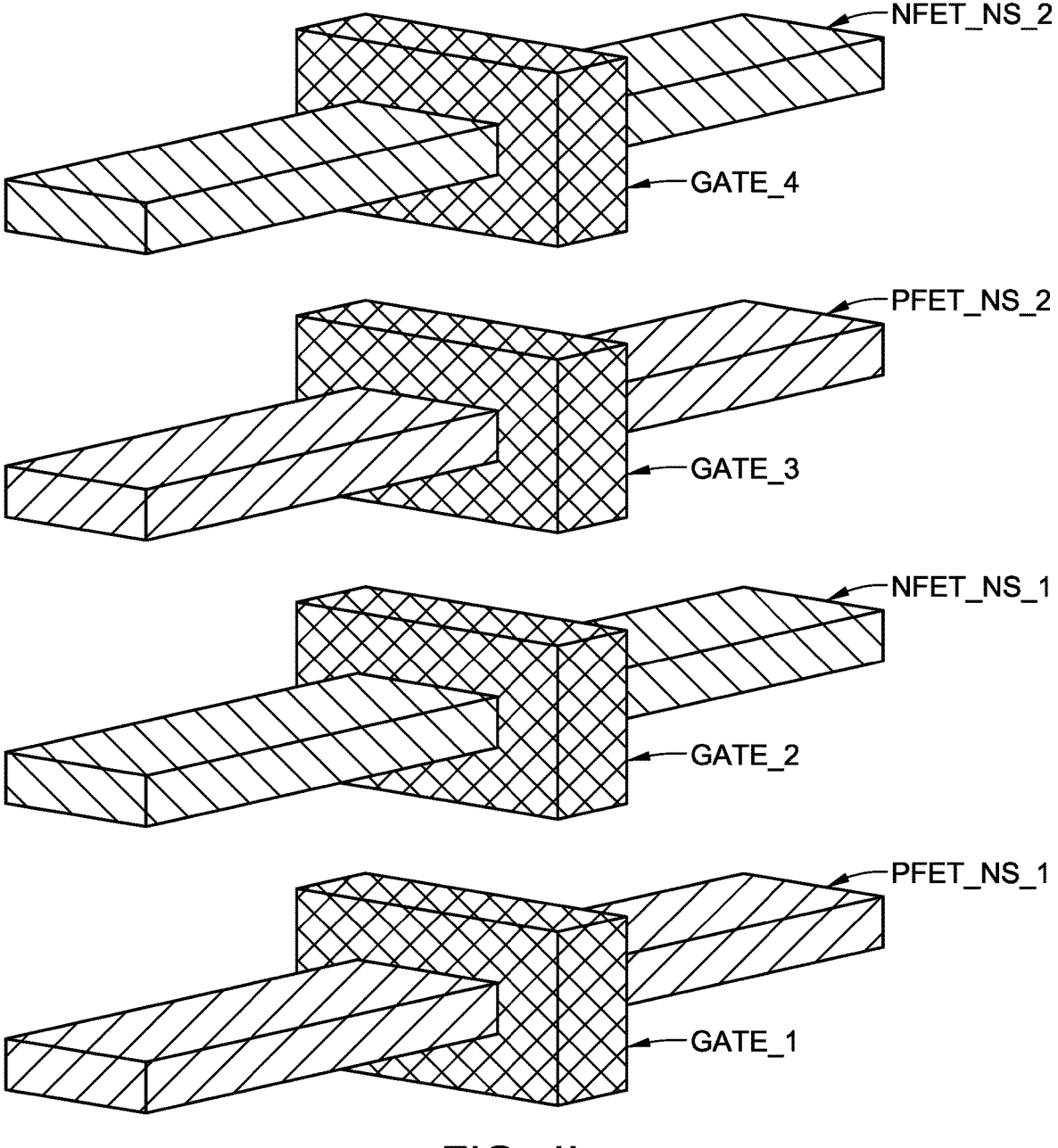
Figure 4M:
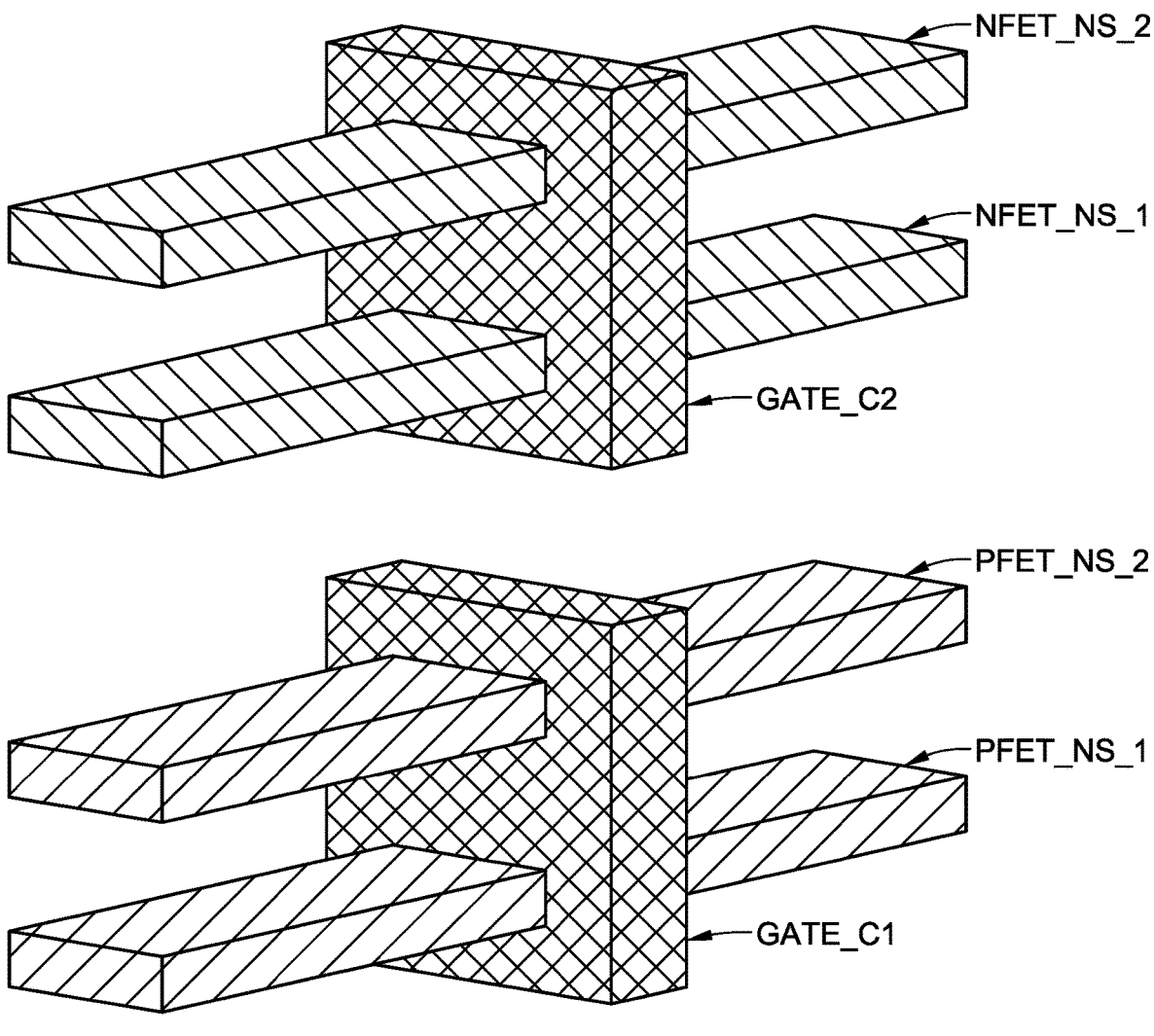
Figure 4N:
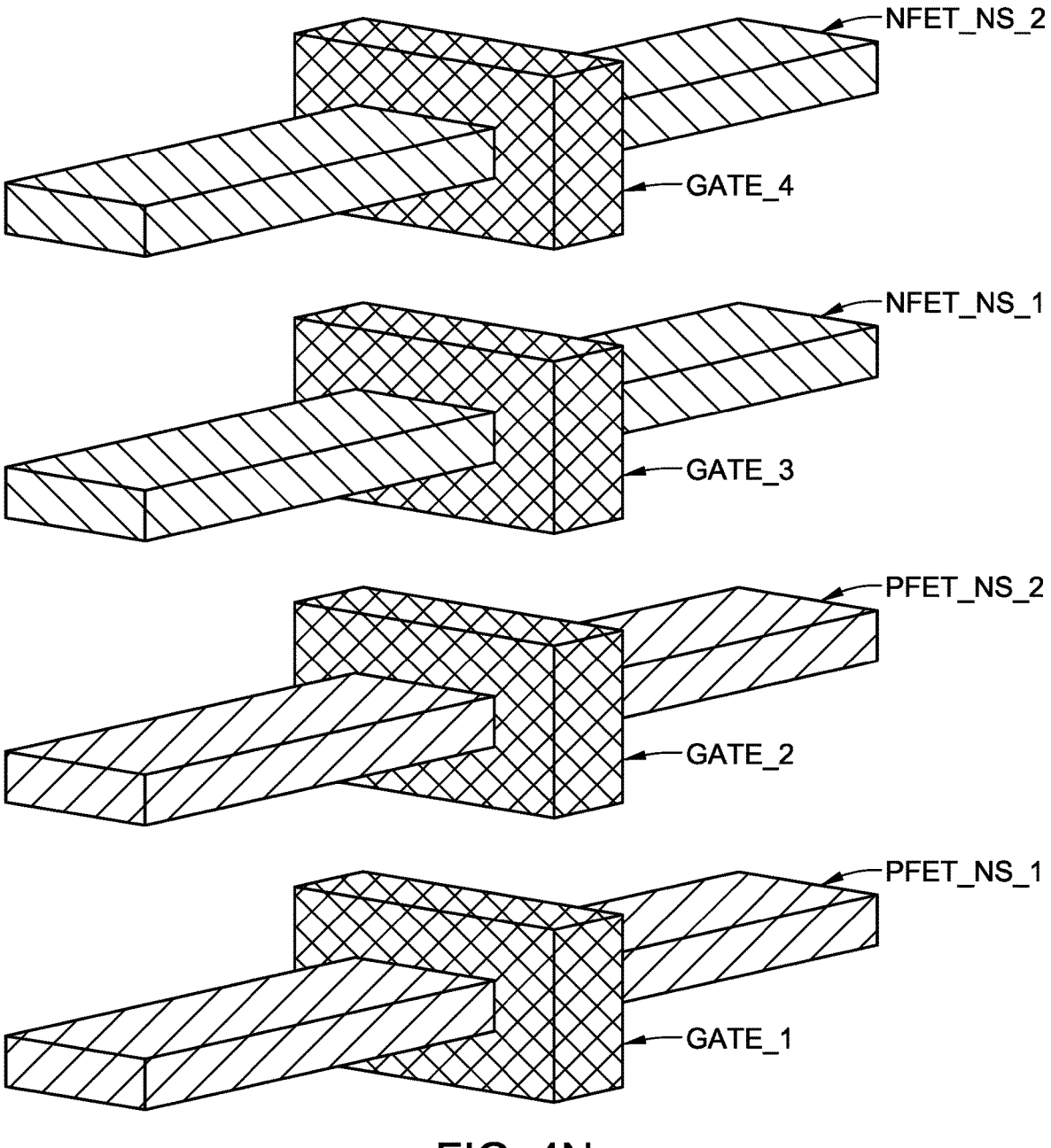
Figure 4O:
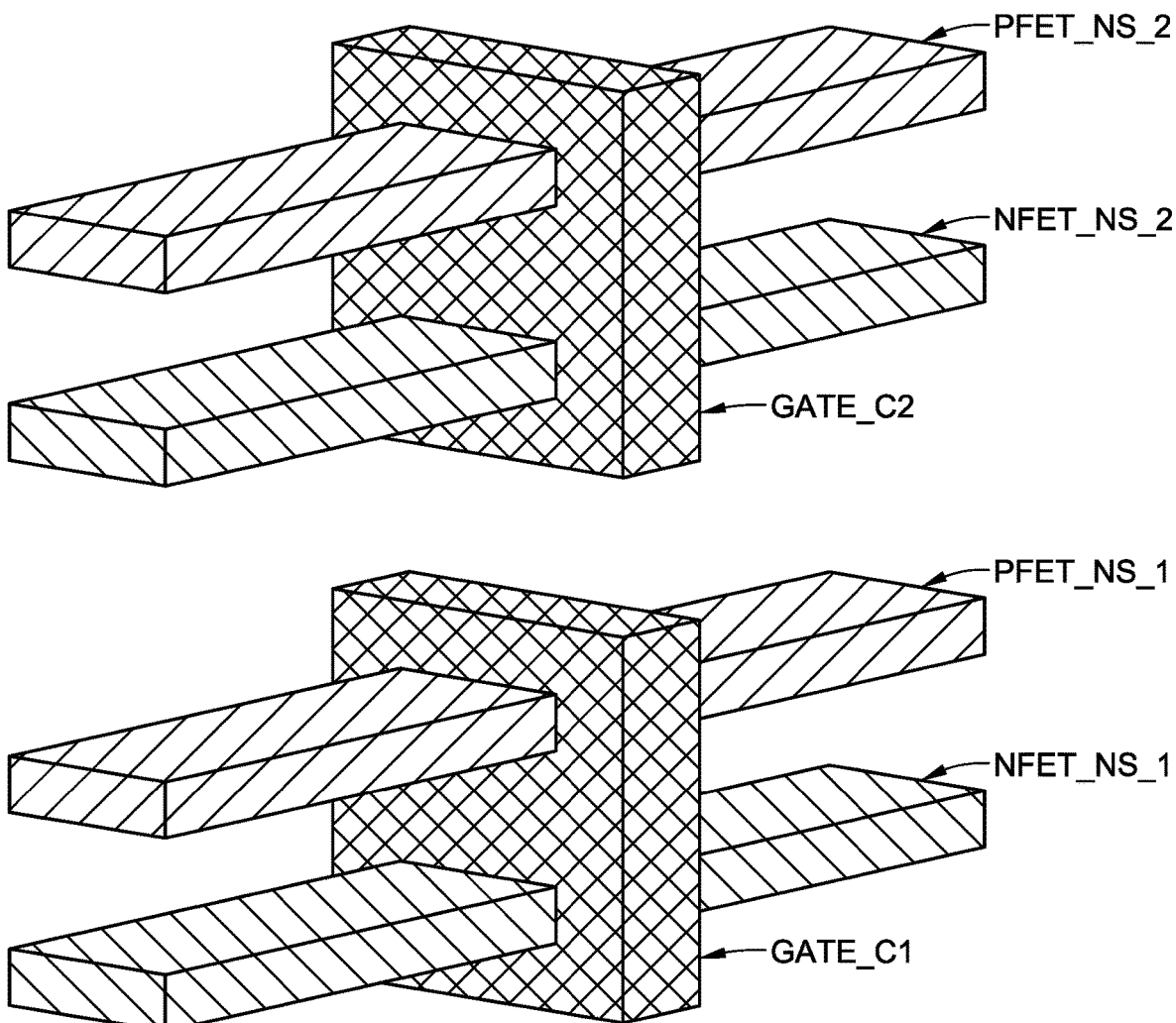
Figure 4P:
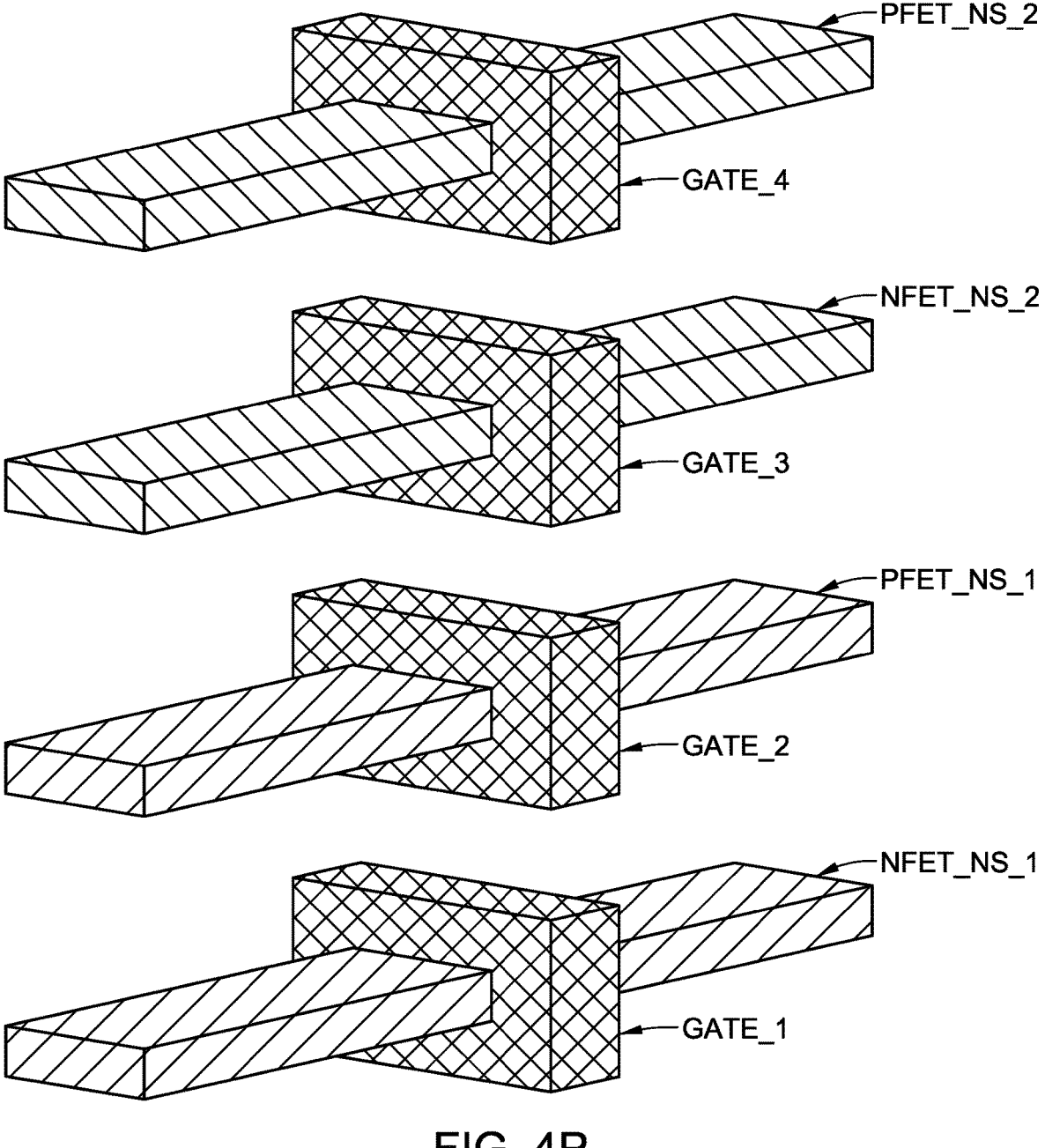

FIGS. 4A-4P illustrate various diagrams of multi-transistor stack architecture in multi-device stack configurations, such as, e.g., 4T stack configurations, in accordance with various implementations described herein. In particular, FIGS. 4A, 4C, 4E, 4G, 41, 4K, 4M and 4O show various diagrams of a multi-transistor stack with dual-common-gate architecture, and in addition, FIGS. 4B, 4D, 4F, 4H, 4J, 4L, 4N and 4P show various diagrams of the multi-transistor stack with a split-gate architecture.

As shown in FIG. 4A, the P-over-N-over-N-over-P (PNNP) dual-common-gate related transistor architecture 404A may include multiple transistors (e.g., 2 PFET devices and 2 NFET devices) that are arranged in a multi-transistor stack configuration. In some instances, a first PFET may be formed in a first PFET nano-sheet (PFET_NS_1), and a second PFET may be formed in a second PFET nano-sheet (NFET_NS_2), which may be disposed vertically in a single stack. Also, a first NFET may be formed in a first NFET nano-sheet (NFET_NS_1), and a second NFET may be formed in a second NFET nano-sheet (NFET_NS_2), which may be disposed vertically in the same single stack with the PFET devices. The common-gate architecture 404A may include multiple common-gates (e.g., dual poly gate lines) coupled to the multiple transistors. In some instances, a first common-gate (GATE_C1) may be coupled to the PFET_NS_1 device and NFET_NS_1 device, and also, a second common-gate (GATE_C2) may be coupled to the NFET_NS_2 device and PFET_NS_2 device. This multi-device stack arrangement provides the PNNP stack configuration as a four-FET stacked device that is manufactured and/or formed in a same single monolithic semiconductor die or in a sequential manner. Further, in some instances, the pair of N-type devices may be disposed between the pair of P-type devices in the multi-transistor stack architecture 404A along with the dual-common-gate structure.

As shown in FIG. 4B, the P-over-N-over-N-over-P (PNNP) split-gate related transistor architecture 404B may include multiple transistors (e.g., 2 PFET devices and 2 NFET devices) arranged in a multi-transistor stack configuration. In various instances, a first PFET may be formed in a first PFET nano-sheet (PFET_NS_1), and a second PFET may be formed in a second PFET nano-sheet (PFET_NS_2), which may be disposed vertically in a single stack. In addition, a first NFET may be formed in a first NFET nano-sheet (NFET_NS_1), and a second NFET may be formed in a second NFET nano-sheet (NFET_NS_2), which may be disposed vertically in the same single stack along with the two PFET devices. The split-gate architecture 404B may include multiple split-gates (e.g., multiple poly gate lines) coupled to the multiple transistors. In some instances, a first gate (GATE_1) may be coupled to the PFET_NS_1 device, a second gate (GATE_2) may be coupled to the NFET_NS_1 device, a third gate (GATE_3) may be coupled to the NFET_NS_2 device, and a fourth gate (GATE_4) may be coupled to the PFET_NS_2 device. This multi-device stack arrangement provides the PNNP stack configuration as a four-FET stacked device that is manufactured and/or formed in a same single monolithic semiconductor die or in a sequential manner. Also, in some instances, the pair of N-type devices may be disposed between the pair of P-type devices in the multi-transistor stack architecture 404B along with the quad-split-gate structure.

As shown in FIG. 4C, the N-over-P-over-P-over-N (NPPN) dual-common-gate related transistor architecture 404C may include multiple transistors (e.g., 2 NFET devices and 2 PFET devices) that are arranged in a multi-transistor stack configuration.

In some instances, a first NFET may be formed in a first NFET nano-sheet (NFET_NS_1), and a second NFET may be formed in a second NFET nano-sheet (NFET_NS_2), which may be disposed vertically in a single stack. Also, a first PFET may be formed in a first PFET nano-sheet (PFET_NS_1), and a second PFET may be formed in a second PFET nano-sheet (PFET_NS_2), which may be disposed vertically in the same single stack with the NFET devices. The common-gate architecture 404C may have multiple common-gates (e.g., dual poly gate lines) coupled to the multiple transistors. In some instances, a first common-gate (GATE_C1) may be coupled to the NFET_NS_1 device and PFET_NS_1 device, and also, a second common-gate (GATE_C2) may be coupled to the PFET_NS_2 device and NFET_NS_2 device. This multi-device stack arrangement provides the NPPN stack configuration as a four-FET stacked device that is manufactured and/or formed in a same single monolithic semiconductor die or in a sequential manner. Further, in some instances, the pair of P-type devices may be disposed between the pair of N-type devices in the multi-transistor stack architecture 404C along with the dual-common-gate structure.

As shown in FIG. 4D, the N-over-P-over-P-over-N (NPPN) split-gate related transistor architecture 404D may include multiple transistors (e.g., 2 NFET devices and 2 PFET devices) arranged in a multi-transistor stack configuration. In various instances, a first NFET may be formed in a first NFET nano-sheet (NFET_NS_1), and a second NFET may be formed in a second NFET nano-sheet (NFET_NS_2), which may be disposed vertically in a single stack. In addition, a first PFET may be formed in a first PFET nano-sheet (PFET_NS_1), and a second PFET may be formed in a second PFET nano-sheet (PFET_NS_2), which may be disposed vertically in the same single stack along with the two NFET devices. The split-gate architecture 404D may include multiple split-gates (e.g., multiple poly gate lines) coupled to the multiple transistors. In some instances, a first gate (GATE_1) may be coupled to the NFET_NS_1 device, a second gate (GATE_2) may be coupled to the PFET_NS_1 device, a third gate (GATE_3) may be coupled to the PFET_NS_2 device, and a fourth gate (GATE_4) may be coupled to the NFET_NS_2 device. This multi-device stack arrangement provides the NPPN stack configuration as a four-FET stacked device that is manufactured and/or formed in a same single monolithic semiconductor die or in a sequential manner. Also, in some instances, the pair of P-type devices may be disposed between the pair of N-type devices in the multi-transistor stack architecture 404D along with the quad-split-gate structure.

As shown in FIG. 4E, the N-over-N-over-N-over-N (NNNN) dual-common-gate related transistor architecture 404E may include multiple transistors (e.g., 4 NFET devices) that are arranged in a multi-transistor stack configuration. In some instances, a first NFET may be formed in a first NFET nano-sheet (NFET_NS_1), and a second NFET may be formed in a second NFET nano-sheet (NFET_NS_2), which may be disposed vertically in a single stack. Also, in some instances, a third NFET may be formed in a third NFET nano-sheet (NFET_NS_3), and a fourth NFET may be formed in a fourth NFET nano-sheet (NFET_NS_4), which may be disposed vertically in the same single stack with the other NFET devices. The common-gate architecture 404E includes multiple common-gates (e.g., dual poly gate lines) coupled to the multiple transistors. In some instances, a first common-gate (GATE_C1) may be coupled to NFET_NS_1 device and NFET_NS_2 device, and also, a second common-gate (GATE_C2) may be coupled to the NFET_NS_3 device and NFET_NS_4 device. This multi-device stack arrangement provides the NNNN stack configuration as a four-FET stacked device that is manufactured and/or formed in a same single monolithic semiconductor die or in a sequential manner. Further, in some instances, the quad-stack of N-type devices may be vertically disposed in the multi-transistor stack architecture 404E along with the dual-common-gate structure.

As shown in FIG. 4F, the N-over-N-over-N-over-N (NNNN) quad-split-gate related transistor architecture 404F may have multiple transistors (e.g., 4 NFET devices) arranged in a multi-transistor stack configuration. In various instances, a first NFET may be formed in a first NFET nano-sheet (NFET_NS_1), and a second NFET may be formed in a second NFET nano-sheet (NFET_NS_2), which may be disposed vertically in a single stack. Also, a third NFET may be formed in a third NFET nano-sheet (NFET_NS_3), and a fourth NFET may be formed in a fourth NFET nano-sheet (NFET_NS_4), which may be disposed vertically in the same single stack with the other NFET devices. The split-gate architecture 404F may include multiple split-gates (e.g., multiple poly gate lines) coupled to the multiple transistors. In various instances, a first gate (GATE_1) may be coupled to the NFET_NS_1 device, a second gate (GATE_2) may be coupled to the NFET_NS_2 device, a third gate (GATE_3) may be coupled to the NFET_NS_3 device, and a fourth gate (GATE_4) may be coupled to the NFET_NS_4 device. Also, this multi-device stack arrangement provides the NNNN stack configuration as a four-FET stacked device that is manufactured and/or formed in a same single monolithic semiconductor die or in a sequential manner. Further, in some instances, the quad-stack of N-type devices may be vertically disposed in the multi-transistor stack architecture 404F along with the quad-split-gate structure.

As shown in FIG. 4G, the P-over-P-over-P-over-P (PPPP) dual-common-gate related transistor architecture 404G may have multiple transistors (e.g., 4 PFET devices) that are arranged in a multi-transistor stack configuration. In some instances, a first PFET may be formed in a first PFET nano-sheet (PFET_NS_1), and a second PFET may be formed in a second PFET nano-sheet (PFET_NS_2), which may be disposed vertically in a single stack. Also, in various instances, a third PFET may be formed in a third PFET nano-sheet (PFET_NS_3), and a fourth PFET may be formed in a fourth PFET nano-sheet (PFET_NS_4), which may be disposed vertically in the same single stack with the other PFET devices. The common-gate architecture 404G has multiple common-gates (e.g., dual poly gate lines) coupled to the multiple transistors. In various instances, a first common-gate (GATE_C1) may be coupled to PFET_NS_1 device and the PFET_NS_2 device, and also, a second common-gate (GATE_C2) may be coupled to the PFET_NS_3 device and the PFET_NS_4 device. This multi-device stack arrangement may provide the PPPP stack configuration as a four-FET stacked device that is manufactured and/or formed in a same single monolithic semiconductor die or in a sequential manner. Moreover, in some instances, the quad-stack of P-type devices may be vertically disposed together in the multi-transistor stack architecture 404G along with the dual-common-gate structure.

As shown in FIG. 4H, the P-over-P-over-P-over-P (PPPP) quad-split-gate related transistor architecture 404H may have multiple transistors (e.g., 4 PFET devices) arranged in a multi-transistor stack configuration. In various instances, a first PFET may be formed in a first PFET nano-sheet (PFET_NS_1), and a second PFET may be formed in a second PFET nano-sheet (PFET_NS_2), which may be disposed vertically in a single stack. Also, a third PFET may be formed in a third PFET nano-sheet (PFET_NS_3), and a fourth PFET may be formed in a fourth PFET nano-sheet (PFET_NS_4), which may be disposed vertically in the same single stack with the other PFET devices. The split-gate architecture 404H may include multiple split-gates (e.g., multiple poly gate lines) coupled to the multiple transistors. In various instances, a first gate (GATE_1) may be coupled to the PFET_NS_1 device, a second gate (GATE_2) may be coupled to the PFET_NS_2 device, a third gate (GATE_3) may be coupled to the PFET_NS_3 device, and a fourth gate (GATE_4) may be coupled to the PFET_NS_4 device. Also, this multi-device stack arrangement provides the PPPP stack configuration as a four-FET stacked device that is manufactured and/or formed in a same single monolithic semiconductor die or in a sequential manner. Further, in some instances, the quad-stack of P-type devices may be vertically disposed in the multi-transistor stack architecture 404H along with the quad-split-gate structure.

In some implementations, based on the foregoing description provided herein above in reference to FIGS. 4A-4H, the various multi-transistor fabrication schemes and techniques described herein may be utilized to implement various other multi-transistor stack configurations as shown in FIGS. 4I-4P.

For instance, as shown in FIG. 4I, an NNPP common-gate related transistor architecture 404I may provide for multiple transistors (e.g., 2 NFET devices and 2 PFET devices) arranged in a multi-transistor stack configuration. In some instances, the NNPP transistor architecture 404I may refer to a P-over-P-over-N-over-N stack structure. Also, as shown in FIG. 4J, an NNPP split-gate related transistor architecture 404J may have multiple transistors (e.g., 2 NFET devices and 2 PFET devices) arranged in another multi-transistor stack configuration. In some instances, the NNPP transistor architecture 404J may refer to a P-over-P-over-N-over-N stack structure.

As shown in FIG. 4K, a PNPN common-gate related transistor architecture 404K may provide for multiple transistors (e.g., 2 NFET devices and 2 PFET devices) arranged in a multi-transistor stack configuration. In some instances, the PNPN transistor architecture 404K may refer to an N-over-P-over-N-over-P stack structure. Further, as shown in FIG. 4K, a PNPN split-gate related transistor architecture 404L may have multiple transistors (e.g., 2 NFET devices and 2 PFET devices) arranged in another multi-transistor stack configuration. In some instances, the PNPN transistor architecture 404L may refer to an N-over-P-over-N-over-P stack structure.

As shown in FIG. 4M, a PPNN common-gate related transistor architecture 404M may provide for multiple transistors (e.g., 2 NFET devices and 2 PFET devices) arranged in a multi-transistor stack configuration. In some instances, the PPNN transistor architecture 404M may refer to an N-over-N-over-P-over-P stack structure. Further, as shown in FIG. 4N, a PPNN split-gate related transistor architecture 404N may have multiple transistors (e.g., 2 NFET devices and 2 PFET devices) arranged in another multi-transistor stack configuration. In some instances, the PPNN transistor architecture 404N may refer to an N-over-N-over-P-over-P stack structure.

As shown in FIG. 4O, an NPNP common-gate related transistor architecture 404O may provide for multiple transistors (e.g., 2 NFET devices and 2 PFET devices) arranged in a multi-transistor stack configuration. In some instances, the NPNP transistor architecture 404O may refer to a P-over-N-over-P-over-N stack structure. Further, as shown in FIG. 4P, a NPNP split-gate related transistor architecture 404P may have multiple transistors (e.g., 2 NFET devices and 2 PFET devices) arranged in another multi-transistor stack configuration. In some instances, the NPNP transistor architecture 404P may refer to a P-over-N-over-P-over-N stack structure.

The various implementations described herein refer to fabrication schemes and techniques that provide for various multi-transistor stack architectures in various physical layout designs for multi-transistor stack applications. In various instances, FIGS. 3A-3H provide for a two-transistor (e.g., 2T) stack architecture in the same, single vertical stack, and further, FIGS. 4A-4H provide for a four-transistor (e.g., 4T) stack architecture in the same, single vertical stack. Also, the various implementations described herein refer to a method for manufacturing, and/or causing to be manufactured, multiple devices packaged within a single semiconductor die. The multiple devices may have a number (F) of first devices (e.g., F transistors) that are arranged in a first multi-transistor stack with a first P-N configuration, and also, the multiple devices may include a number (S) of second devices (e.g., S transistors) arranged in a second multi-transistor stack with a second P-N configuration that is different than the first P-N configuration.

In some implementations, each of the first multi-transistor stack and the second multi-transistor stack may be arranged in the same, single vertical stack with the common-gate architecture. Also, in other implementations, each of the first multi-transistor stack and the second multi-transistor stack may be arranged in the same, single vertical stack with the split-gate architecture. However, in various implementations, any type of different combinations may be used that seek to combine common-gate multi-transistor structures with split-gate multi-transistor structures. In some instances, a first multi-transistor stack may have a first two-transistor stack, and the second multi-transistor stack may have a second two-transistor stack. The first P-N configuration may refer to at least one of a P-over-N (PN) configuration, an N-over-P (NP) configuration, a P-over-P (PP) configuration, and an N-over-N (NN) configuration. The second P-N configuration may refer to at least one of a P-over-N (PN) configuration, an N-over-P (NP) configuration, a P-over-P (PP) configuration, and an N-over-N (NN) configuration. Also, in some instances, the first devices refer to first field-effect transistor (FET) devices including at least one of an N-type FET (NFET) and a P-type FET (PFET). Also, in some instances, the second devices refer second field-effect transistors (FET) including at least one of an N-type FET (NFET) and a P-type FET (PFET).

Various implementations described herein provide for multi-device stack circuit architecture, such as, e.g., a sense amplifier (SA), in 3D designs. For instance, various devices may be provided that have a multi-transistor structure for use in the circuit architecture. The multi-transistor structure may include a multi-transistor stack of N-type transistors that are arranged in a multi-device stack configuration, and a physical layout of the multi-device stack configuration may provide a common-centroid configuration for process mismatch cancellation in at least one of the X-Y-Z axes. In other instances, various process mismatch cancellation schemes and techniques described herein may be used to for process mismatch cancellation in PMOS transistor applications.

In some implementations, the multi-transistor structure may be formed within a single monolithic semiconductor die or in a sequential manner, and the multi-transistor stack of N-type transistors may be formed within the single monolithic semiconductor die or in a sequential manner, and the circuit architecture may refer to a three-dimensional (3D) circuit architecture. The circuit architecture may be used in at least one of a sense amplifier and a memory architecture. In various scenarios, the multi-device stack configuration may have a two-device stack configuration of N-type transistors arranged in an N-over-N (NN) stack configuration, and the N-type transistors in the NN stack configuration may be a matched pair of N-type transistors. In some other scenarios, the multi-device stack configuration may have a four-device stack configuration of N-type transistors arranged in an N-over-N-over-N-over-N (NNNN) stack configuration, and also, at least two of the N-type transistors in the NNNN stack configuration may be a matched pair of N-type transistors. Moreover, in various instances, the N-type transistors may be N-type field-effect transistors (NFETs).

Figure 5A:
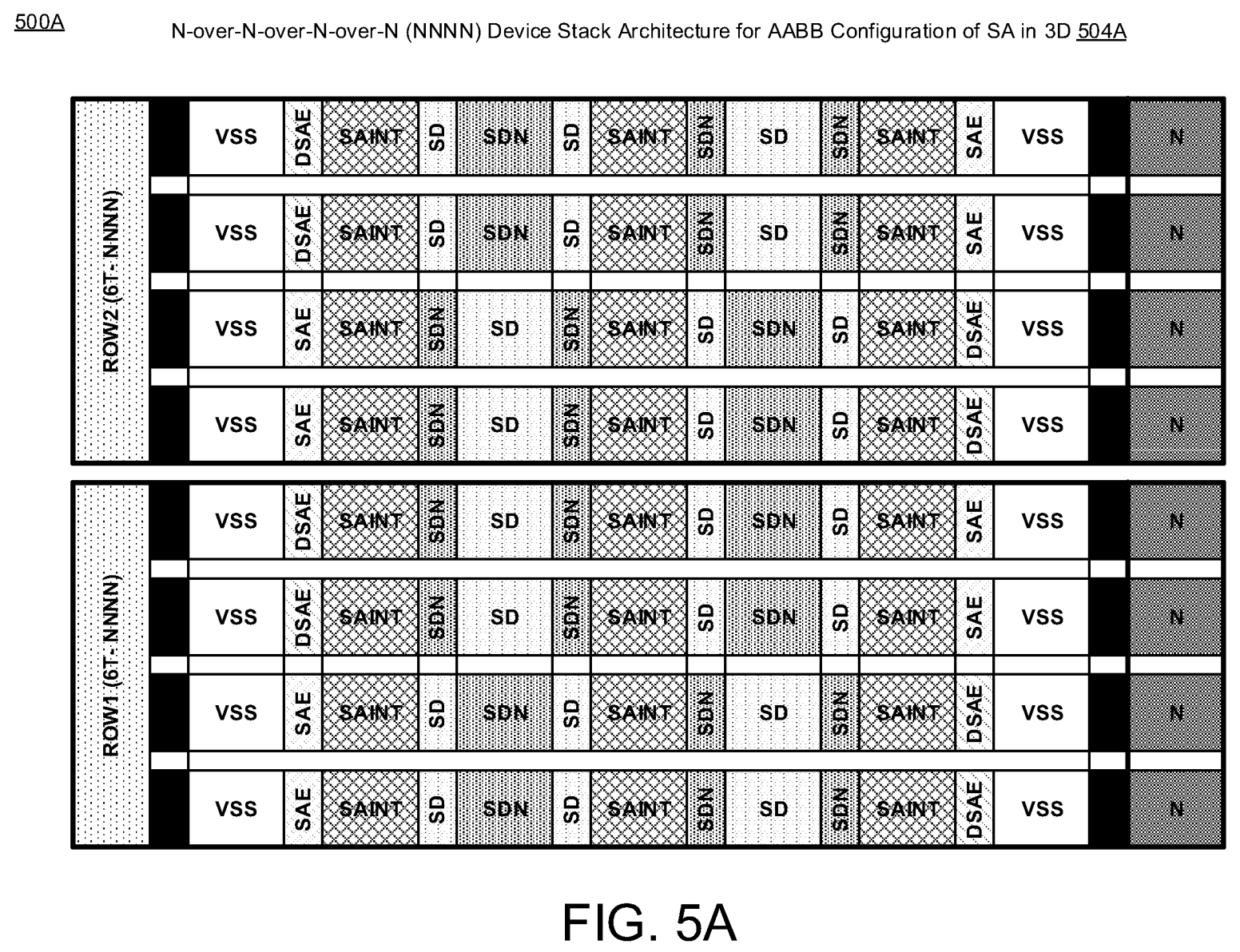
Figure 5B:
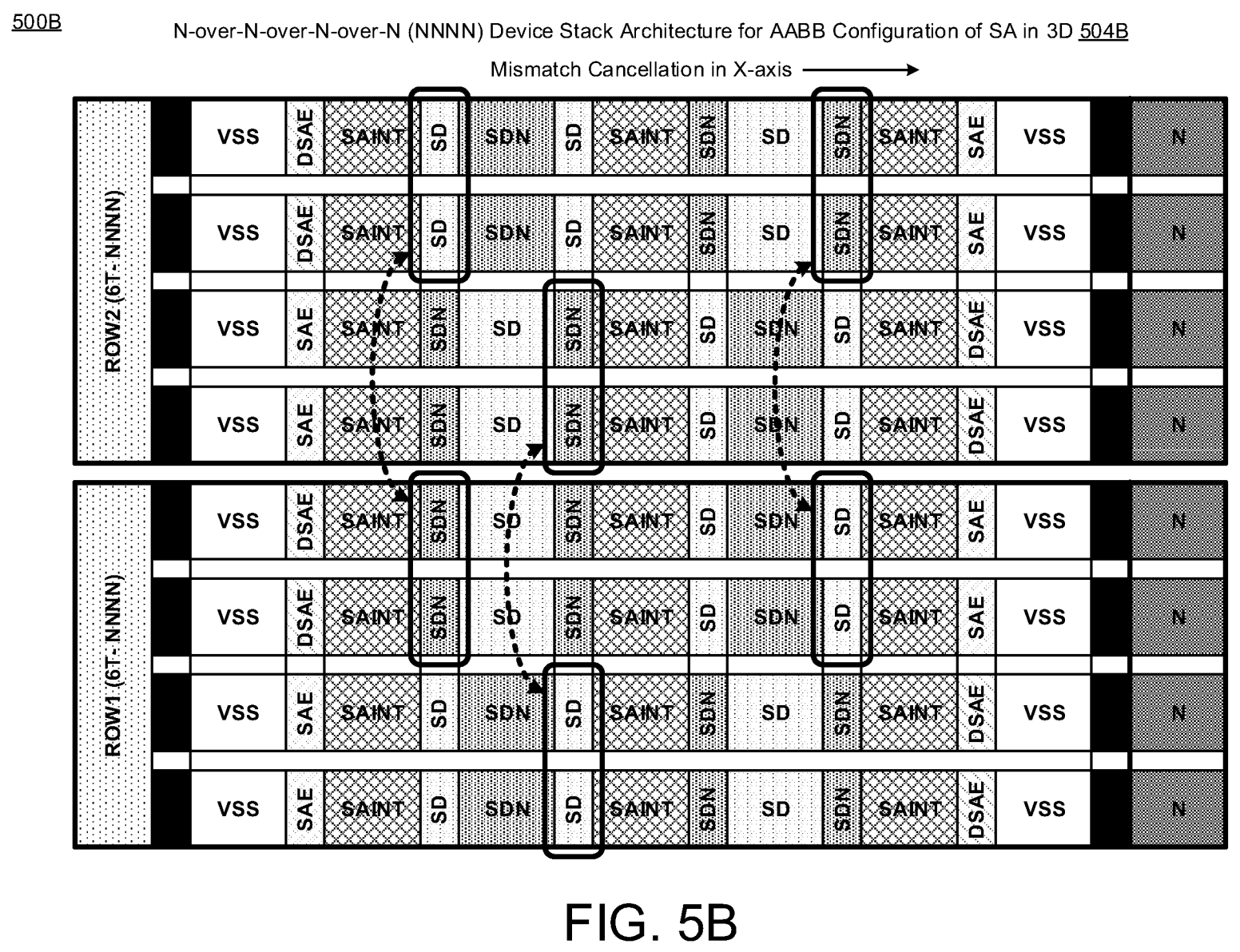
Figure 5C:
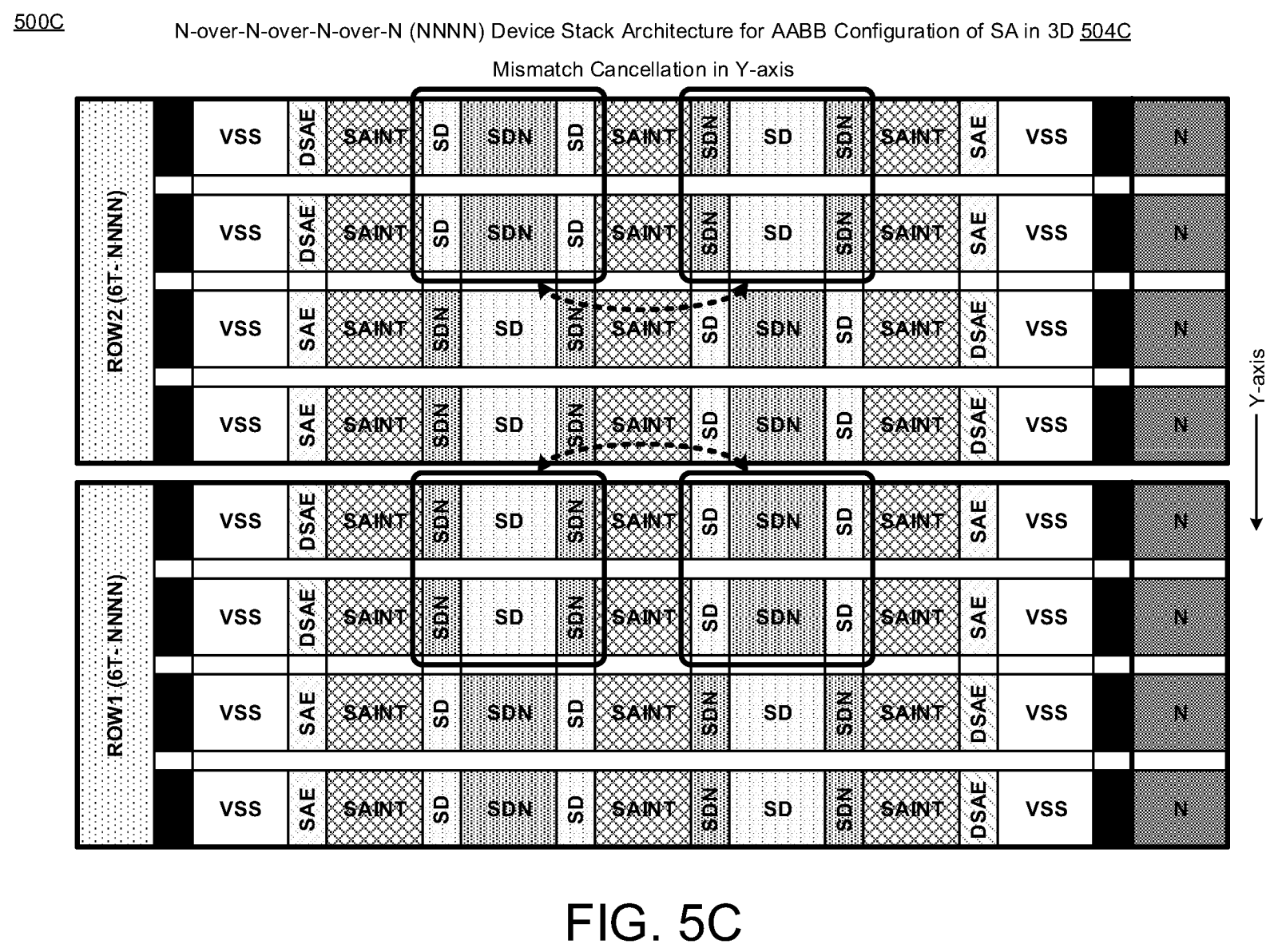
Figure 5D:
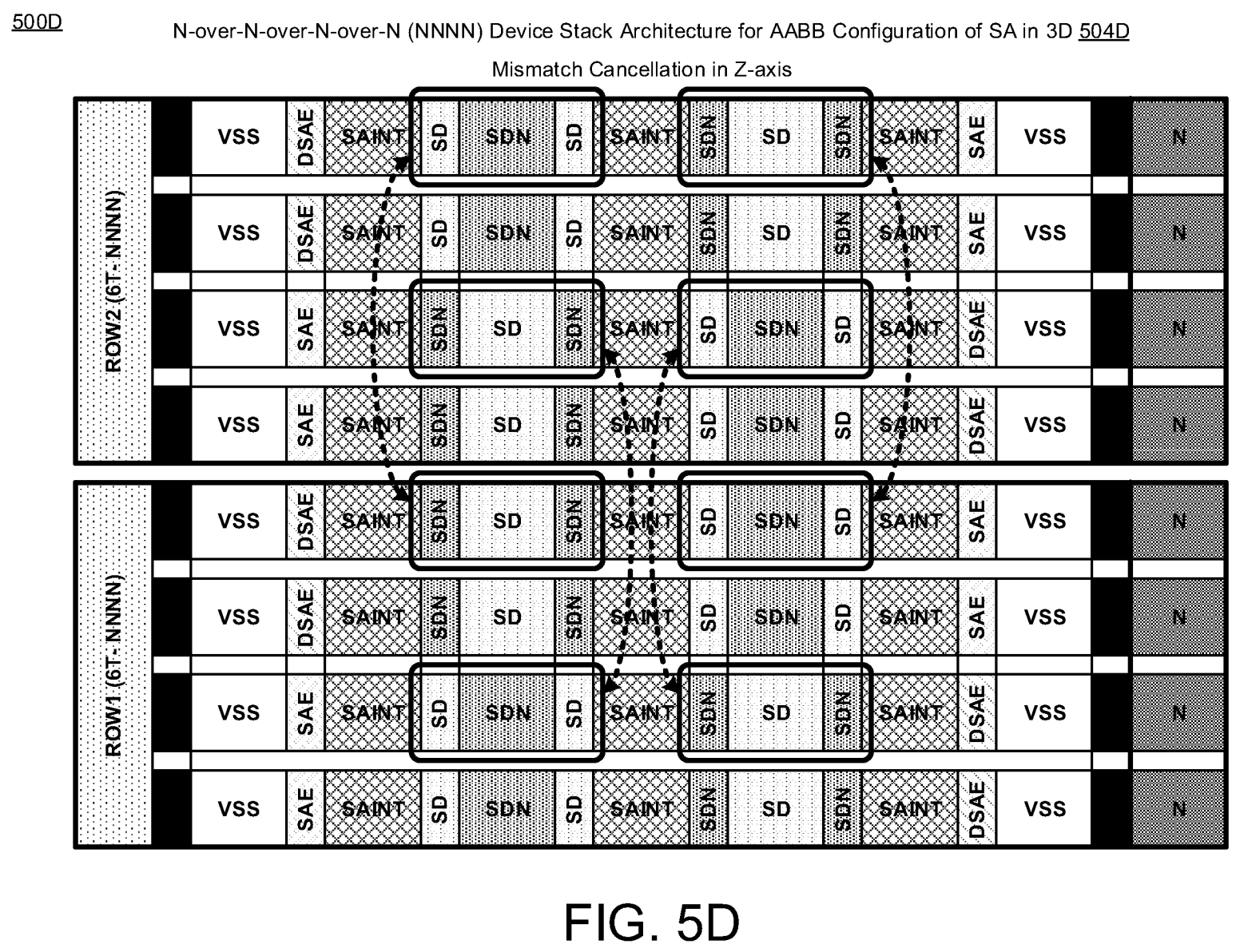

FIGS. 5A-5D illustrate various diagrams of a physical layout for multi-device stack configuration that provides a common-centroid configuration for process mismatch cancellation in at least one of X-Y-Z axes in accordance with implementations described herein. In particular, FIG. 5A shows a diagram 500A of a physical layout for multi-device stack configuration 504A with NNNN stack architecture that provides a common-centroid configuration for process mismatch cancellation in at least one of X-Y-Z axes. In addition, FIG. 5B shows a diagram 500B of a physical layout for multi-device stack configuration 504B that provides a common-centroid configuration for process mismatch cancellation in the direction of the X-axis, FIG. 5C shows a diagram 500C of a physical layout for multi-device stack configuration 504C that provides a common-centroid configuration for process mismatch cancellation in the direction of the Y-axis, and FIG. 5D shows a diagram 500D of a physical layout for multi-device stack configuration 504D that provides a common-centroid configuration for process mismatch cancellation in the direction of the Z-axis.

As shown in FIG. 5A, the multi-device stack configuration 504A has an NNNN device stack architecture that provides for an AABB configuration of sense amplifier (SA) architecture in three-dimensions (3D), such as X-Y-Z axes. In some implementations, the physical layout of the multi-device stack configuration 504A may be used for applications that involve sense amplifier (SA) implementations in reference to 3D processes for mismatch cancellation in X-Y-Z axes. Therefore, the physical layout of the multi-device stack configuration 504A may be used in applications for N-based differential amplifiers, P-based differential amplifiers and current mirrors and/or similar circuit architecture.

In some implementations, the sense amplifier (SA) architecture 204 in FIG. 2 may be applied to sense amplifiers (SA) for SRAM instances, wherein the sense amplifier (SA) is configured to sense small difference in BL-NBL voltage (e.g., at nodes SD, SDN) for use in reading correct data from bitcells coupled to bitlines (BL, BLB). Also, in some scenarios, process mismatches between pull-down NMOS devices (N1, N2) in FIG. 2 may be used to bias the sense amplifier 204 toward either read-0 or read-1, wherein these two devices (N1, N2) should be a matched pair or at least exactly matched. Thus, various implementations described herein refer to layout implementations that match devices for process mismatch cancelation in X-Y-Z axes (i.e., cross-sectional X-Y-Z axes) for various 3D multi-device stacked architectures.

In reference to FIG. 2, the SA-PRECH PMOS devices (P1, P2, P3) and the pull-up PMOS devices (P4, P5) are configured to assist the pull-down NMOS devices (N1, N2) that are created with common centroid to tackle mismatches. Moreover, in reference to FIG. 5A, the physical layout of the NNNN device stack 504A is arranged vertically in multiple stacked rows (e.g., ROW1, ROW2). Also, the signals (VSS, SAE, DSAE, SAINT, SD, SDN) refer to similar signals as shown in FIG. 2 for the sense amplifier architecture 204 having the AABB configuration in 3D.

In various implementations, as described herein, the sense amplifier (SA) may be configured to sense small differences in BL-NBL voltage (e.g., at nodes SD, SDN) for use in reading correct data from bitcells that are coupled to bitlines (BL, BLB). Therefore, in various scenarios, FIGS. 5B-5D show the common-centroid configuration for process mismatch cancellation in the X-Y-Z axes, respectively.

FIG. 5B shows the mismatch cancellation along the X-axis in reference to the SD/SDN signals for the NNNN device stack configuration 504B, wherein the matched pair of NMOS devices (N1, N2) in FIG. 2 provide for the common-centroid configuration for process mismatch cancellation in the direction of the X-axis. The dotted arrows in the FIG. 5B specifies the set of devices that enables process mismatch cancellation in the direction of the X-axis.

FIG. 5C shows the mismatch cancellation along the Y-axis in reference to the SD/SDN signals for the NNNN device stack configuration 504C, wherein the matched pair of NMOS devices (N1, N2) in FIG. 2 provide for the common-centroid configuration for process mismatch cancellation in the direction of the Y-axis. The dotted arrows in the FIG. 5C specifies the set of devices that enables process mismatch cancellation in the direction of the Y-axis.

FIG. 5D shows the mismatch cancellation along the Z-axis in reference to the SD/SDN signals for the NNNN device stack configuration 504D, wherein the matched pair of NMOS devices (N1, N2) in FIG. 2 provide for the common-centroid configuration for process mismatch cancellation in the direction of the Z-axis. The dotted arrows in the FIG. 5D specifies the set of devices that enables process mismatch cancellation in the direction of the Z-axis.

In various other scenarios, similar implementations for NPNP device stack configurations or PNPN device stack configurations or NPPN device stack configurations may also be possible when N-type device placement is moved to corresponding N device stack configurations for NPNP/PNPN/NPPN architectures.

As described in reference to process mismatches, various multiple operations during CMOS device fabrication processes, including, e.g., doping, photo-resist and mask alignment and/or thickness, etching, strain engineering, etc., may cause gradual changes in electrical properties along dimensional boundaries, attributes and/or characteristics, e.g., width, length, depth, threshold voltage, mobility, etc. These gradual changes may occur in any direction (e.g., X-Y-Z axes) across a wafer. For instance, in various 3D processes, these gradual changes may be across at least one of width (X-axis direction), height (Y-axis direction) and depth (Z-axis direction) of the wafer. In addition, these gradual changes in process parameters may be referred to as "process mismatches". For some matched device pairs, such as, e.g., in differential amplifiers, the process mismatches induce a systematic offset in the amplifier so as to adversely impact performance and/or power. Thus, various physical layout techniques provided herein seek to cancel any adverse impact of process mismatches on matched device pairs in the X-Y-Z axes directions.

Figure 6:
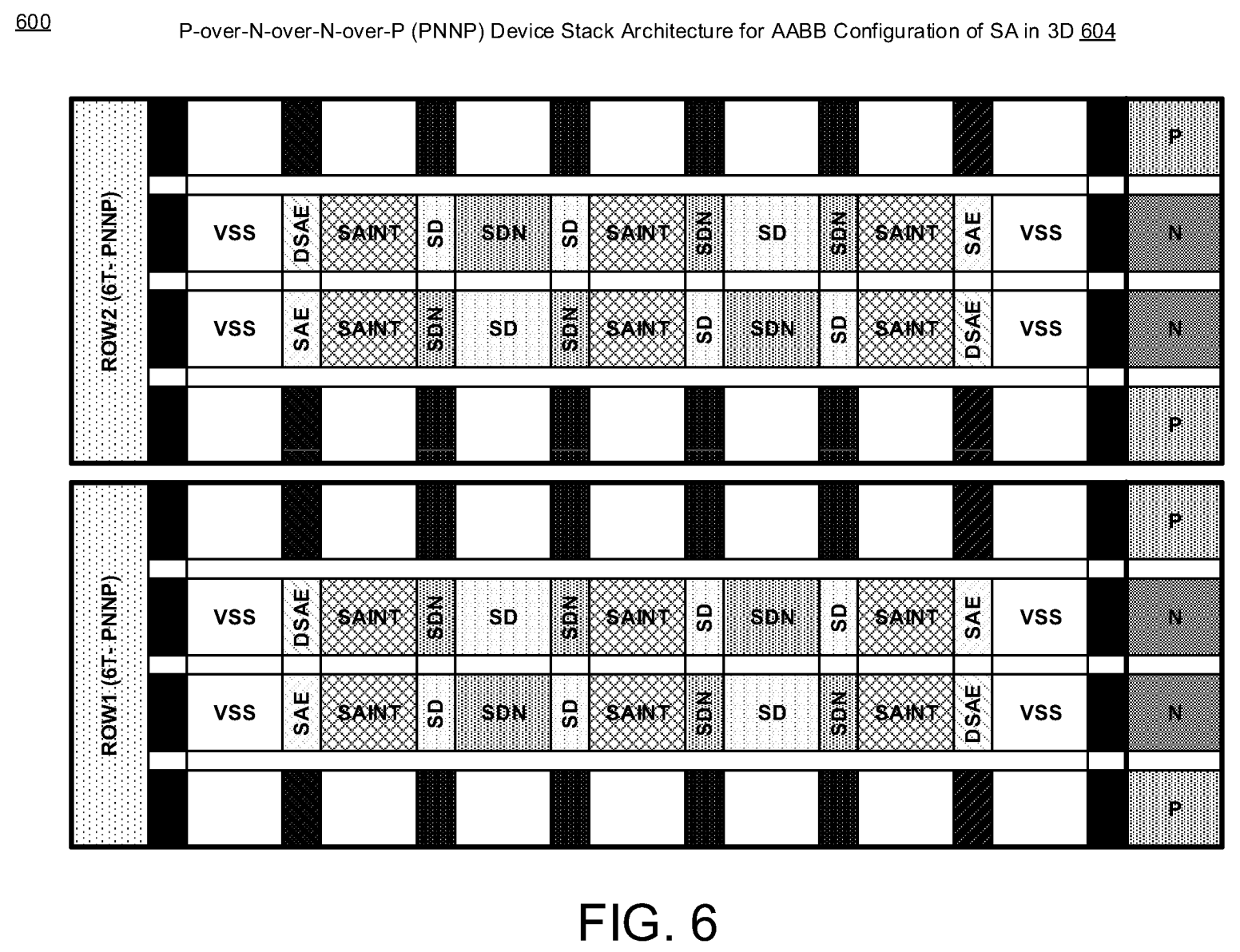

FIG. 6 illustrates a diagram 600 of a physical layout for multi-device stack configuration 604 that provides a common-centroid configuration for process mismatch cancellation in X-Y-Z axes in accordance with implementations described herein.

As shown in FIG. 6, the multi-device stack configuration 604 has a PNNP device stack architecture that provides for an AABB configuration of sense amplifier (SA) architecture in three-dimensions (3D), such as X-Y-Z axes. In some implementations, the physical layout of the multi-device stack configuration 604 may be used for applications that involve sense amplifier (SA) implementations in reference to 3D processes for mismatch cancellation in X-Y-Z axes. Therefore, the physical layout of the multi-device stack configuration 604 may be used in applications for N-based differential amplifiers, P-based differential amplifiers and current mirrors and/or similar circuit architecture.

In some implementations, the sense amplifier (SA) architecture 204 in FIG. 2 may be applied to sense amplifiers (SA) for SRAM instances, wherein the sense amplifier (SA) is configured to sense small difference in BL-NBL voltage (e.g., at nodes SD, SDN) for use in reading correct data from bitcells coupled to bitlines (BL, BLB).

Also, in some scenarios, process mismatches between pull-down NMOS devices (N1, N2) in FIG. 2 may be used to bias the sense amplifier 204 toward either read-0 or read-1, wherein these two devices (N1, N2) should be a matched pair or at least exactly matched. Thus, various implementations described herein refer to layout implementations that match devices for process mismatch cancelation in X-Y-Z axes (i.e., cross-sectional X-Y-Z axes) for various 3D multi-device stacked architectures.

Figure 7A:
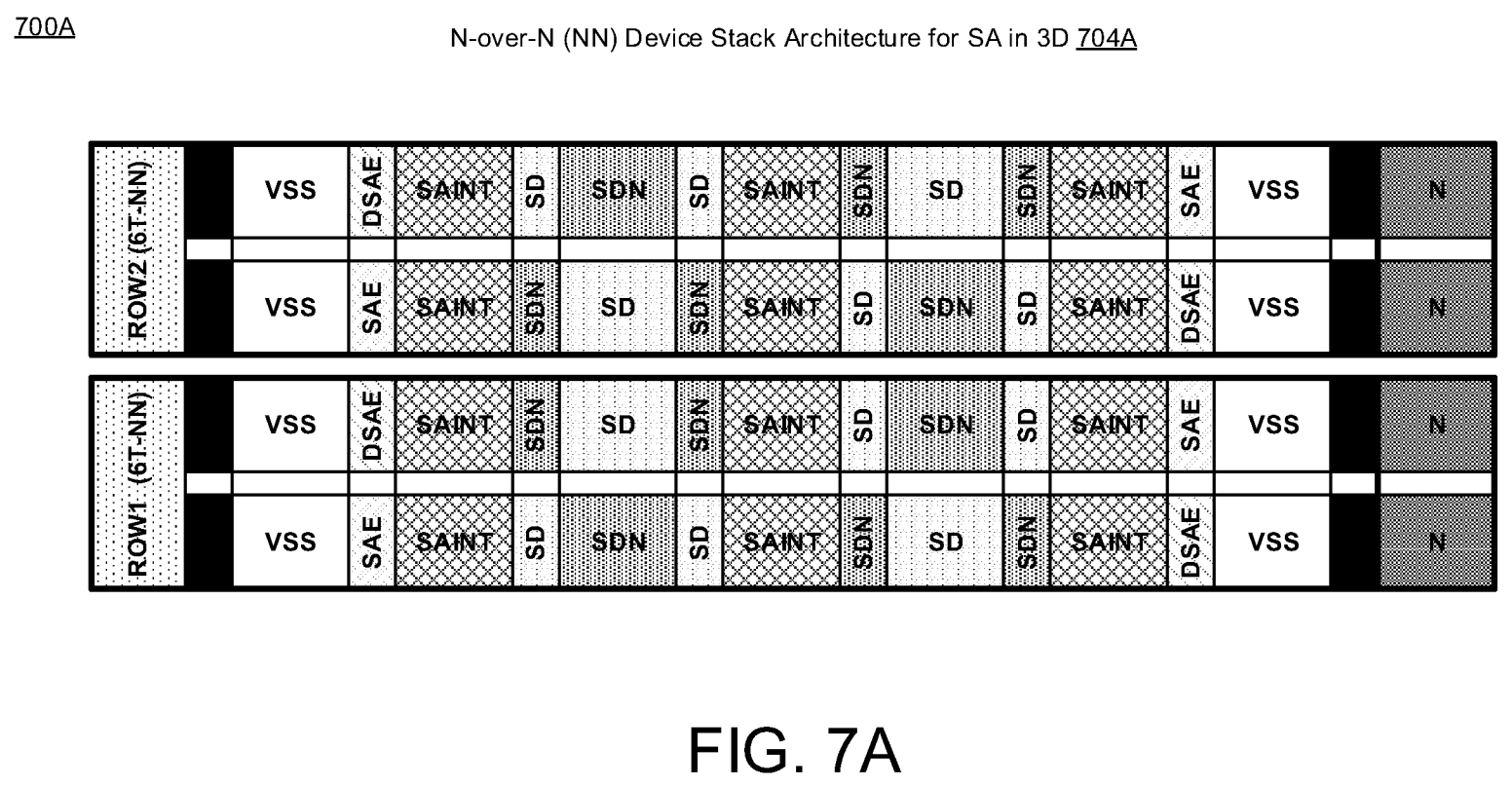
Figure 7B:
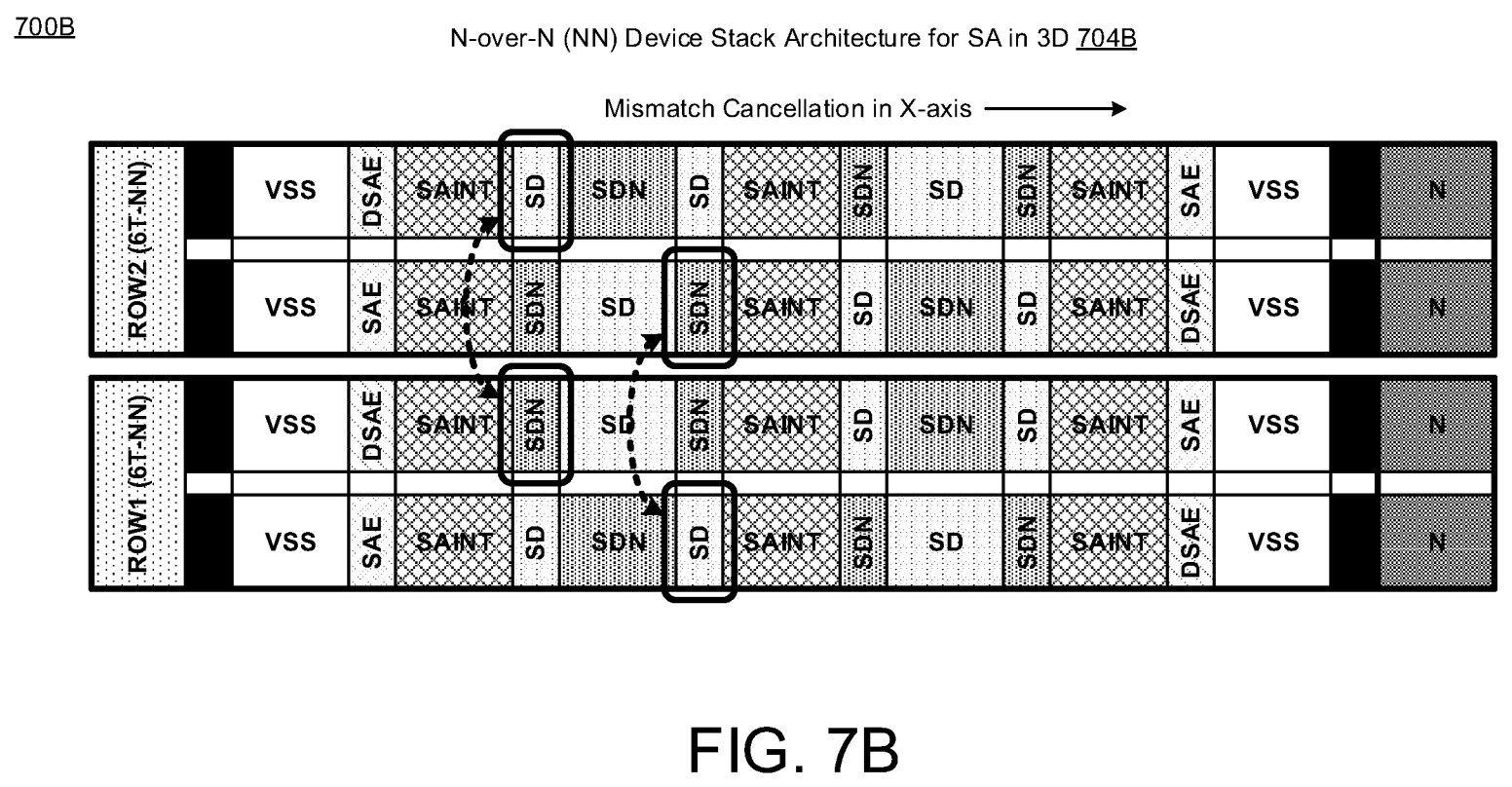
Figure 7C:
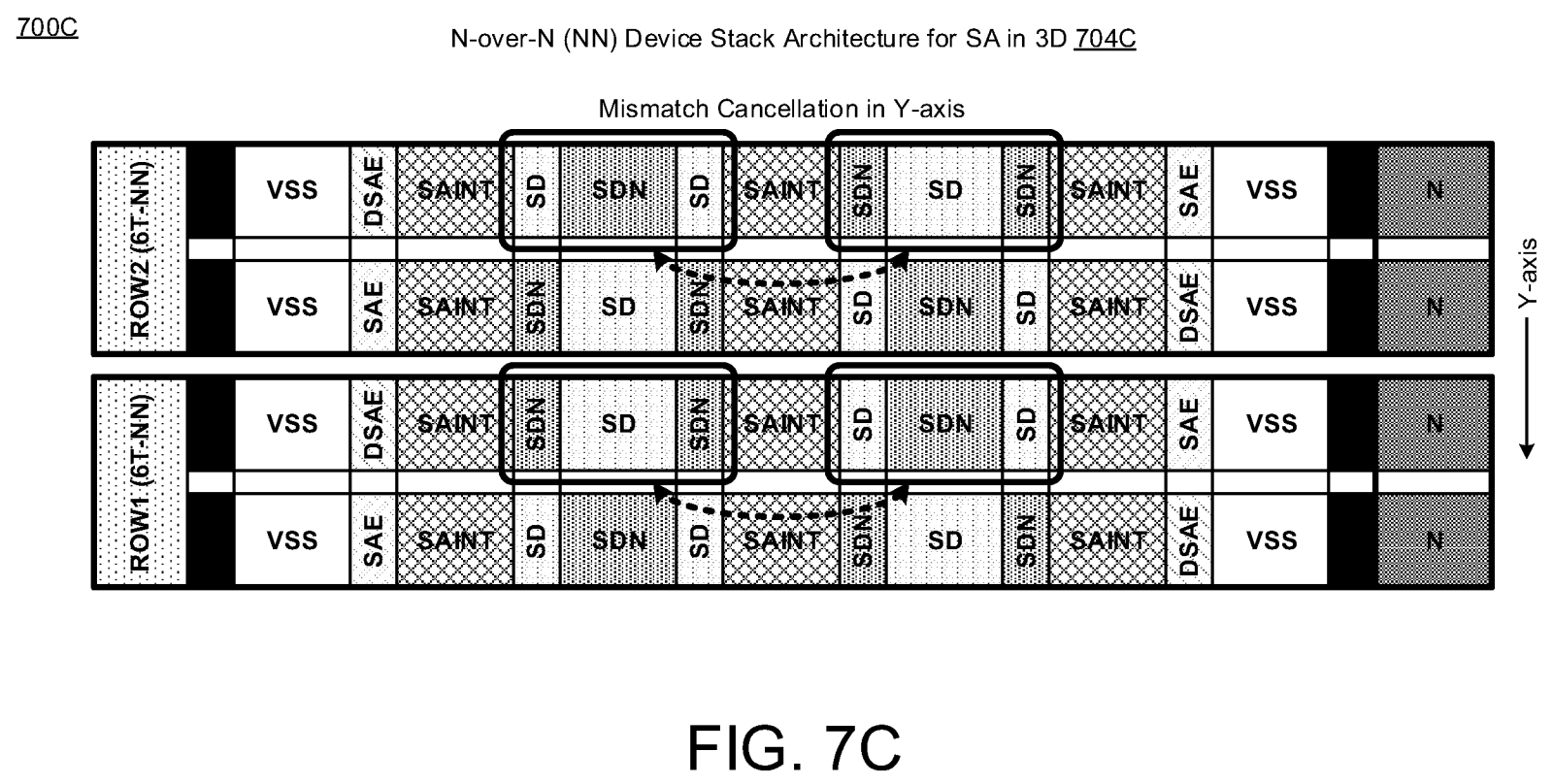
Figure 7D:
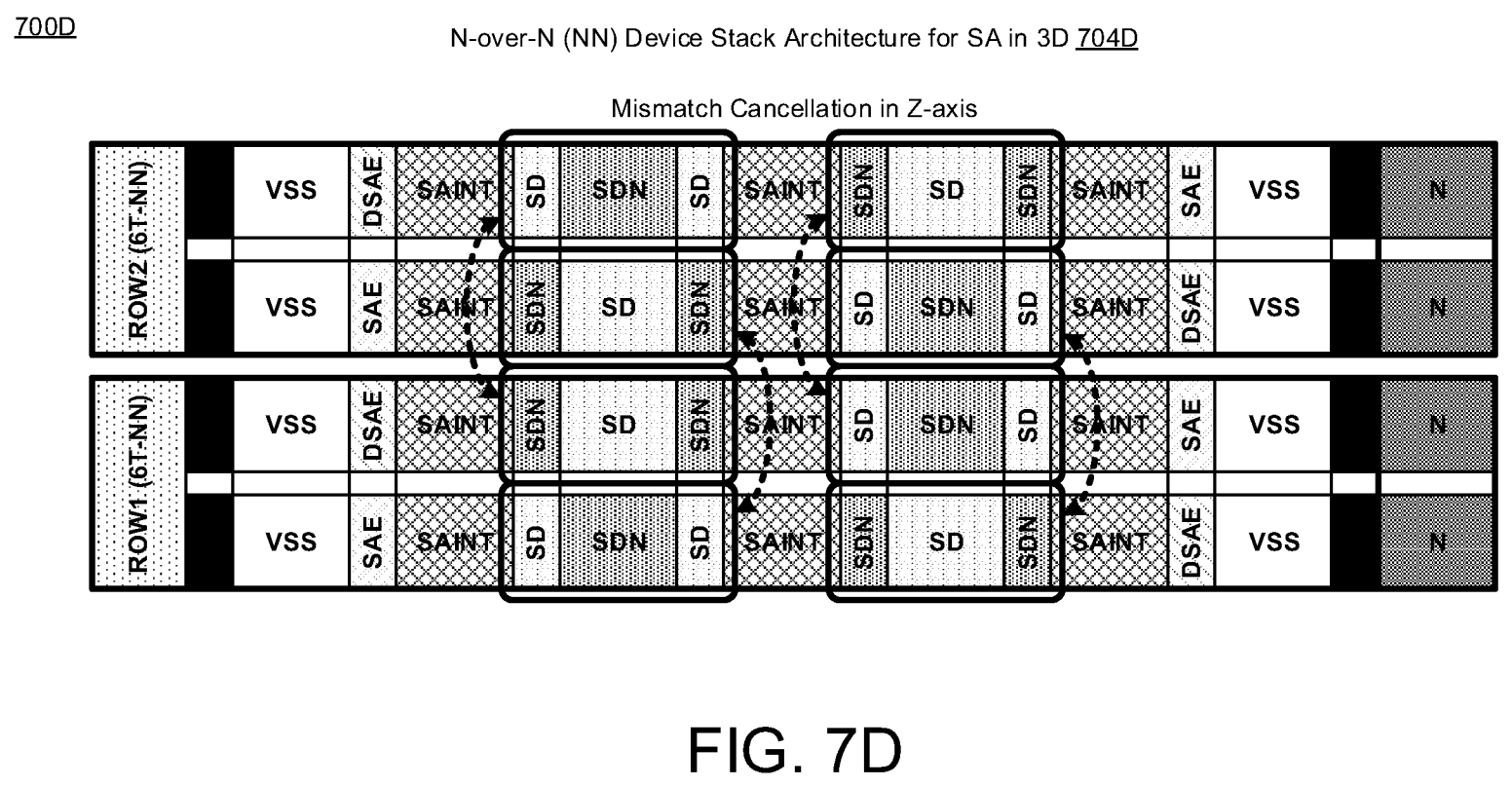

FIGS. 7A-7D illustrate various diagrams of a physical layout for multi-device stack configuration that provides a common-centroid configuration for process mismatch cancellation in at least one of X-Y-Z axes in accordance with implementations described herein. In particular, FIG. 7A shows a diagram 700A of a physical layout for multi-device stack configuration 704A with NN stack architecture that provides for a common-centroid configuration for process mismatch cancellation in at least one of X-Y-Z axes. In addition, FIG. 7B shows a diagram 700B of a physical layout for multi-device stack configuration 704B that provides a common-centroid configuration for process mismatch cancellation in the direction of the X-axis, FIG. 7C shows a diagram 700C of a physical layout for multi-device stack configuration 704C that provides a common-centroid configuration for process mismatch cancellation in the direction of the Y-axis, and FIG. 7D shows a diagram 700D of a physical layout for multi-device stack configuration 704D that provides a common-centroid configuration for process mismatch cancellation in the direction of the Z-axis.

As shown in FIG. 7A, the multi-device stack configuration 704A has an NN device stack architecture of sense amplifier (SA) architecture in three-dimensions (3D), such as X-Y-Z axes. In some implementations, the physical layout of the multi-device stack configuration 704A may be used for applications that involve sense amplifier (SA) implementations in reference to 3D processes for mismatch cancellation in X-Y-Z axes. Therefore, the physical layout of the multi-device stack configuration 704A may be used in applications for N-based differential amplifiers, P-based differential amplifiers and current mirrors and/or similar circuit architecture.

In some implementations, the sense amplifier (SA) architecture 204 in FIG. 2 may be applied to sense amplifiers (SA) for SRAM instances, wherein the sense amplifier (SA) is configured to sense small difference in BL-NBL voltage (e.g., at nodes SD, SDN) for use in reading correct data from bitcells coupled to bitlines (BL, BLB). Also, in some scenarios, process mismatches between pull-down NMOS devices (N1, N2) in FIG. 2 may be used to bias the sense amplifier 204 toward either read-0 or read-1, wherein these two devices (N1, N2) should be a matched pair or at least exactly matched. Thus, various implementations described herein refer to layout implementations that match devices for process mismatch cancelation in X-Y-Z axes (i.e., cross-sectional X-Y-Z axes) for various 3D multi-device stacked architectures.

In reference to FIG. 2, the SA-PRECH PMOS devices (P1, P2, P3) and the pull-up PMOS devices (P4, P5) are configured to assist the pull-down NMOS devices (N1, N2) that are created with common centroid to tackle mismatches. Moreover, in reference to FIG. 7A, the physical layout of the NN device stack 704A is arranged vertically in multiple stacked rows (e.g., ROW1, ROW2). Also, the signals (VSS, SAE, DSAE, SAINT, SD, SDN) refer to similar signals as shown in FIG. 2 for the sense amplifier architecture 204 having the AABB configuration in 3D.

In various implementations, as described herein, the sense amplifier (SA) may be configured to sense small differences in BL-NBL voltage (e.g., at nodes SD, SDN) for use in reading correct data from bitcells that are coupled to bitlines (BL, BLB). Therefore, in various scenarios, FIGS. 7B-7D show the common-centroid configuration for process mismatch cancellation in the X-Y-Z axes, respectively.

FIG. 7B shows the mismatch cancellation along the X-axis in reference to the SD/SDN signals for the NN device stack configuration 704B, wherein the matched pair of NMOS devices (N1, N2) in FIG. 2 provide for the common-centroid configuration for process mismatch cancellation in the direction of the X-axis.

FIG. 7C shows the mismatch cancellation along the Y-axis in reference to the SD/SDN signals for the NN device stack configuration 704C, wherein the matched pair of NMOS devices (N1, N2) in FIG. 2 provide for the common-centroid configuration for process mismatch cancellation in the direction of the Y-axis.

FIG. 7D shows the mismatch cancellation along the Z-axis in reference to the SD/SDN signals for the NN device stack configuration 704D, wherein the matched pair of NMOS devices (N1, N2) in FIG. 2 provide for the common-centroid configuration for process mismatch cancellation in the direction of the Z-axis.

Figure 8A:
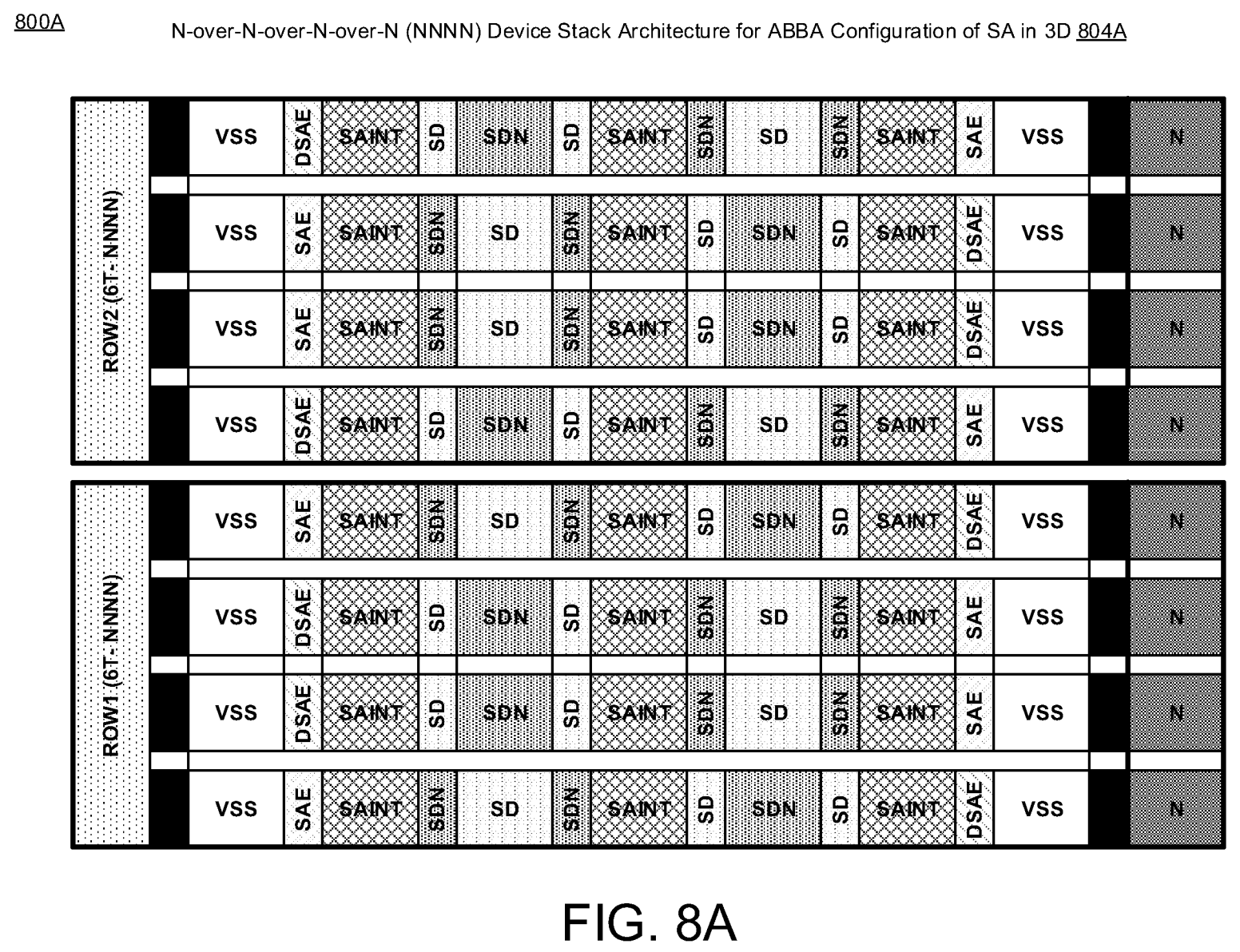
Figure 8B:
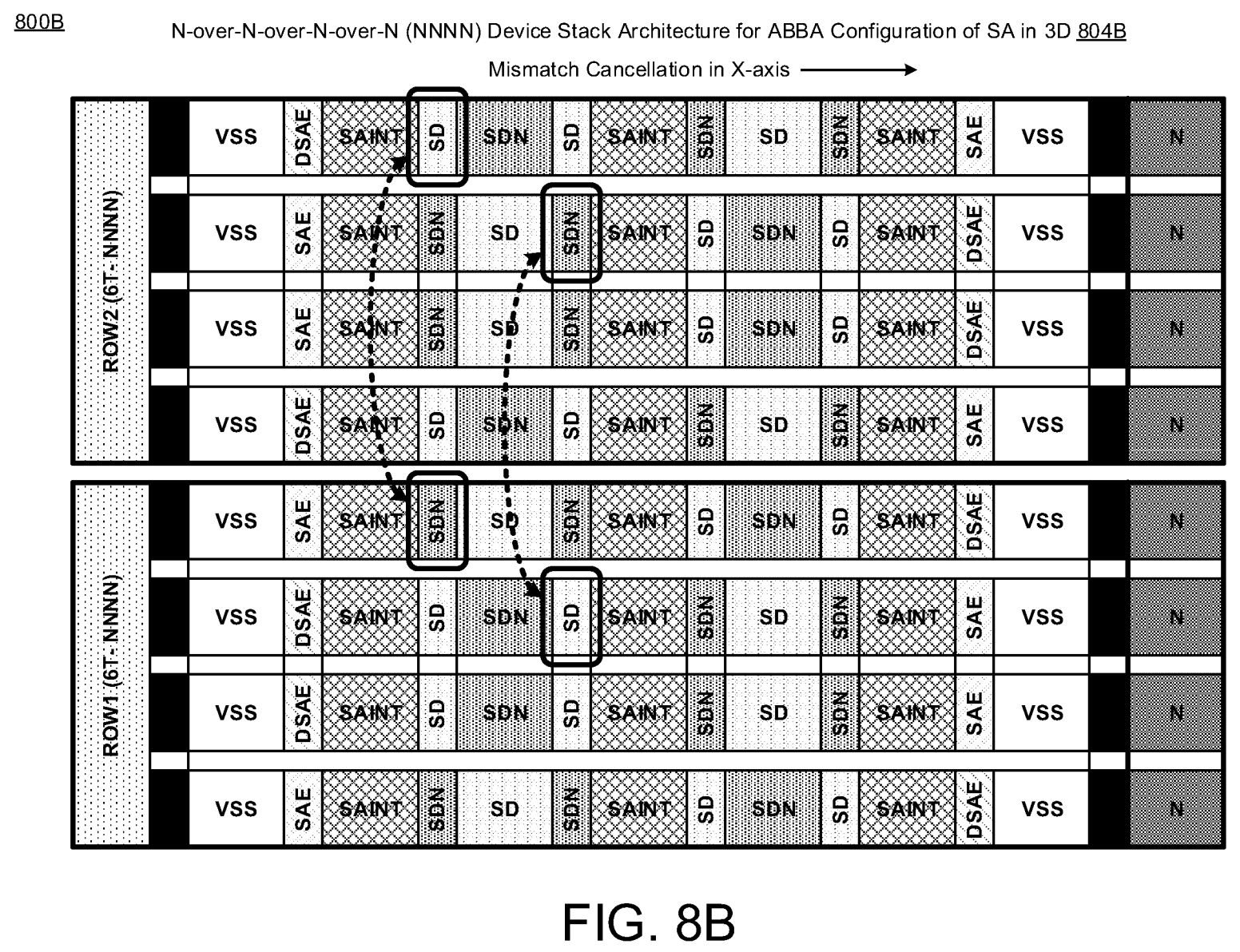
Figure 8C:
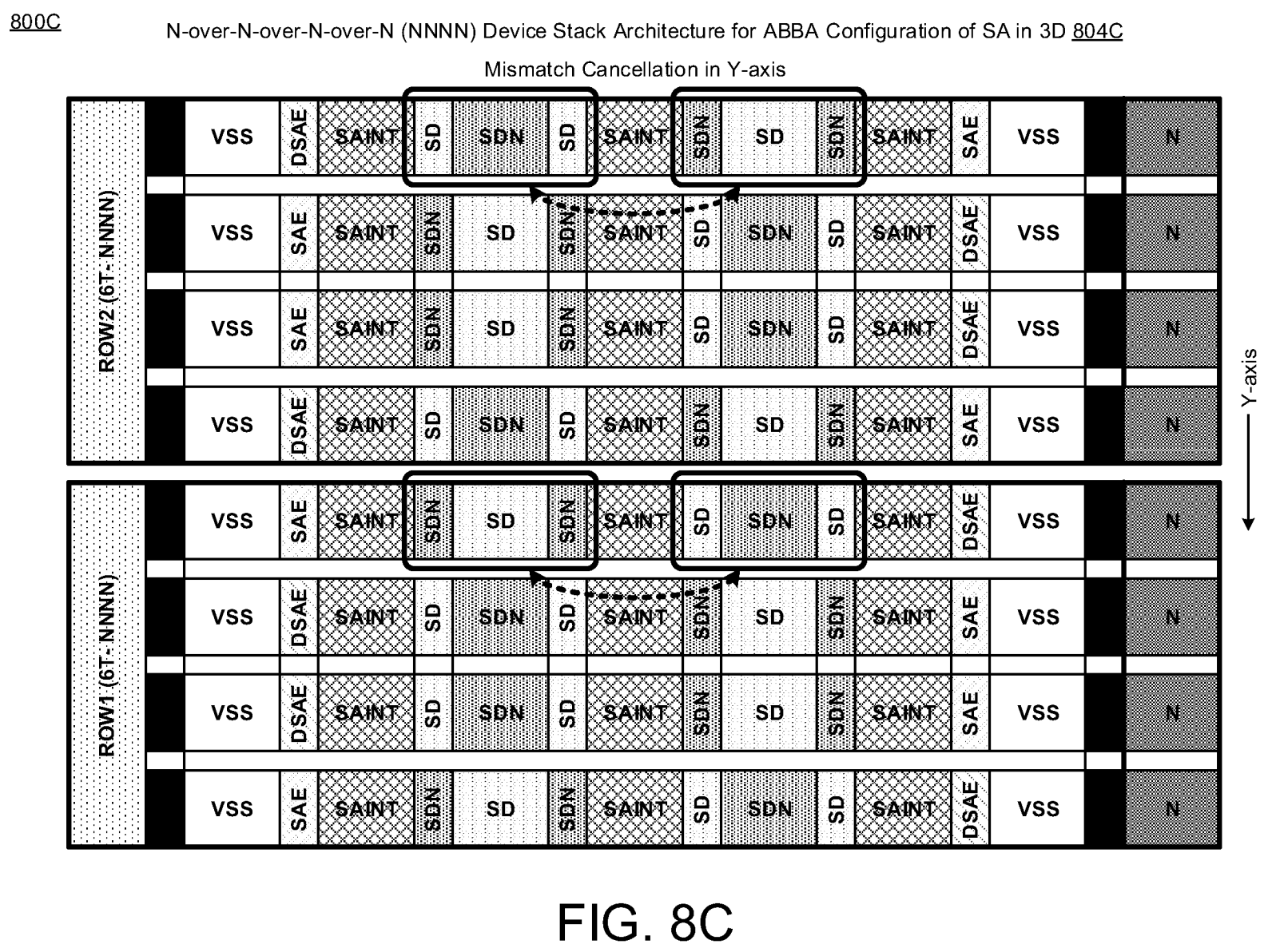
Figure 8D:
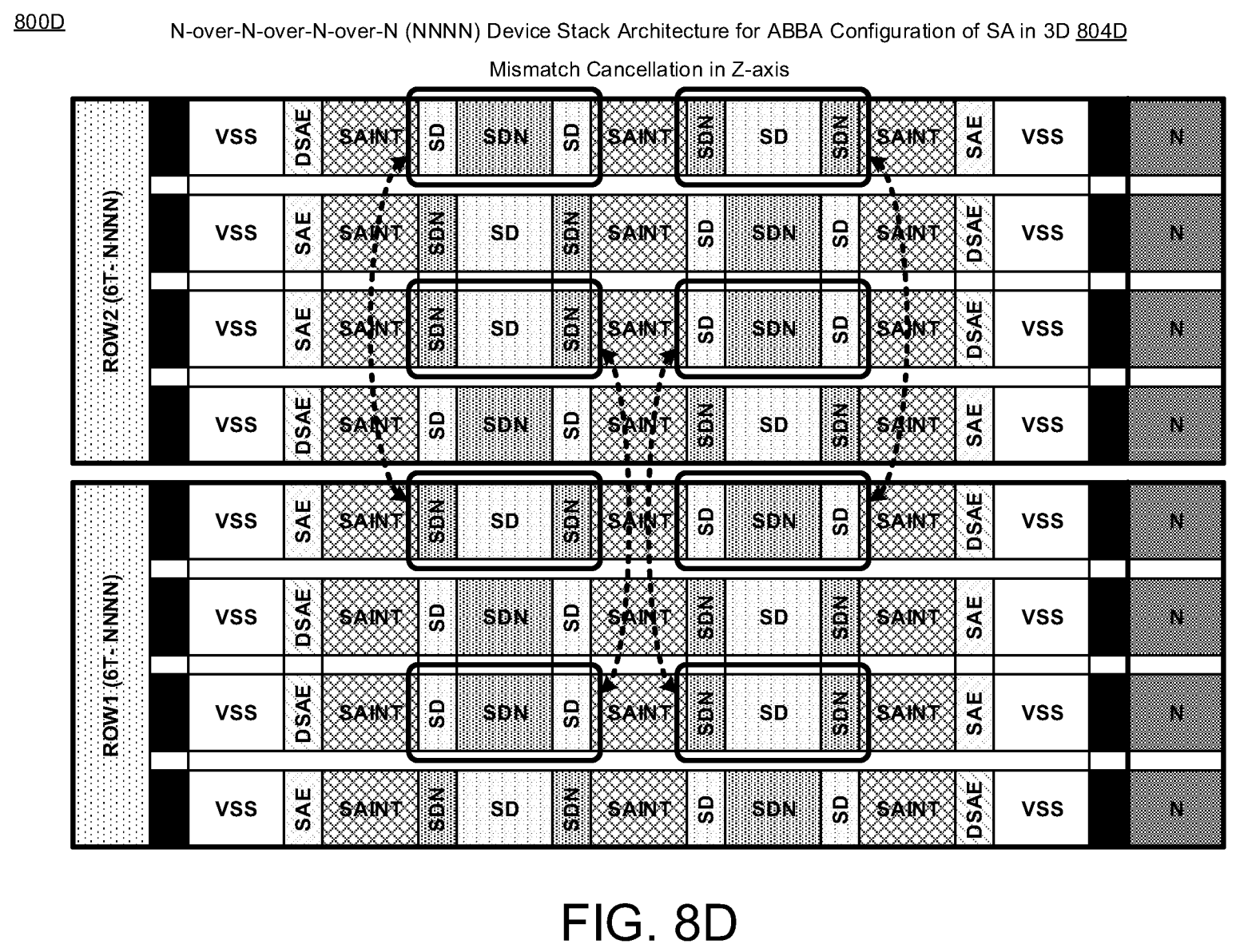

FIGS. 8A-8D illustrate various diagrams of a physical layout for multi-device stack configuration that provides a common-centroid configuration for process mismatch cancellation in at least one of X-Y-Z axes in accordance with implementations described herein. In particular, FIG. 8A shows a diagram 800A of a physical layout for multi-device stack configuration 804A with NNNN stack architecture that provides a common-centroid configuration for process mismatch cancellation in at least one of X-Y-Z axes. In addition, FIG. 8B shows a diagram 800B of a physical layout for multi-device stack configuration 804B that provides a common-centroid configuration for process mismatch cancellation in the direction of the X-axis, FIG. 8C shows a diagram 800C of a physical layout for multi-device stack configuration 804C that provides a common-centroid configuration for process mismatch cancellation in the direction of the Y-axis, and FIG. 8D shows a diagram 800D of a physical layout for multi-device stack configuration 804D that provides a common-centroid configuration for process mismatch cancellation in the direction of the Z-axis.

As shown in FIG. 8A, the multi-device stack configuration 804A has an NNNN device stack architecture that provides for an ABBA configuration of sense amplifier (SA) architecture in three-dimensions (3D), such as X-Y-Z axes. In some implementations, the physical layout of the multi-device stack configuration 804A may be used for applications that involve sense amplifier (SA) implementations in reference to 3D processes for mismatch cancellation in X-Y-Z axes. Therefore, the physical layout of the multi-device stack configuration 804A may be used in applications for N-based differential amplifiers, P-based differential amplifiers and current mirrors and/or similar circuit architecture.

In some implementations, the sense amplifier (SA) architecture 204 in FIG. 2 may be applied to sense amplifiers (SA) for SRAM instances, wherein the sense amplifier (SA) is configured to sense small difference in BL-NBL voltage (e.g., at nodes SD, SDN) for use in reading correct data from bitcells coupled to bitlines (BL, BLB). Also, in some scenarios, process mismatches between pull-down NMOS devices (N1, N2) in FIG. 2 may be used to bias the sense amplifier 204 toward either read-0 or read-1, wherein these two devices (N1, N2) should be a matched pair or at least exactly matched. Thus, various implementations described herein refer to layout implementations that match devices for process mismatch cancelation in X-Y-Z axes (i.e., cross-sectional X-Y-Z axes) for various 3D multi-device stacked architectures.

In reference to FIG. 2, the SA-PRECH PMOS devices (P1, P2, P3) and the pull-up PMOS devices (P4, P5) are configured to assist the pull-down NMOS devices (N1, N2) that are created with common centroid to tackle mismatches. Moreover, in reference to FIG. 8A, the physical layout of the NNNN device stack 804A is arranged vertically in multiple stacked rows (e.g., ROW1, ROW2). Also, the signals (VSS, SAE, DSAE, SAINT, SD, SDN) refer to similar signals as shown in FIG. 2 for the sense amplifier architecture 204 having the ABBA configuration in 3D.

In various implementations, as described herein, the sense amplifier (SA) may be configured to sense small differences in BL-NBL voltage (e.g., at nodes SD, SDN) for use in reading correct data from bitcells that are coupled to bitlines (BL, BLB). Therefore, in various scenarios, FIGS. 8B-8D show the common-centroid configuration for process mismatch cancellation in the X-Y-Z axes, respectively.

FIG. 8B shows the mismatch cancellation along the X-axis in reference to the SD/SDN signals for the NNNN device stack configuration 804B, wherein the matched pair of NMOS devices (N1, N2) in FIG. 2 provide for the common-centroid configuration for process mismatch cancellation in the direction of the X-axis.

FIG. 8C shows the mismatch cancellation along the Y-axis in reference to the SD/SDN signals for the NNNN device stack configuration 804C, wherein the matched pair of NMOS devices (N1, N2) in FIG. 2 provide for the common-centroid configuration for process mismatch cancellation in the direction of the Y-axis.

FIG. 8D shows the mismatch cancellation along the Z-axis in reference to the SD/SDN signals for the NNNN device stack configuration 804D, wherein the matched pair of NMOS devices (N1, N2) in FIG. 2 provide for the common-centroid configuration for process mismatch cancellation in the direction of the Z-axis.

Figure 9:
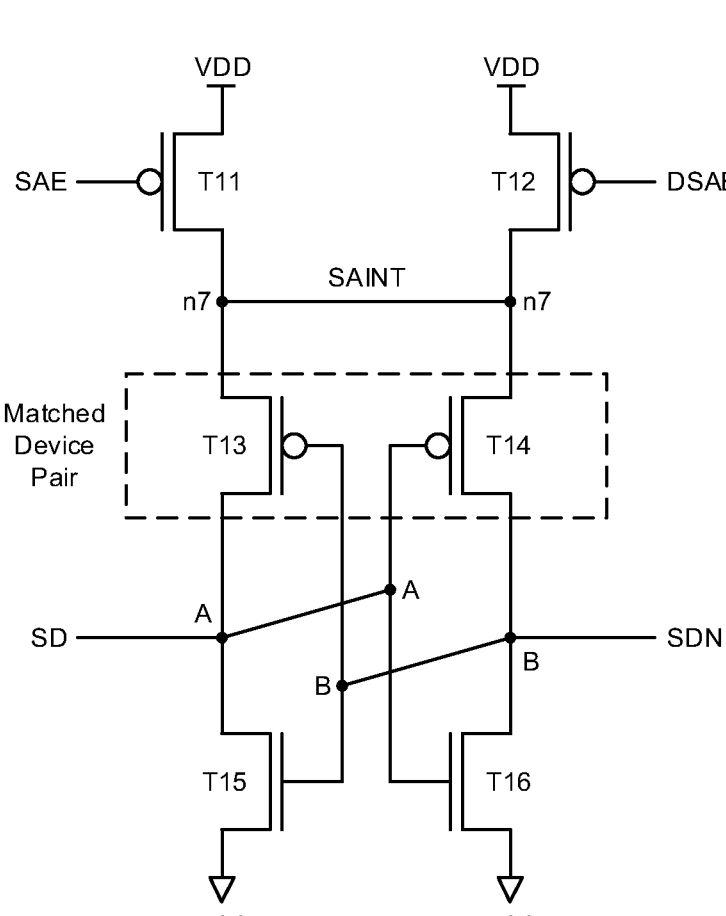
FIG. 9 illustrates a diagram of circuit architecture in accordance with various implementations described herein.

FIG. 9 illustrates a schematic diagram 900 of circuit architecture for a P-based differential amplifier 904.

In various implementations, the circuit architecture may be implemented as a system or a device having various integrated circuit (IC) components that are arranged and coupled together as an assemblage or combination of parts that provide for physical circuit designs and various related structures. In some instances, a method of designing, providing and fabricating the circuit architecture as an integrated system or device may involve use of various IC circuit components described herein so as to thereby implement fabrication schemes and techniques associated therewith. Also, the circuit architecture may be integrated with computing circuitry and related components on a single chip, and further, the circuit architectures may also be implemented in various embedded systems for automotive, electronic, mobile, server and Internet-of-things (IoT) applications.

As shown in FIG. 9, the P-based differential amplifier 900 refers to a circuit architecture with multiple transistors (e.g., T11, T12, T13, T14, T15, T16) that are coupled together to operate as the P-based differential amplifier. In some instances, transistors (T11, T13, T15) may be coupled in series between a voltage supply (VDD) and ground (VSS or Gnd). Also, transistors (T12, T14, T16) may be coupled in series between voltage supply (VDD) and ground (VSS or Gnd). Transistor (T11) may be coupled between VDD and transistor (T13) at node (n7) with potential (SAINT), and gate of transistor (T11) may be coupled to sense amp enable signal (SAE). Transistor (T12) may be coupled between VDD and transistor (T14) at node (n7) with potential (SAINT), and gate of transistor (T12) may be coupled to a data sense amp enable signal (DSAE). Transistor (T13) may be coupled between transistor (T11) at node (n7) and transistor (T15) at node (A), and gate of transistor (T13) may be coupled to gate of transistor (T15). Transistor (T14) may be coupled between transistor (T12) at node (n7) and transistor (T16) at node (B), and gate of transistor (T14) may be coupled to gate of transistor (T16). Transistor (T15) may be coupled between transistor (T13) at node (A) and ground (VSS or Gnd), and gate of transistor (T15) may be coupled to gate of transistor (T13). Transistor (T16) may be coupled between transistor (T14) at node (B) and ground (VSS or Gnd), and gate of transistor (T16) may be coupled to gate of transistor (T14). Gates of transistors (T13/T15, T14/T16)

may be cross-coupled at nodes (A, B), wherein source data signal (SD) may be coupled to gates of transistors (T14, T16) at node (A), and wherein inverted source data signal (SDN) may be coupled to gates of transistors (T13, T15) at node (B). In some implementations, at least two of the transistors (e.g., T13, T14) may be configured as a matched device pair.

FIGS. 10A-10D illustrate various diagrams of a physical layout for multi-device stack configuration that provides a common-centroid configuration for process mismatch cancellation in X-Y-Z axes in accordance with implementations described herein.

Figure 10A:
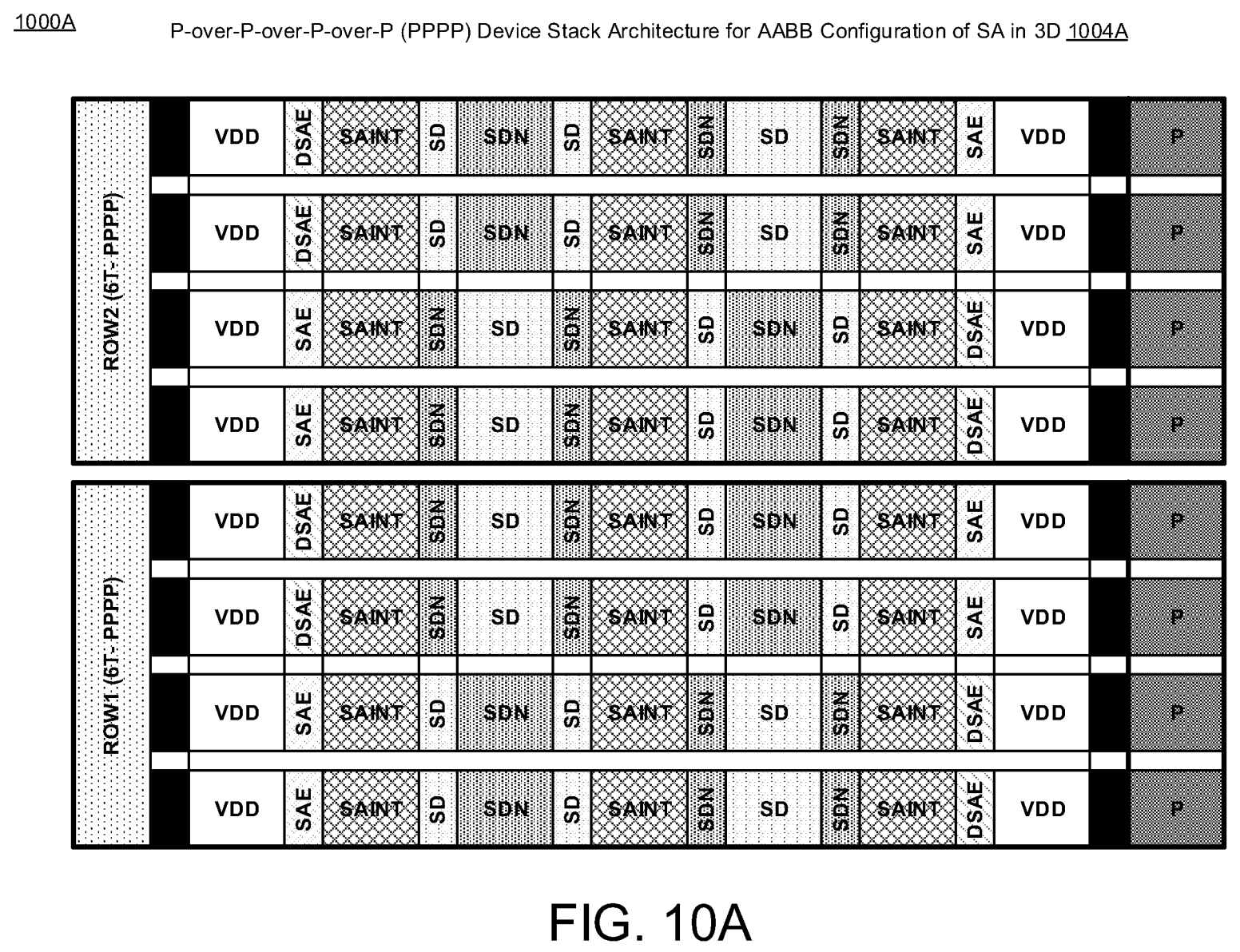

In particular, FIG. 10A shows a diagram 1000A of a physical layout for multi-device stack configuration 1004A with PPPP stack architecture that provides a common-centroid configuration for process mismatch cancellation in at least one of X-Y-Z axes.

As shown in FIG. 10A, the multi-device stack configuration 1004A includes a PPPP device stack architecture that provides for an AABB configuration of sense amplifier (SA) architecture in 3D, such as X-Y-Z axes. In some instances, a physical layout of the multi-device stack configuration 1004A may be used for applications that involve sense amplifier (SA) implementations in reference to 3D processes for mismatch cancellation in X-Y-Z axes. Therefore, the physical layout of the multi-device stack configuration 1004A may be used in applications for P-based differential amplifiers or similar.

Also, in particular, FIG. 10B illustrates a diagram 1000B of a physical layout for multi-device stack configuration 1004B that provides a common-centroid configuration for process mismatch cancellation in X-Y-Z axes in accordance with implementations described herein.

As shown in FIG. 10B, the multi-device stack configuration 1004B includes a PNNP device stack architecture that provides for AABB configuration of sense amplifier (SA) architecture in 3D, such as X-Y-Z axes. In some implementations, a physical layout of the multi-device stack configuration 1004B may be used for applications that involve sense amplifier (SA) implementations in reference to 3D processes for mismatch cancellation in X-Y-Z axes. Thus, the physical layout of multi-device stack configuration 1004B may be used in applications for P-based differential amplifiers or similar.

Also, in particular, FIG. 10C illustrates a diagram 1000C of a physical layout for multi-device stack configuration 1004C that provides a common-centroid configuration for process mismatch cancellation in X-Y-Z axes in accordance with implementations described herein.

As shown in FIG. 10C, the multi-device stack configuration 1004C has a PP device stack architecture of sense amplifier (SA) architecture in three-dimensions (3D), such as X-Y-Z axes. In some implementations, the physical layout of the multi-device stack configuration 1004C may be used for applications that involve sense amplifier (SA) implementations in reference to 3D processes for mismatch cancellation in X-Y-Z axes. Therefore, the physical layout of the multi-device stack configuration 1004C may be used in applications for P-based differential amplifiers or similar.

Figure 10D:
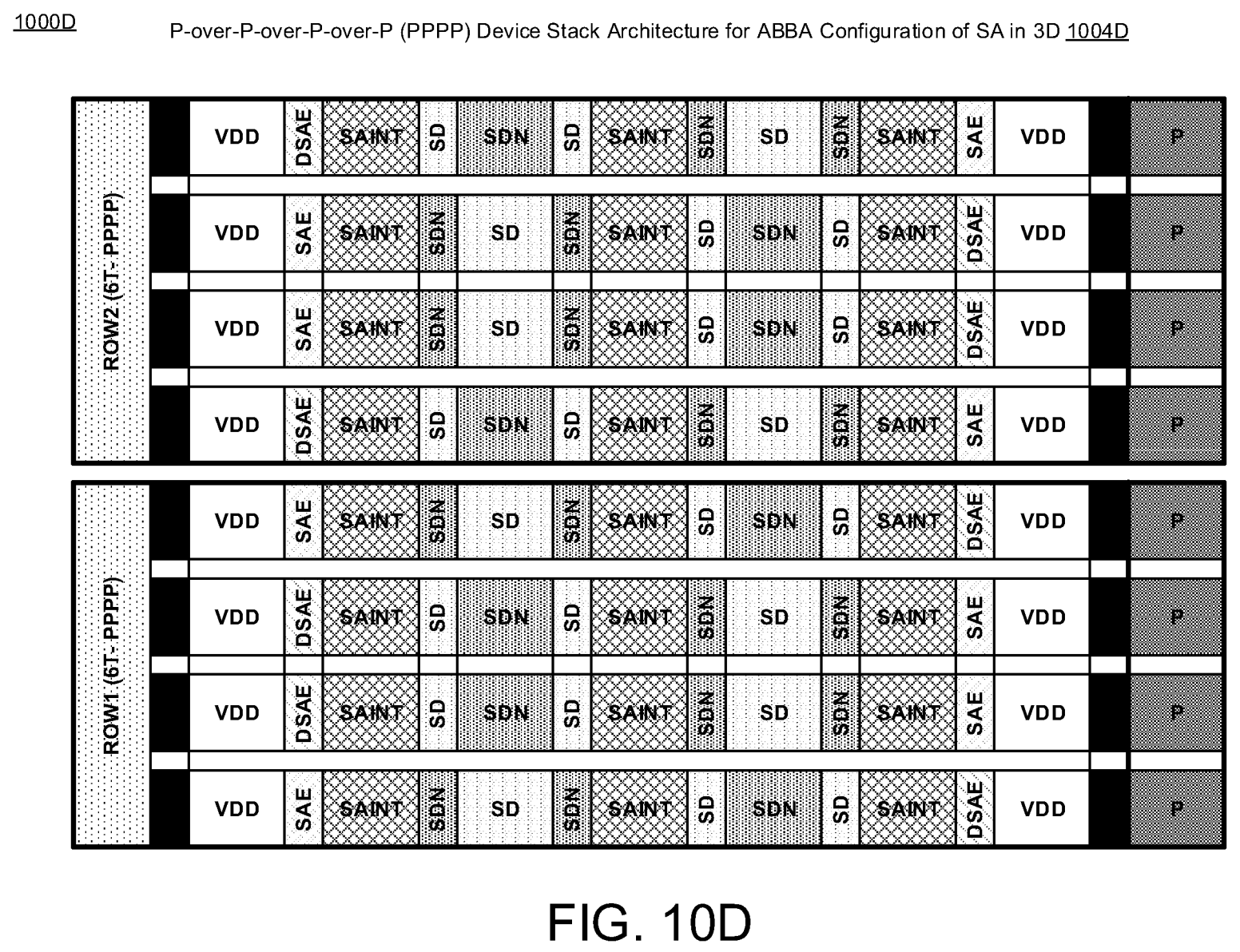

Also, in particular, FIG. 10D illustrates a diagram 1000D of a physical layout for multi-device stack configuration 1004D that provides a common-centroid configuration for process mismatch cancellation in X-Y-Z axes in accordance with implementations described herein.

As shown in FIG. 10D, the multi-device stack configuration 1004D includes a PPPP device stack architecture that provides for an ABBA configuration of sense amplifier (SA)

architecture in 3D, such as X-Y-Z axes. In some implementations, a physical layout of the multi-device stack configuration 1004D may be used for applications that involve sense amplifier (SA) implementations in reference to various 3D processes for mismatch cancellation in X-Y-Z axes. Thus, the physical layout of multi-device stack configuration 1004D may be used in applications for P-based differential amplifiers or similar.

In various implementations, the process mismatch cancellation schemes and techniques described herein may be used to match NMOS devices and/or PMOS devices for various process mismatch cancellation applications.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device with a multi-transistor structure for use in circuit architecture. The multi-transistor structure may have a multi-transistor stack of at least one of N-type transistors or P-type transistors that are arranged in a multi-device stack configuration. Also, in some instances, a physical layout of the multi-device stack configuration may provide a common-centroid configuration for process mismatch cancellation in at least one of the X-Y-Z axes.

Described herein are various implementations of a device. The device may have a multi-transistor structure for use in circuit architecture. The multi-transistor structure may have a multi-transistor stack of N-type transistors or P-type transistors that are arranged in a two-device stack configuration. Also, a physical layout of the multi-device stack configuration may provide a common-centroid configuration for process mismatch cancellation in at least one of the X-Y-Z axes.

Described herein are various implementations of a device. The device may have a multi-transistor structure for use in circuit architecture. The multi-transistor structure may have a multi-transistor stack of N-type transistors or P-type transistors that are arranged in a four-device stack configuration. Also, a physical layout of the multi-device stack configuration may provide a common-centroid configuration for process mismatch cancellation in at least one of the X-Y-Z axes.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
a multi-transistor structure for use in circuit architecture, wherein:
the multi-transistor structure has a plurality of multi-transistor stacks of at least one of N-type transistors or P-type transistors that are each arranged in a multi-device stack configuration, and
a physical layout of the plurality of multi-transistor stacks comprises a common-centroid configuration in at least one of X, Y, or Z axes to address process mismatch.

2. The device of claim 1, wherein the circuit architecture is a three-dimensional (3D) circuit architecture and at least two of the multi-transistor stacks are mutually aligned along one of the X, Y, or Z axes and spaced apart along a different one of the X, Y, or Z axes, such that the physical layout contributes to the common-centroid configuration in the at least one of the X, Y, or Z axes.

3. The device of claim 2, wherein the circuit architecture is used in at least one of a sense amplifier, a memory architecture, a differential amplifier, or a current mirror, and wherein the at least two multi-transistor stacks are respectively connected to different nodes of a same circuit in the circuit architecture.

4. The device of claim 1, wherein the multi-device stack configuration has at least two N-type transistors in the multi-transistor stack configuration that are used as at least one matched pair of N-type transistors.

5. The device of claim 1, wherein the multi-device stack configuration has at least two P-type transistors in the multi-transistor stack configuration that are used as at least one matched pair of P-type transistors.

6. The device of claim 1, wherein the N-type transistors are N-type field-effect transistors (NFETs), and wherein the P-type transistors are P-type field-effect transistors (PFETs).

7. A device comprising:
a multi-transistor structure for use in circuit architecture, wherein:
the multi-transistor structure has a multi-transistor stack of N-type transistors or P-type transistors that are arranged in a first two-device stack configuration, and
a physical layout of the first two-device stack configuration forms a common-centroid configuration with a second two-device stack configuration in at least one of X, Y, or Z axes to address process mismatch.

8. The device of claim 7, wherein the multi-transistor stack of transistors is formed within the circuit architecture as a three-dimensional (3D) circuit architecture, and wherein the circuit architecture is used in at least one of a sense amplifier, a memory architecture, a differential amplifier, or a current mirror.

9. The device of claim 7, wherein the first two-device stack configuration of N-type transistors are arranged in an N-over-N (NN) stack configuration.

10. The device of claim 9, wherein the N-type transistors in the NN stack configuration are a matched pair of N-type transistors.

11. The device of claim 7, wherein the first two-device stack configuration has a two-device stack configuration of P-type transistors arranged in a P-over-P (PP) stack configuration.

12. The device The device of claim 11, wherein the P-type transistors in the PP stack configuration are a matched pair of P-type transistors.

13. The device of claim 7, wherein the N-type transistors are N-type field-effect transistors (NFETs), and wherein the P-type transistors are P-type field-effect transistors (PFETs).

14. A device comprising:
a multi-transistor structure for use in circuit architecture, wherein:
the multi-transistor structure has a multi-transistor stack of N-type transistors or P-type transistors that are arranged in a first four-device stack configuration, and
a physical layout of the first four-device stack configuration forms a common-centroid configuration with a second four-device stack configuration in at least one of X, Y, or Z axes to address process mismatch.

15. The device of claim 14, wherein the multi-transistor stack of N-type transistors is formed within the circuit architecture as a three-dimensional (3D) circuit architecture, and wherein the circuit architecture is used in at least one of a sense amplifier, a memory architecture, a differential amplifier, or a current mirror.

16. The device of claim 14, wherein the first four-device stack configuration has at least two N-type transistors that are arranged in at least one of N-over-N-over-N-over-N (NNNN) stack configuration, or P-over-N-over-N-over-P (PNNP) stack configuration.

17. The device of claim 14, wherein at least two of the N-type transistors in the first four-device stack configuration are a matched pair of N-type transistors.

18. The device of claim 14, wherein the first four-device stack configuration has at least two P-type transistors that are arranged in at least one of P-over-P-over-P-over-P (PPPP) stack configuration, or P-over-N-over-N-over-P (PNNP) stack configuration.

19. The device of claim 18, wherein at least two of the P-type transistors in the first four-device stack configuration are a matched pair of P-type transistors.

20. The device of claim 14, wherein the N-type transistors are N-type field-effect transistors (NFETs), and wherein the P-type transistors are P-type field-effect transistors (PFETs).

* * * * *